(12) United States Patent
Hashimoto

(10) Patent No.: US 12,733,181 B2
(45) Date of Patent: Sep. 8, 2026

(54) SEMICONDUCTOR MEMORY DEVICE

(71) Applicant: KIOXIA CORPORATION, Tokyo (JP)

(72) Inventor: Toshifumi Hashimoto, Fujisawa (JP)

(73) Assignee: KIOXIA CORPORATION, Tokyo (JP)

( * ) Notice: Subject to any disclaimer, the term of this patent is extended or adjusted under 35 U.S.C. 154(b) by 539 days.

(21) Appl. No.: 18/323,528

(22) Filed: May 25, 2023

(65) Prior Publication Data

US 2024/0099031 A1 Mar. 21, 2024

(30) Foreign Application Priority Data

Sep. 21, 2022 (JP) ................................ 2022-150375

(51) Int. Cl.

| | |
|---|---|
| ***H10B 80/00*** | (2026.01) |
| ***H10B 41/10*** | (2023.01) |
| ***H10B 41/27*** | (2023.01) |
| ***H10B 41/41*** | (2023.01) |
| ***H10B 43/10*** | (2023.01) |
| ***H10B 43/27*** | (2023.01) |
| ***H10B 43/40*** | (2023.01) |
| ***H10W 90/00*** | (2026.01) |

(52) U.S. Cl.

CPC ............ *H10B 80/00* (2023.02); *H10B 41/10* (2023.02); *H10B 41/27* (2023.02); *H10B 41/41* (2023.02); *H10B 43/10* (2023.02); *H10B 43/27* (2023.02); *H10B 43/40* (2023.02); *H10W 90/00* (2026.01); *H10W 90/792* (2026.01)

(58) Field of Classification Search

CPC ........ H10B 41/10; H10B 41/27; H10B 41/35; H10B 41/40; H10B 41/41; H10B 41/50; H10B 43/10; H10B 43/27; H10B 43/35; H10B 43/40; H10B 43/50; H10B 80/00; H10W 90/00; H10W 90/792

See application file for complete search history.

(56) References Cited

U.S. PATENT DOCUMENTS

| | | | |
|---|---|---|---|
| 10,763,277 | B2 | 9/2020 | Oike et al. |
| 11,233,042 | B2 | 1/2022 | Kim et al. |

(Continued)

FOREIGN PATENT DOCUMENTS

| | | |
|---|---|---|
| JP | 2021-64731 A | 4/2021 |

*Primary Examiner* — Telly D Green
(74) *Attorney, Agent, or Firm* — Oblon, McClelland, Maier & Neustadt, L.L.P.

(57) ABSTRACT

A memory plane region includes a first structure and a second structure having conductive layers, and includes a first memory region to a third memory region, a first region between the first memory region and the second memory region, and a second region between the second memory region and the third memory region. The first structure comprises first via contact electrodes in the first region. The second structure comprises second via contact electrodes in the second region. The first via contact electrodes are electrically connected to transistors provided at positions where the first structure and the first region overlap, and where the second structure and the first region overlap. The second via contact electrodes are electrically connected to transistors provided at positions where the first structure and the second region overlap, and where the second structure and the second region overlap.

13 Claims, 35 Drawing Sheets

(56) References Cited

U.S. PATENT DOCUMENTS

| | | | | |
|---|---|---|---|---|
| 11,276,707 | B2 | 3/2022 | Furuki et al. | |
| 2009/0268522 | A1 | 10/2009 | Maejima | |
| 2019/0237477 | A1 | 8/2019 | Baek et al. | |
| 2021/0118862 | A1 | 4/2021 | Maejima et al. | |
| 2022/0020681 | A1 | 1/2022 | Nojima et al. | |
| 2022/0052071 | A1* | 2/2022 | Hashimoto | H10B 43/10 |
| 2022/0246196 | A1 | 8/2022 | Takenaka et al. | |
| 2023/0069251 | A1* | 3/2023 | Kariya | H10B 43/40 |
| 2023/0082844 | A1* | 3/2023 | Okumura | H10B 41/40<br>257/314 |
| 2023/0307016 | A1* | 9/2023 | Maejima | G11C 7/1063 |
| 2023/0307050 | A1* | 9/2023 | Suda | G11C 16/0483 |
| 2023/0307394 | A1* | 9/2023 | Suzuki | H10W 42/00 |
| 2024/0250026 | A1* | 7/2024 | Okada | H10B 43/27 |

* cited by examiner

MCA
MG
DG
100
$R_{MH}$
$R_{HU}$
$X_{RowC}$
SL
CBL
CWL
MS
BL
$T_{BLK}$
$R_{Tr}$
$R_{RowC}$
AA
STI
$T_{SADL}$
$R_{ColC}$
$C_M$
$C_P$
X
Y
Z

Y
X
Z
E
E'
SU
110(SGD)
CC(SGD)
HR
CC(WL)
110(WL)
T
ST
FS
$R_{MH}$
$R_{HUSGD}$
$R_{HUWL}$
$R_{HU}$

X
Y
Z
STI
$T_{BLK}$
$AA_{BLK}$
CS
gc
CWL
CC(WL)
$R_{Tr}$
$R_{RowC}$
FS

Z
X
Y
$R_{HU}$
$R_{MH}$
$R_{HU}$
$R_{RowC}$
$R_{ColC}$
$R_{RowC}$
CWL
CWL
$C_M'$
$C_P'$

MCA
MG
DG
100
CWL
SL
CBL
XRowC
RMH
RHU
TBLK
RTr
RRowC
RColC
AA
STI
TSADL
MS
BL
CM2
CP2
X
Y
Z

MCA
MG
DG3
100
$R_{PC3}$
$R_{MH}$
SL
CWL
CBL
$R_{ColC}$
$X_{RowCD}$
$R_{HU}$
$R_{HUD}$
$R_{MH}$
$T_{BLK}$
$R_{TrD}$
$R_{Tr}$
$R_{RowC}$
AA
STI
$T_{SADL}$
MS
BL
$C_{M3}$
$C_{P3}$
Z
X
Y

MCA
MG
DG4
100
$R_{PC4}$
$R_{MH}$
SL
CBL
CWL
$R_{ColC}$
$X_{RowCD}$
$X_{RowC}$
$R_{HU}$
$R_{HUD}$
$T_{BLK}$
$R_{TrD}$
$R_{Tr}$
$R_{RowC}$
AA
STI
$T_{SADL}$
MS
BL
$C_{M4}$
$C_{P4}$
Z
X
Y 102
101
101
CCA
110A
110A
112
X
Y
Z 102
101
101
Reg
CCA
Reg
110A
110A
112
X
Y
Z $R_{MH}$
$R_{HUSGD}$
$R_{HUWL}$
$R_{HU}$
$R_{HUSGD}$
$R_{MH}$
CCA
HR
CCA
HR
CCA
CCA
DCCA
DCCA
$R_A$
$R_B$
$R_C$
$R_D$

Y
X
Z
SU
110(SGD)
G
G'
T
CC(SGD)
CC(WL)
HR
DCC
$R_A$
$R_B$
$R_C$
$R_D$
$R_{MH}$
$R_{HUSGD}$
$R_{HUWL}$
$R_{HU}$
ST
FS

Y
Z
X
D0
R_MH
R_HU
R_MH
R_HU6d
FS
CWLP01
CWLP00
X_RowC
d0(CWL)
R_Tr6d
R_Tr
R_RowC

Y
Z
X
D1
$R_{MH}$
$R_{HU}$
$R_{MH}$
$R_{HU6d}$
CWLP11
CWLP10
d1(CWL)
$X_{RowC}$
FS
$R_{Tr6d}$
$R_{Tr}$
$R_{RowC}$

Y
X
Z
D2
R_MH
R_HU
R_HU6d
R_Tr6d
R_Tr
R_RowC
CWLP21
CWLP20
d2(CWL)
X_RowC
FS

ST
FS
ST
FS
ST
E
E'
110(WL)
CC(SGD)
HR
CC(SGD)
CC(WL)
CC(WL)
HR
HR
HR
T
SU
110(SGD)
X
Y
Z
$R_{MH}$
$R_{HUSGD}$
$R_{HUWL}$
$R_{HU}$
$R_{HUSGD}$
$R_{MH}$

SEMICONDUCTOR MEMORY DEVICE

CROSS-REFERENCE TO RELATED APPLICATIONS

This application is based upon and claims the benefit of Japanese Patent Application No. 2022-150375, filed on Sep. 21, 2022, the entire contents of which are incorporated herein by reference.

FIELD

Background

The present embodiment relates to a semiconductor memory device.

Description of the Related Art

There is known a semiconductor memory device comprising: a semiconductor substrate; a plurality of conductive layers stacked in a stacking direction intersecting a surface of this semiconductor substrate; a semiconductor layer facing these plurality of conductive layers; and a charge accumulating film provided between the conductive layers and the semiconductor layer. The charge accumulating film comprises a memory portion capable of storing data, such as an insulative charge accumulating film of the likes of silicon nitride (SiN) or a conductive charge accumulating film of the likes of a floating gate, for example.

DETAILED DESCRIPTION

Figure 1:
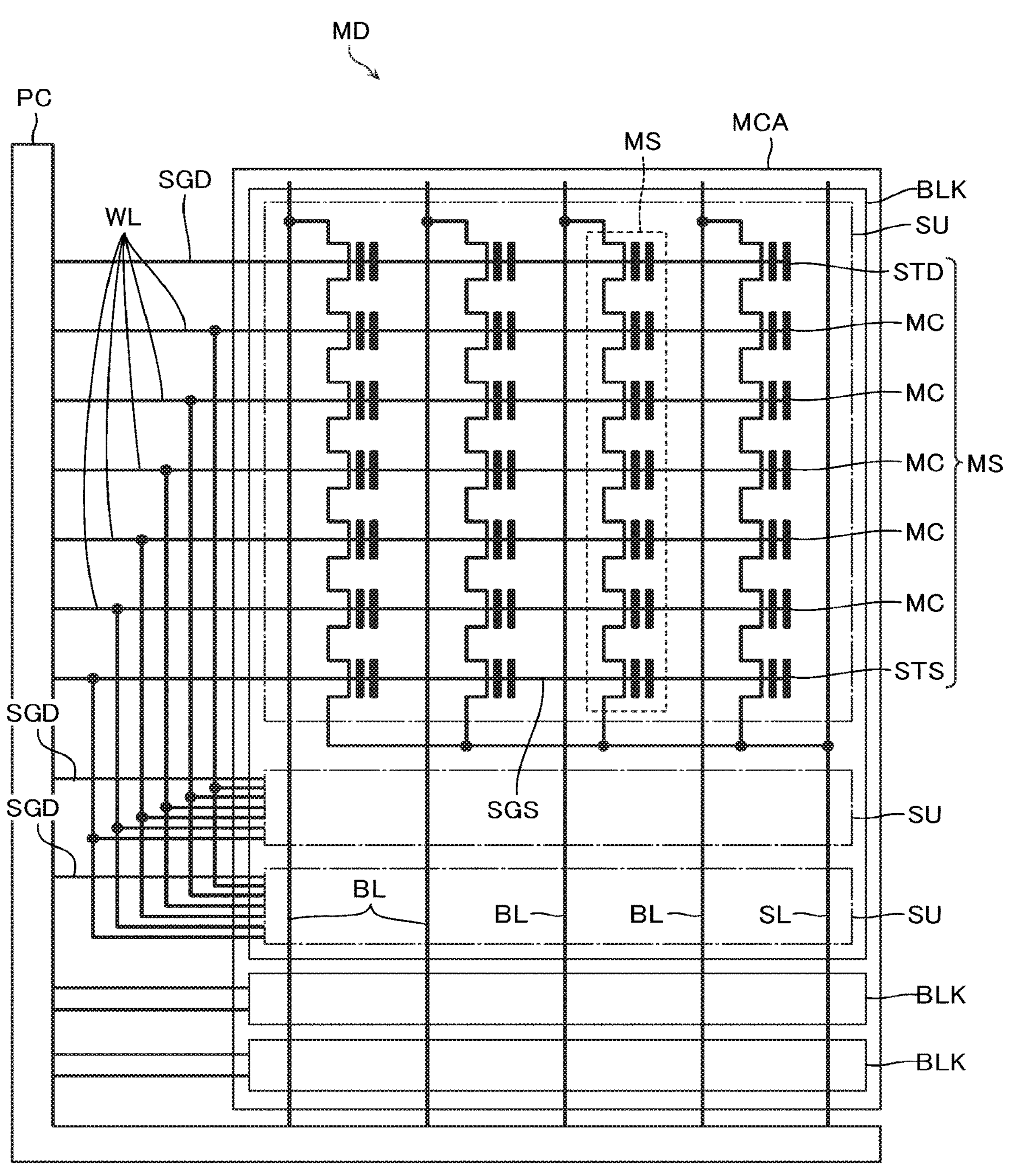
FIG. 1 is a schematic circuit diagram showing a part of configurations of a memory die MD according to a first embodiment.

A semiconductor memory device according to one embodiment comprises a first structure and a second structure. The first structure has a plurality of first conductive layers that are continuous in a first direction and are laminated in a laminating direction which intersects the first direction. The second structure has a plurality of second conductive layers that are continuous in the first direction, are laminated in the laminating direction, are aligned in a second direction which intersects the first direction and the laminating direction with respect to the first conductive layers, and are electrically independent from the first conductive layers.

A memory plane region, which includes the first structure and the second structure, includes a first memory region, a second memory region, a third memory region, a first region, and a second region. The first memory region, the second memory region, and the third memory region are aligned in the first direction and each include a plurality of semiconductor columns and a plurality of charge accumulating films. The plurality of semiconductor columns extend in the laminating direction.

A plurality of first transistors and a plurality of third transistors are provided in an opposite direction to the laminating direction with respect to the first structure. A plurality of second transistors and a plurality of fourth transistors are provided in an opposite direction to the laminating direction with respect to the second structure.

The second memory region is provided between the first memory region and the third memory region.

The first structure further comprises a plurality of first via contact electrodes that are provided in the first region, extend in the laminating direction, and are connected to at least a part of the plurality of first conductive layers. The second structure further comprises a plurality of second via contact electrodes that are provided in the second region, extend in the laminating direction, and are connected to at least a part of the plurality of second conductive layers.

A part of the plurality of first via contact electrodes are electrically connected to at least a part of the plurality of first transistors provided at a position where the first structure and the first region overlap, looking from the laminating direction. The other part of the plurality of first via contact electrodes are electrically connected to at least a part of the plurality of second transistors provided at a position where the second structure and the first region overlap, looking from the laminating direction, A part of the plurality of second via contact electrodes are electrically connected to at least a part of the plurality of third transistors provided at a position where the first structure and the second region overlap, looking from the laminating direction. The other part of the plurality of second via contact electrodes are electrically connected to at least a part of the plurality of fourth transistors provided at a position where the second structure and the second region overlap, looking from the laminating direction.

Next, semiconductor memory devices according to embodiments will be described in detail with reference to the drawings. Note that the following embodiments are merely examples, and are not shown with the intention of limiting the present invention. Moreover, the following drawings are schematic, and, for convenience of description, a part of configurations, and so on, thereof will sometimes be omitted. Moreover, portions that are common to a plurality of embodiments will be assigned with the same symbols, and descriptions thereof sometimes omitted.

Moreover, when a "semiconductor memory device" is referred to in the present specification, it will sometimes mean a memory die, and will sometimes mean a memory system including a control die, of the likes of a memory chip, a memory card, or an SSD (Solid State Drive). Furthermore, it will sometimes mean a configuration including a host computer, of the likes of a smartphone, a tablet terminal, or a personal computer.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, in the case of three transistors having been serially connected, the first transistor is still "electrically connected" to the third transistor even if the second transistor is in an OFF state.

Moreover, in the present specification, when a first configuration is said to be "electrically connected between" a second configuration and a third configuration, it will sometimes mean that the first configuration, the second configuration, and the third configuration are serially connected, and the second configuration is connected to the third configuration via the first configuration.

Moreover, in the present specification, when a circuit, or the like, is said to "make electrically continuous" two wirings, or the like, this will sometimes mean, for example, that this circuit, or the like, includes a transistor, or the like, that this transistor, or the like, is provided in a current path between the two wirings, and that this transistor, or the like, is in an ON state.

Moreover, in the present specification, a certain direction parallel to an upper surface of a substrate will be called an X direction, a direction parallel to the upper surface of the substrate and perpendicular to the X direction will be called a Y direction, and a direction perpendicular to the upper surface of the substrate will be called a Z direction.

Moreover, in the present specification, a direction intersecting the surface of the substrate will sometimes be called a stacking direction. Moreover, a direction lying along a certain plane intersecting the stacking direction will sometimes be called a first direction, and a direction intersecting the first direction along this plane will sometimes be called a second direction. The stacking direction may correspond to the Z direction, but need not do so. Moreover, the first direction and the second direction may correspond to either of the X direction and the Y direction, but need not do so.

Moreover, in the present specification, expressions such as "up" or "down" will be defined with reference to the substrate. For example, an orientation of moving away from the substrate along the above-described Z direction will be called up, and an orientation of coming closer to the substrate along the Z direction will be called down. Moreover, when a lower surface or a lower end is referred to for a certain configuration, this will be assumed to mean a surface or end portion on a substrate side of this configuration, and when an upper surface or an upper end is referred to for a certain configuration, this will be assumed to mean a surface or end portion on an opposite side to the substrate of this configuration. Moreover, a surface intersecting the X direction or the Y direction will be called a side surface, and so on.

Moreover, in the present specification, when the likes of a "width", a "length", or a "thickness" in a certain direction is referred to for a configuration, a member, and so on, this will sometimes mean a width, a length, or a thickness, and so on, in a cross section observed by the likes of SEM (Scanning Electron Microscopy) or TEM (Transmission Electron Microscopy), and so on.

First Embodiment

[Circuit Configuration of Memory Die MD]

FIG. 1 is a schematic circuit diagram showing a part of configurations of a memory die MD. As shown in FIG. 1, the memory die MD comprises a memory cell array MCA and a peripheral circuit PC. As shown in FIG. 1, the memory cell array MCA comprises a plurality of memory blocks BLK. These plurality of memory blocks BLK each comprise a plurality of string units SU. These plurality of string units SU each comprise a plurality of memory strings MS. One ends of these plurality of memory strings MS are respectively connected to the peripheral circuit PC via bit lines BL. Moreover, other ends of these plurality of memory strings MS are each connected to the peripheral circuit PC via a common source line SL.

The memory string MS comprises a drain side select transistor STD, a plurality of memory cells MC (memory transistors), and a source side select transistor STS. The drain side select transistor STD, the plurality of memory cells MC, and the source side select transistor STS are connected in series between the bit line BL and the source line SL. Hereafter, the drain side select transistor STD and the source side select transistor STS will sometimes simply be called select transistors (STD, STS).

The memory cell MC is a field effect type transistor. The memory cell MC comprises a semiconductor layer, a gate insulating film, and a gate electrode. The semiconductor layer functions as a channel region. The gate insulating film includes a charge accumulating film as a memory portion. A threshold voltage of the memory cell MC changes according to an amount of charge in the charge accumulating film. The memory cell MC stores one bit or a plurality of bits of data. Note that the gate electrodes of the plurality of memory cells MC corresponding to one memory string MS are respectively connected with word lines WL. These word lines WL are each commonly connected to all of the memory strings MS in one memory block BLK.

The select transistor (STD, STS) is a field effect type transistor. The select transistor (STD, STS) comprises a semiconductor layer, a gate insulating film, and a gate electrode. The semiconductor layer functions as a channel region. The gate electrodes of the select transistors (STD, STS) are respectively connected with select gate lines (SGD, SGS). One drain side select gate line SGD is commonly connected to all of the memory strings MS in one string unit SU. One source side select gate line SGS is commonly connected to all of the memory strings MS in one memory block BLK.

Figure 2:
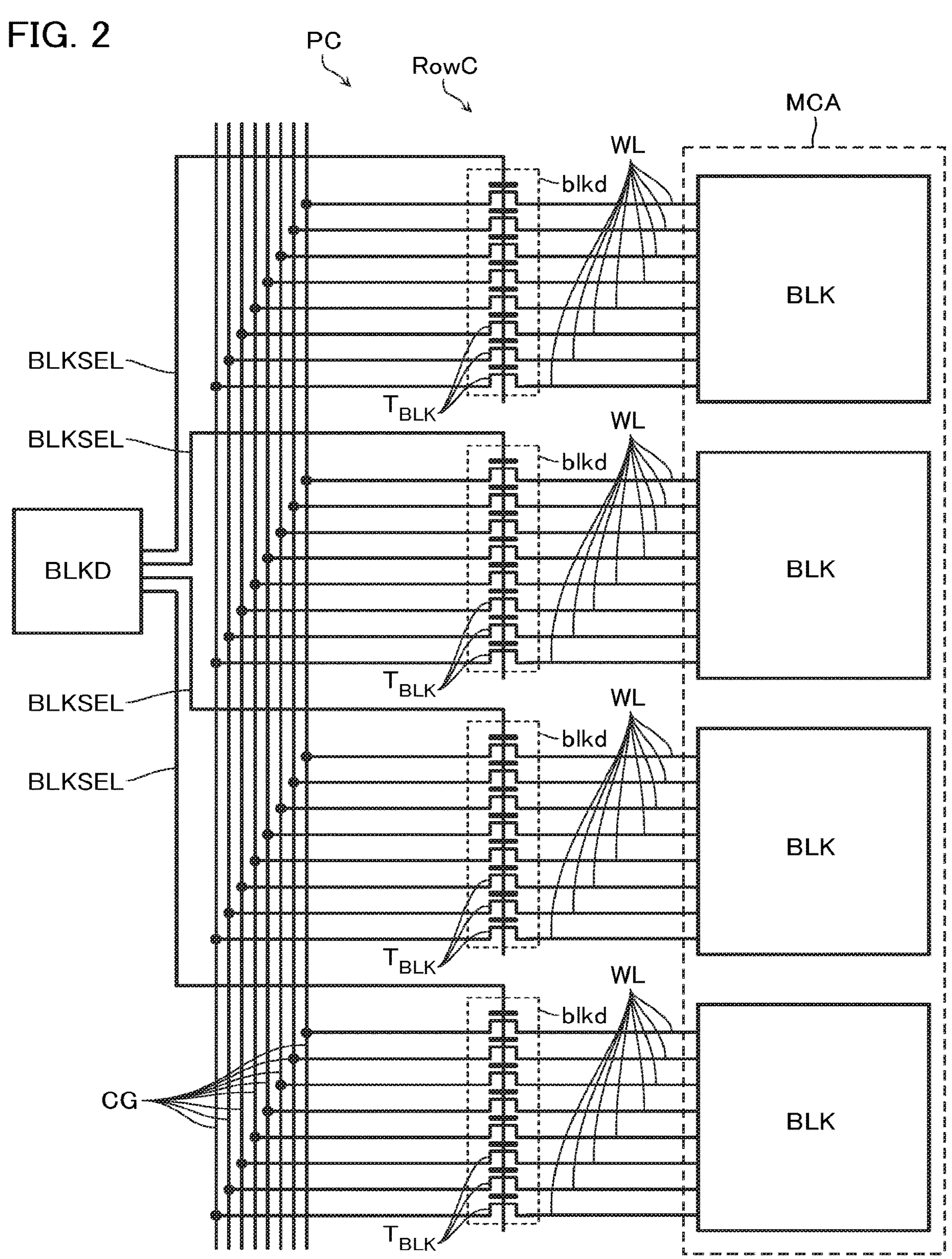
FIG. 2 is a schematic circuit diagram showing a part of configurations of a peripheral circuit PC.

FIG. 2 is a schematic circuit diagram showing a part of configurations of the peripheral circuit PC. As shown in FIG. 2, for example, the peripheral circuit PC comprises a row control circuit RowC. The row control circuit RowC comprises a plurality of block decode units blkd and a block decoder BLKD.

The plurality of block decode units blkd are provided correspondingly to the plurality of memory blocks BLK in the memory cell array MCA. The block decode unit blkd comprises a plurality of transistors $T_{BLK}$. The plurality of transistors $T_{BLK}$ correspond to the plurality of word lines WL in the memory block BLK. The transistor $T_{BLK}$ is a field effect type NMOS transistor, for example. A drain electrode of the transistor $T_{BLK}$ is connected to the word line WL. A source electrode of the transistor $T_{BLK}$ is connected to a wiring CG. The wiring CG is connected to all of the block decode units blkd in the row control circuit RowC. A gate electrode of the transistor $T_{BLK}$ is connected to a signal supply line BLKSEL. A plurality of the signal supply lines BLKSEL are provided correspondingly to all of the block decode units blkd. Moreover, the signal supply line BLKSEL is connected to all of the transistors $T_{BLK}$ in the block decode unit blkd.

The block decoder BLKD decodes a block address during a read operation or write operation. Moreover, one of the plurality of signal supply lines BLKSEL is set to an "H" state and the remaining signal supply lines BLKSEL are set to an "L" state, depending on the block address that has been decoded.

Figure 3:
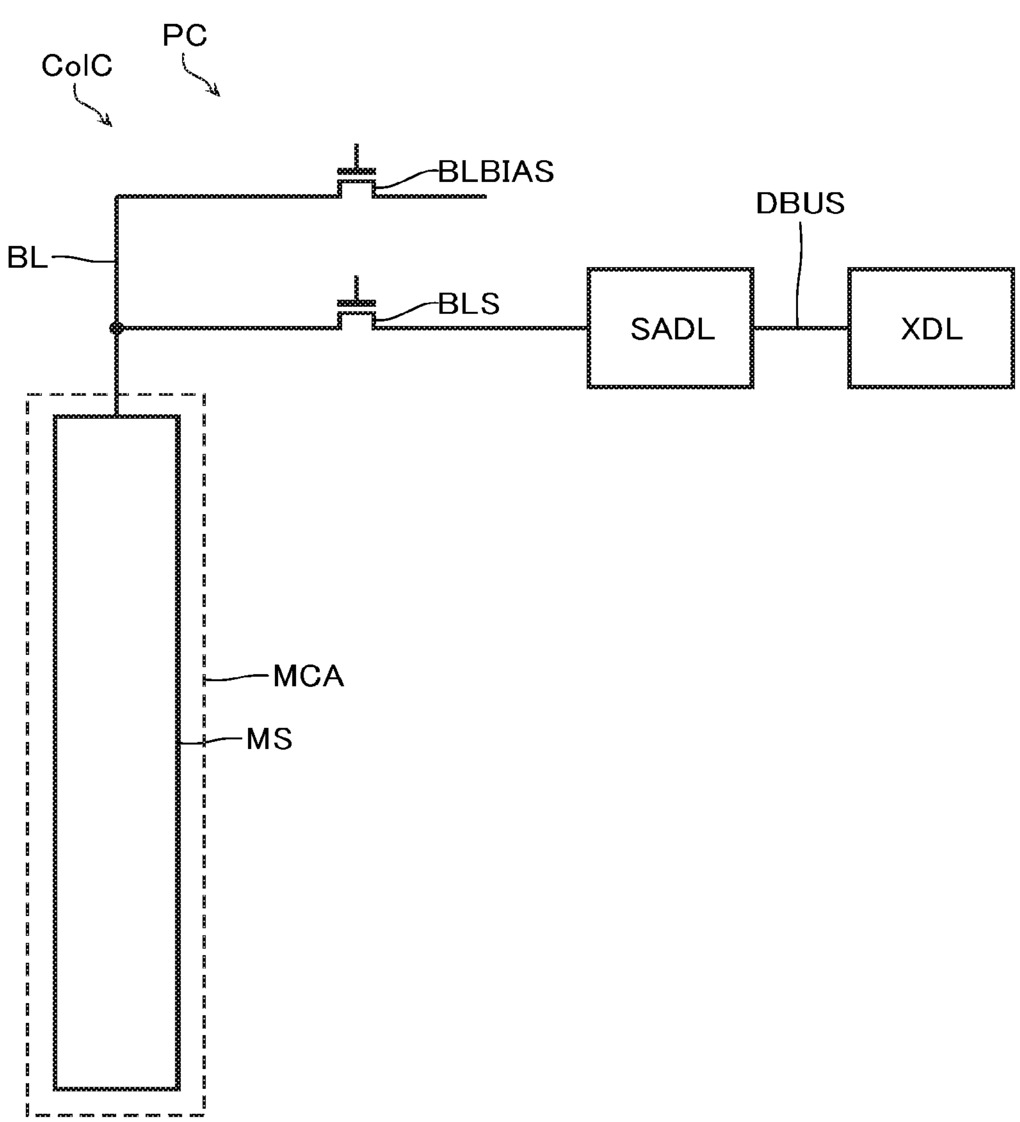
FIG. 3 is a schematic circuit diagram showing a part of configurations of the peripheral circuit PC.

FIG. 3 is a schematic circuit diagram showing a part of configurations of the peripheral circuit PC. As shown in FIG. 3, for example, the peripheral circuit PC comprises a column control circuit ColC. The column control circuit ColC comprises: switch transistors BLS, BLBIAS that are connected to the bit line BL; a sense amplifier circuit SADL which is connected to the bit line BL via the switch transistor BLS; and a latch circuit XDL which is connected to the sense amplifier circuit SADL.

The switch transistors BLS, BLBIAS are field effect type NMOS transistors, for example. Drain electrodes of the switch transistors BLS, BLBIAS are connected to the bit line BL. A source electrode of the switch transistor BLS is connected to the sense amplifier circuit SADL. A source electrode of the switch transistor BLBIAS is connected to an unillustrated voltage supply line.

The sense amplifier circuit SADL comprises a sense circuit, a latch circuit, and a voltage transfer circuit. The sense circuit comprises a sense transistor and a data wiring. A gate electrode of the sense transistor is electrically connected to the bit line BL. A drain electrode of the sense transistor is connected to the data wiring. The sense transistor attains an ON state depending on voltage or current of the bit line BL. The data wiring is charged or discharged depending on an ON/OFF state of the sense transistor. The latch circuit latches data of "1" or "0" depending on voltage of the data wiring. The voltage transfer circuit makes the bit line BL electrically continuous with either of two voltage supply lines, depending on the data latched in the latch circuit.

The latch circuit XDL is electrically connected to the data wiring within the sense amplifier circuit SADL via a wiring DBUS. Data included in the latch circuit XDL is sequentially transferred to the sense amplifier circuit SADL or an unillustrated input/output control circuit.

[Structure of Memory Die MD]

[Overall Configuration]

Figure 4:
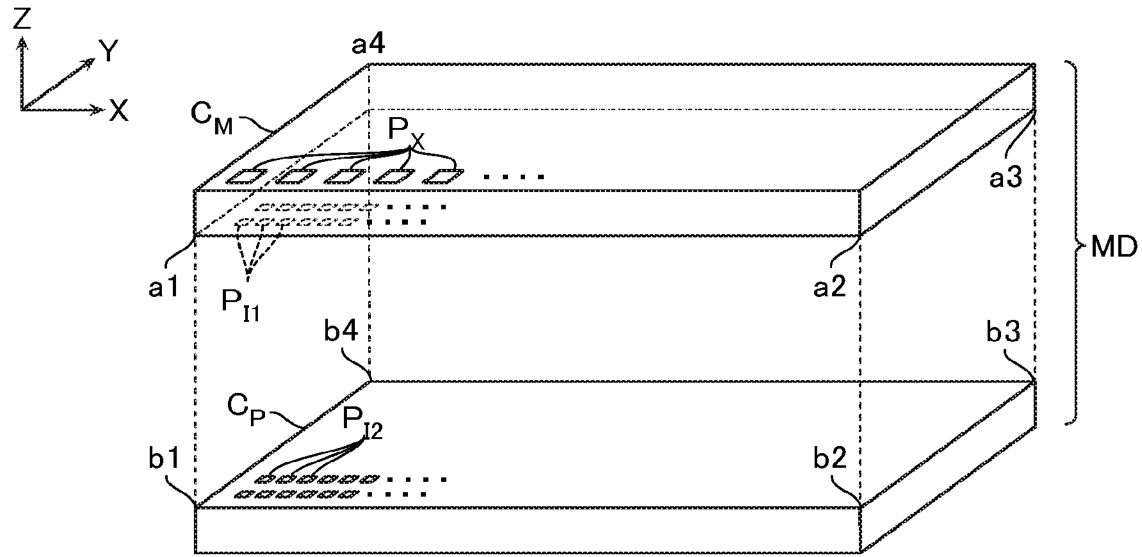
FIG. 4 is a schematic exploded perspective view showing an example of configuration of the memory die MD.

FIG. 4 is a schematic exploded perspective view showing an example of configuration of the memory die MD. As shown in FIG. 4, the memory die MD comprises: a chip $C_M$ on a memory cell array MCA side; and a chip $C_P$ on a peripheral circuit PC side.

An upper surface of the chip $C_M$ is provided with a plurality of external pad electrodes $P_X$ connectable to unillustrated bonding wires. Moreover, a lower surface of the chip $C_M$ is provided with a plurality of bonding electrodes $P_{I1}$. Moreover, an upper surface of the chip $C_P$ is provided with a plurality of bonding electrodes $P_{I2}$. Hereafter, a surface provided with the plurality of bonding electrodes $P_{I1}$, of the chip $C_M$ will be called a front surface of the chip $C_M$, and a surface provided with the plurality of external pad electrodes $P_X$, of the chip $C_M$ will be called a back surface of the chip $C_M$. Moreover, a surface provided with the plurality of bonding electrodes $P_{I2}$, of the chip $C_P$ will be called a front surface of the chip $C_P$, and a surface on an opposite side to the front surface, of the chip $C_P$ will be called a back surface of the chip $C_P$. In the example illustrated, the front surface of the chip $C_P$ is provided above the back surface of the chip $C_P$, and the back surface of the chip $C_M$ is provided above the front surface of the chip $C_M$.

The chip $C_M$ and the chip $C_P$ are disposed in such a manner that the front surface of the chip $C_M$ and front surface of the chip $C_P$ face each other. The plurality of bonding electrodes $P_{I1}$ are provided respectively correspondingly to the plurality of bonding electrodes $P_{I2}$, and are disposed at positions enabling them to be bonded to the plurality of bonding electrodes $P_{I2}$. The bonding electrodes $P_{I1}$ and bonding electrodes $P_{I2}$ function as bonding electrodes for bonding and making electrically continuous the chip $C_M$ and chip $C_P$.

Note that in the example of FIG. 4, corners a1, a2, a3, a4 of the chip $C_M$ respectively correspond to corners b1, b2, b3, b4 of the chip $C_P$.

Figure 5:
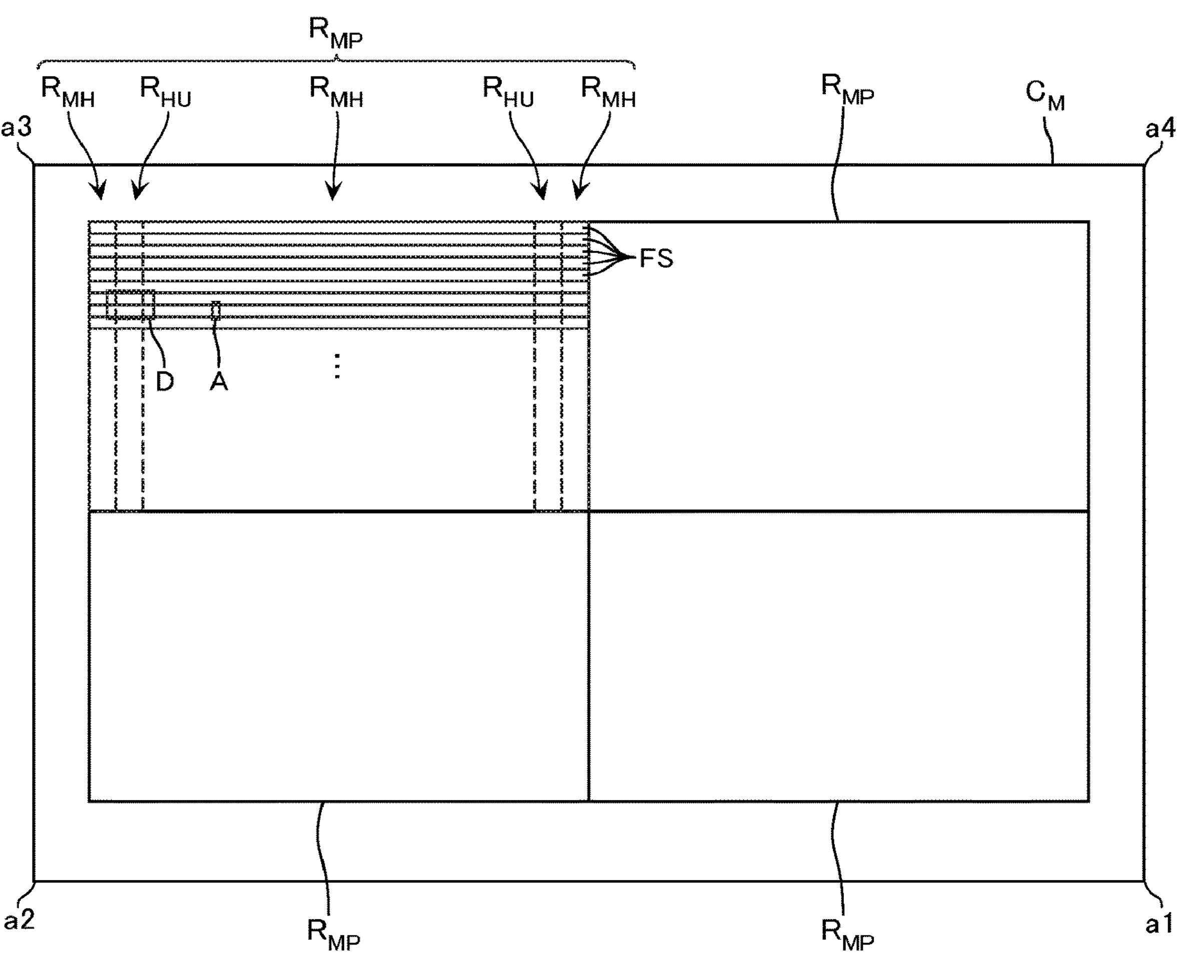
FIG. 5 is a schematic bottom view showing an example of configuration of a chip $C_M$.

FIG. 5 is a schematic bottom view showing an example of configuration of the chip $C_M$. In FIG. 5, a part of configurations such as the bonding electrodes $P_{I1}$ are omitted. In the example of FIG. 5, the chip $C_M$ comprises a total of four memory plane regions $R_{MP}$ aligned in twos in the X direction and the Y direction.

The memory plane regions $R_{MP}$ each function as the memory cell array MCA described with reference to FIG. 1. Moreover, these four memory plane regions $R_{MP}$ each comprise a plurality of finger structures FS aligned in the Y direction. In the present embodiment, the finger structures FS each correspond to the memory block BLK described with reference to FIG. 1. However, a correspondence relationship of the finger structure FS and the memory block BLK is appropriately adjustable. For example, a plurality of the finger structures FS may function as one memory block BLK.

Moreover, the memory plane region $R_{MP}$ in the example of FIG. 5 comprises: three memory regions $R_{MH}$ aligned in the X direction; and two hookup regions $R_{HU}$ respectively provided between pairs of the memory regions $R_{MH}$ adjacent in the X direction. Length in the X direction of the 2nd memory region $R_{MH}$ counting from a negative side in the X direction is longer than lengths in the X direction of the $1^{st}$ and $3^{rd}$ memory regions $R_{MH}$ counting from a negative side in the X direction.

Figure 6:
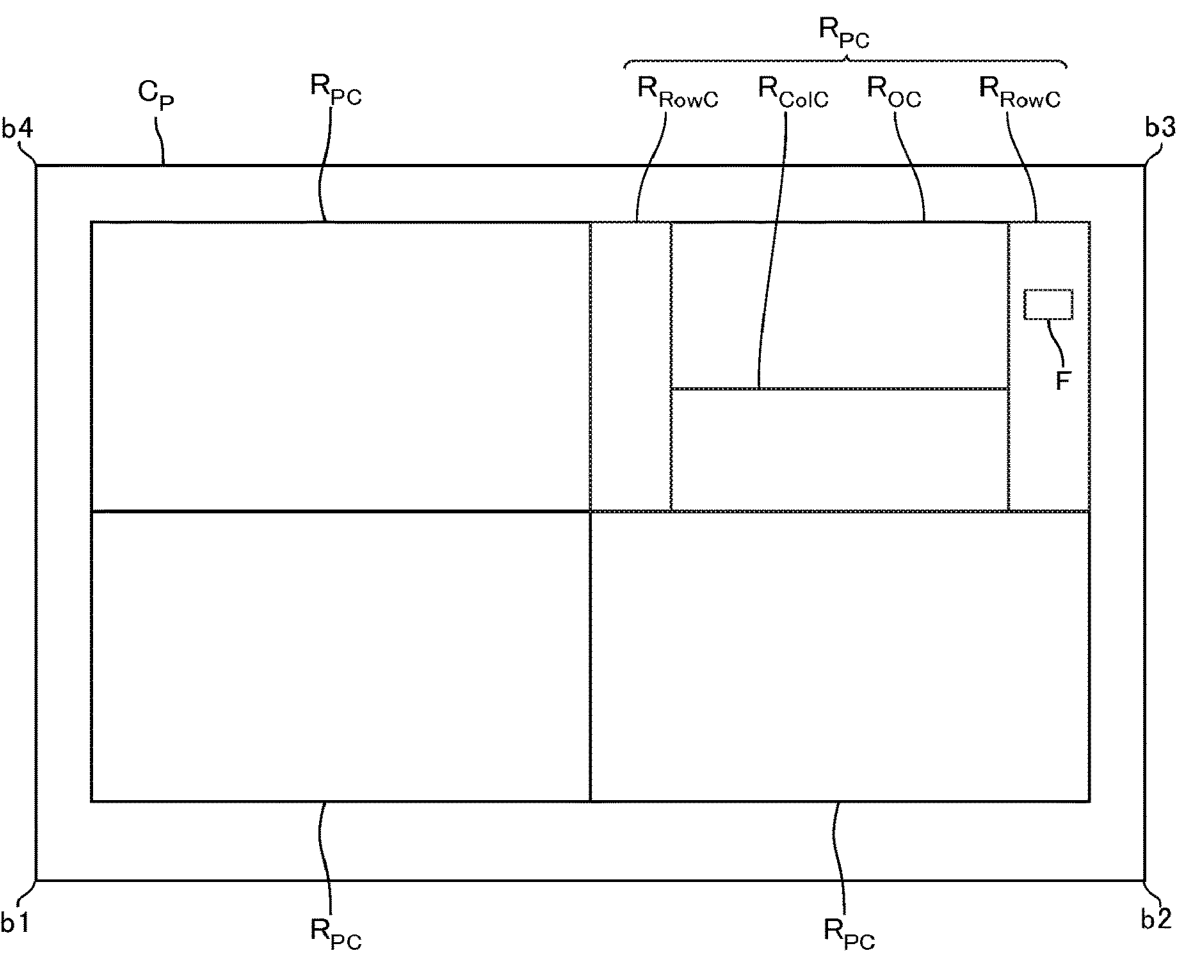
FIG. 6 is a schematic plan view showing an example of configuration of a chip $C_P$.

FIG. 6 is a schematic plan view showing an example of configuration of the chip $C_P$. In FIG. 6, a part of configurations such as the bonding electrodes $P_{I2}$ are omitted. In the example of FIG. 6, the chip $C_P$ comprises four peripheral circuit regions $R_{PC}$ aligned in the X direction and the Y direction correspondingly to the four memory plane regions $R_{MP}$.

The two end portions in the X direction, of the peripheral circuit region $R_{PC}$ are each provided with a row control circuit region $R_{RowC}$. Moreover, a column control circuit region $R_{ColC}$ (sense amplifier region) and a circuit region $R_{OC}$ that are aligned in the Y direction are provided between these two row control circuit regions $R_{RowC}$. The row control circuit region $R_{RowC}$ is provided with the row control circuit RowC described with reference to FIG. 2. The column control circuit region $R_{ColC}$ is provided with the column control circuit ColC described with reference to FIG. 3. The circuit region $R_{OC}$ is provided with other circuits in the peripheral circuit PC.

Figure 7:
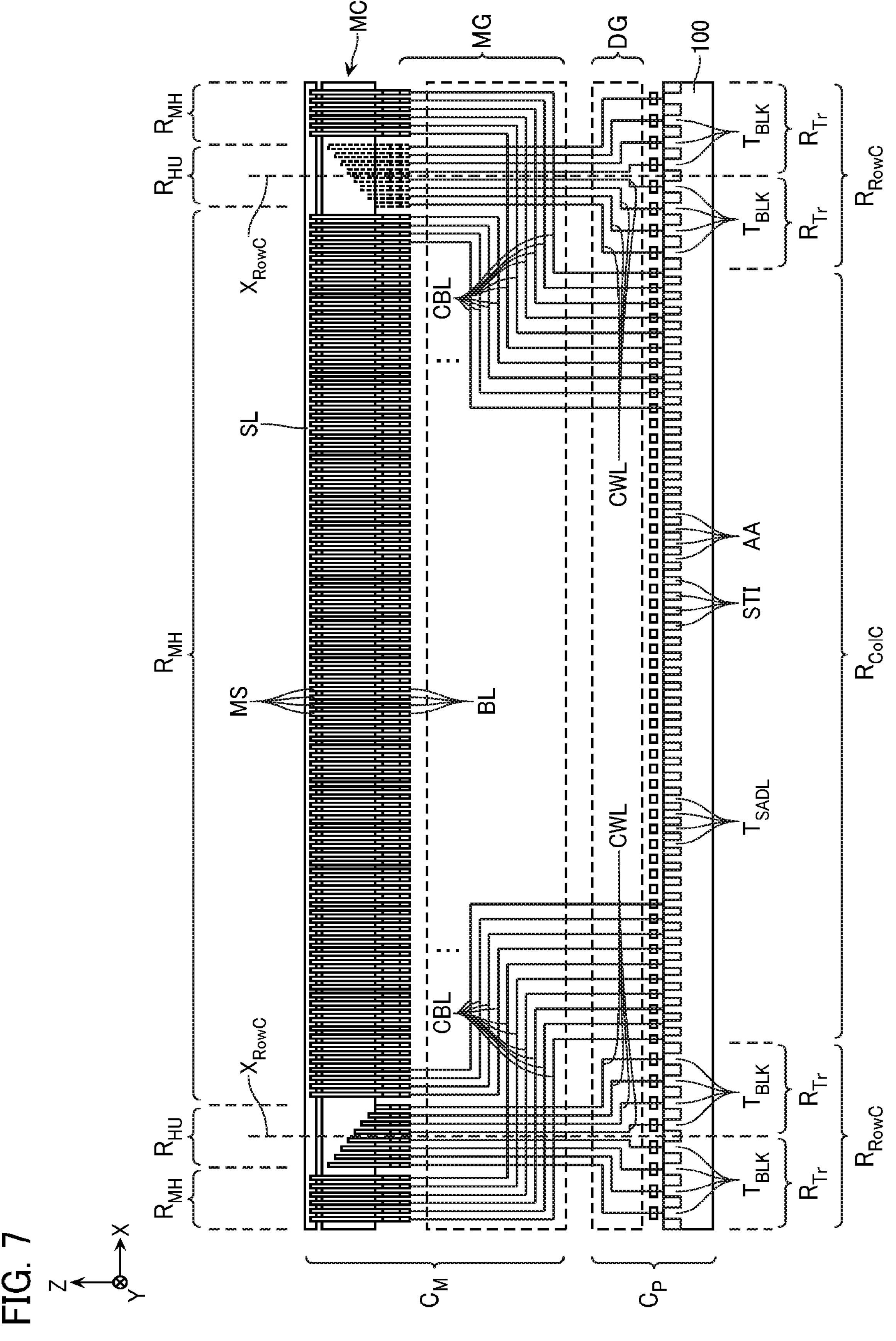
FIG. 7 is a schematic cross-sectional view showing a part of configurations of the chips $C_M$, $C_P$.

FIG. 7 is a schematic cross-sectional view showing a part of configurations of the chips $C_M$, $C_P$. As shown in FIG. 7, the chip $C_M$ comprises: the memory cell array MCA; and a wiring layer group MG which is provided below the memory cell array MCA. Moreover, the chip $C_P$ comprises: a semiconductor substrate 100; and a wiring layer group DG which is provided above the semiconductor substrate 100.

In FIG. 7, there are exemplified: the transistors $T_{BLK}$ described with reference to FIG. 2; and sense amplifier transistors $T_{SADL}$ configuring the sense amplifier circuit SADL described with reference to FIG. 3.

Note that in FIG. 7, a position in a vicinity of a center in the X direction of the row control circuit region $R_{RowC}$ is indicated as a position $X_{RowC}$. The position $X_{RowC}$ may coincide with a center position in the X direction of the row control circuit region $R_{RowC}$, but need not do so. Moreover, the position $X_{RowC}$ may coincide with a center position in the X direction of the hookup region $R_{HU}$, but need not do so. Moreover, a region provided more to a positive side in the X direction than the position $X_{RowC}$ in the row control circuit region $R_{RowC}$ and region provided more to a negative side in the X direction than the position $X_{RowC}$ in the row control circuit region $R_{RowC}$ are each indicated as a transistor region $R_{Tr}$.

The $1^{st}$ transistor region $R_{Tr}$ counting from a negative side in the X direction is provided at a position overlapping the $1^{st}$ memory region $R_{MH}$ counting from a negative side in the X direction, looking from the Z direction. Moreover, this transistor region $R_{Tr}$ is provided at a position overlapping a part (a region more to a negative side in the X direction than the position $X_{RowC}$) of the $1^{st}$ hookup region $R_{HU}$ counting from a negative side in the X direction, looking from the Z direction.

The 2nd transistor region $R_{Tr}$ counting from a negative side in the X direction is provided at a position overlapping a part (a region more to a positive side in the X direction than the position $X_{RowC}$) of the $1^{st}$ hookup region $R_{HU}$ counting from a negative side in the X direction, looking from the Z direction. Moreover, this transistor region $R_{Tr}$ is provided at a position overlapping a part (a region in a vicinity of an end portion on a negative side in the X direction) of the $2^{nd}$ memory region $R_{MH}$ counting from a negative side in the X direction, looking from the Z direction.

The column control circuit region $R_{ColC}$ is provided at a position overlapping a part (a region excluding the region in a vicinity of the end portion on a negative side in the X direction and excluding a region in a vicinity of an end portion on a positive side in the X direction) of the $2^{nd}$ memory region $R_{MH}$ counting from a negative side in the X direction, looking from the Z direction.

The $3^{rd}$ transistor region $R_{Tr}$ counting from a negative side in the X direction is provided at a position overlapping a part (the region in a vicinity of the end portion on a positive side in the X direction) of the $2^{nd}$ memory region $R_{MH}$ counting from a negative side in the X direction, looking from the Z direction. Moreover, this transistor region $R_{Tr}$ is provided at a position overlapping a part (a region more to a negative side in the X direction than the position $X_{RowC}$) of the $2^{nd}$ hookup region $R_{HU}$ counting from a negative side in the X direction, looking from the Z direction.

The $4^{th}$ transistor region $R_{Tr}$ counting from a negative side in the X direction is provided at a position overlapping a part (a region more to a positive side in the X direction than the position $X_{RowC}$) of the $2^{nd}$ hookup region $R_{HU}$ counting from a negative side in the X direction, looking from the Z direction. Moreover, this transistor region $R_{Tr}$ is provided at a position overlapping the $3^{rd}$ memory region $R_{MH}$ counting from a negative side in the X direction, looking from the Z direction.

Configurations of the memory cell array MCA, the semiconductor substrate 100, the wiring layer group MG, and the wiring layer group DG will be described in order below.

[Structure in Memory Region $R_{MH}$ of Memory Cell Array MCA]

Figure 8:
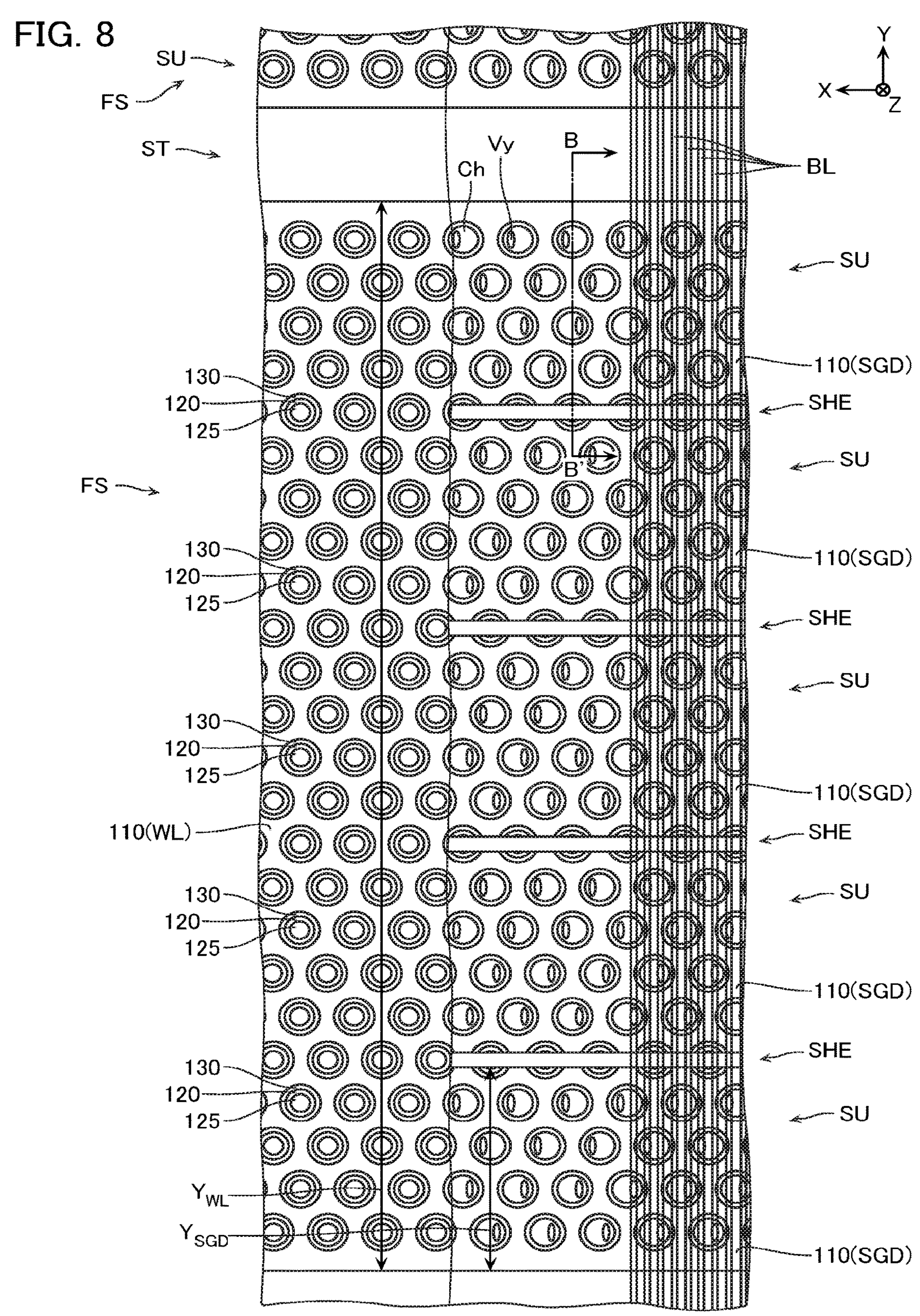
FIG. 8 is a schematic bottom view showing enlarged the portion indicated by A in FIG. 5.
Figure 9:
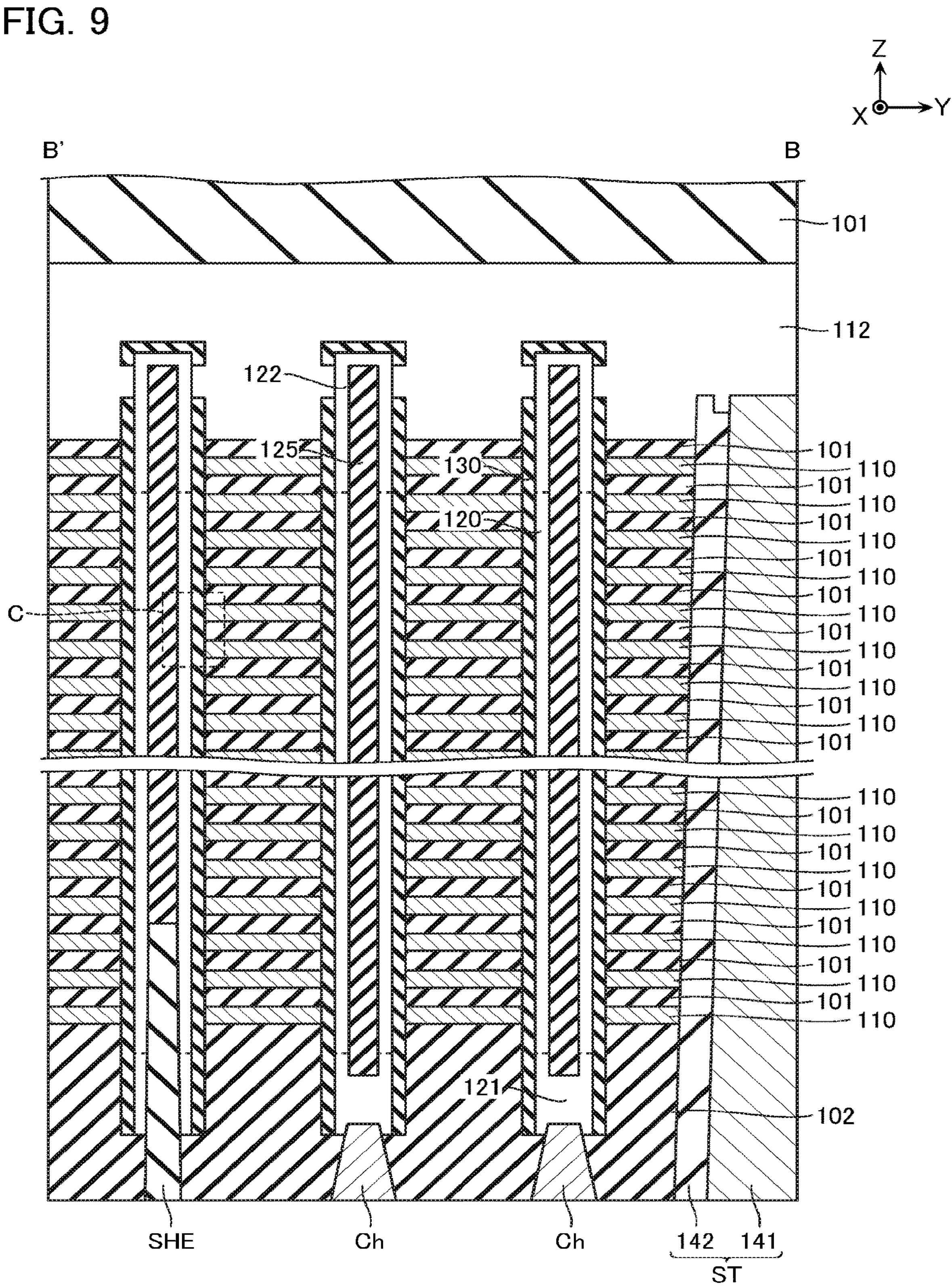
FIG. 9 is a schematic cross-sectional view in which the structure shown in FIG. 8 has been cut along the line B-B' and viewed along a direction of the arrows.
Figure 10:
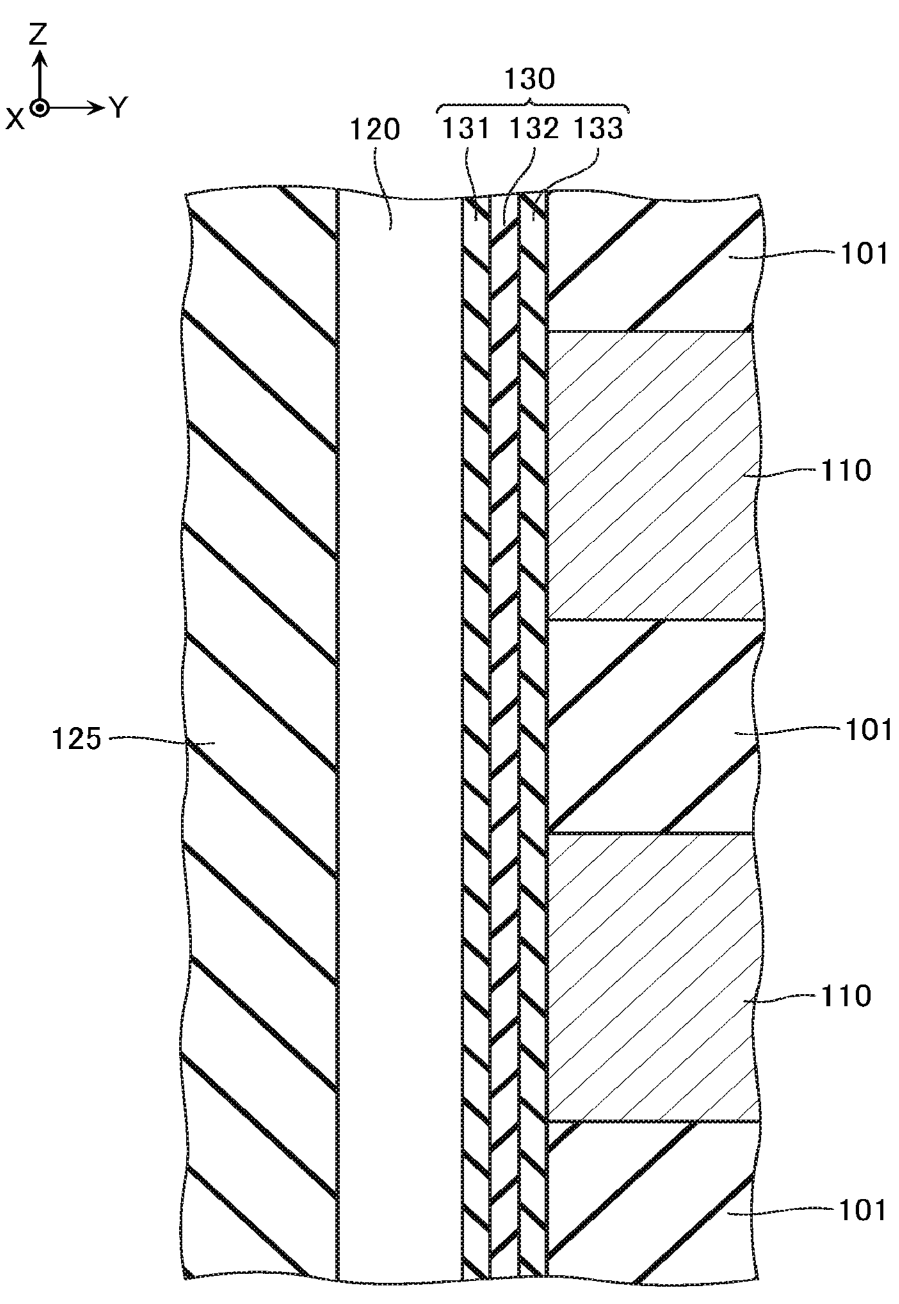
FIG. 10 is a schematic cross-sectional view showing enlarged the portion indicated by C in FIG. 9.

FIG. 8 is a schematic bottom view showing enlarged the portion indicated by A in FIG. 5. FIG. 9 is a schematic cross-sectional view in which the structure shown in FIG. 8 has been cut along the line B-B' and viewed along a direction of the arrows. FIG. 10 is a schematic cross-sectional view showing enlarged the portion indicated by C in FIG. 9. Although FIG. 10 shows a YZ cross section, a similar structure to in FIG. 10 will be observed, even if a cross section other than a YZ cross section (for example, an XZ cross section) along a central axis of a semiconductor column 120 is observed.

As has been described with reference to FIG. 5, the memory plane region $R_{MP}$ is provided with a plurality of the finger structures FS aligned in the Y direction. As shown in FIG. 8, an inter-finger structure ST is provided between two finger structures FS adjacent in the Y direction.

As shown in FIG. 9, for example, the finger structure FS comprises: a plurality of conductive layers 110 stacked in the Z direction; a plurality of the semiconductor columns 120 extending in the Z direction; and a gate insulating film 130 provided between these conductive layers 110 and semiconductor columns 120.

The conductive layer 110 comprises a substantially plate-like shape extending in the X direction. The conductive layer 110 may include the likes of a stacked film in which there are stacked a barrier conductive film of titanium nitride (TiN), or the like, and metal film of tungsten (W), molybdenum (Mo), or the like. Moreover, the conductive layer 110 may include the likes of polycrystalline silicon including an impurity such as phosphorus (P) or boron (B), for example. An inter-layer insulating layer 101 of the likes of silicon oxide ($SiO_2$) is provided between the plurality of conductive layers 110 stacked in the Z direction. Moreover, an insulating layer 102 of the likes of silicon oxide ($SiO_2$) is provided on a lower surface of the most downwardly provided conductive layer 110.

The one or plurality of conductive layers 110 located in the uppermost layer, of the plurality of conductive layers 110 function as the gate electrode of the source side select transistor STS (FIG. 1) and as the source side select gate line SGS. These plurality of conductive layers 110 are electrically independent every memory block BLK. These plurality of conductive layers 110 are continuous in the X direction from one end to the other end in the X direction of the finger structure FS.

Moreover, the plurality of conductive layers 110 located below these uppermost layer-located conductive layers 110 function as the gate electrodes of the memory cells MC (FIG. 1) and as the word lines WL. These plurality of conductive layers 110 are each electrically independent every memory block BLK. These plurality of conductive layers 110 are continuous in the X direction from one end to the other end in the X direction of the finger structure FS.

Moreover, the one or plurality of conductive layers 110 located below these word line WL-functioning conductive layers 110 function as the gate electrode of the drain side select transistor STD (FIG. 1) and as the drain side select gate line SGD. As shown in FIG. 8, for example, width $Y_{SGD}$ in the Y direction of these plurality of conductive layers 110 is smaller than width $Y_{WL}$ in the Y direction of the conductive layers 110 functioning as the word lines WL. Moreover, an insulating member SHE of the likes of silicon oxide ($SiO_2$) is provided between two conductive layers 110 adjacent in the Y direction within the finger structure FS. These plurality of conductive layers 110 are continuous in the X direction from one end to the other end in the X direction of the memory region $R_{MH}$. Hence, length in the X direction of those provided in the $2^{nd}$ memory region $R_{MH}$ counting from a negative side in the X direction, of the plurality of conductive layers 110 functioning as the drain side select gate line SGD, and so on, is longer than that of those provided in the $1^{st}$ and $3^{rd}$ memory regions $R_{MH}$ counting from a negative side in the X direction, of the plurality of conductive layers 110 functioning as the drain side select gate line SGD, and so on.

As shown in FIG. 8, for example, the semiconductor columns 120 are aligned in a certain pattern in the X direction and the Y direction. The semiconductor columns 120 each function as channel regions of the plurality of memory cells MC and the select transistors (STD, STS) included in one memory string MS (FIG. 1). The semiconductor column 120 includes the likes of polycrystalline silicon (Si), for example. The semiconductor column 120 has a substantially cylindrical shape, and, in its central portion, is provided with an insulator column 125 of the likes of silicon oxide. An outer peripheral surface of the semiconductor column 120 is surrounded by each of a plurality of the conductive layers 110, and faces these plurality of conductive layers 110.

Moreover, as shown in FIG. 9, an impurity region 122 is provided at an upper end of the semiconductor column 120. In the example of FIG. 9, a lower end of the impurity region 122 is expressed by a dotted line. The impurity region 122 includes an N type impurity such as phosphorus (P) or P type impurity such as boron (B), for example. The impurity region 122 is connected to a conductive layer 112 provided above the plurality of conductive layers 110.

The conductive layer 112 functions as part of the source line SL (FIG. 1). The conductive layer 112 may include a semiconductor layer of the likes of silicon (Si) that has been implanted with an N type impurity such as phosphorus (P) or P type impurity such as boron (B), may include a metal such as tungsten (W), or may include a silicide such as tungsten silicide (WSi), for example.

Moreover, an impurity region 121 is provided at a lower end of the semiconductor column 120. In the example of FIG. 9, an upper end of the impurity region 121 is expressed by a dotted line. The impurity region 121 includes an N type impurity such as phosphorus (P), for example. The impurity region 121 is connected to a via contact electrode Ch. The via contact electrode Ch is electrically connected to the bit line BL via a via contact electrode Vy (FIG. 8).

As shown in FIG. 9, for example, the gate insulating film 130 has a substantially cylindrical shape covering the outer peripheral surface of the semiconductor column 120. As shown in FIG. 10, for example, the gate insulating film 130 comprises a tunnel insulating film 131, a charge accumulating film 132, and a block insulating film 133 that are stacked between the semiconductor column 120 and the conductive layer 110. The tunnel insulating film 131 and the block insulating film 133 include the likes of silicon oxide ($SiO_2$) or silicon oxynitride (SiON), for example. The charge accumulating film 132 includes a film capable of accumulating charge, of the likes of silicon nitride (SiN), for example. The tunnel insulating film 131, the charge accumulating film 132, and the block insulating film 133 have substantially cylindrical shapes, and extend in the Z direction along the outer peripheral surface of the semiconductor column 120 excluding a contact portion of the semiconductor column 120 and the conductive layer 112.

Note that FIG. 10 has shown an example where the gate insulating film 130 comprises the charge accumulating film 132 of the likes of silicon nitride. However, the gate insulating film 130 may comprise a floating gate of the likes of polycrystalline silicon including an N type or P type impurity, for example.

As shown in FIGS. 8 and 9, for example, the inter-finger structure ST extends in the X direction and the Z direction. As shown in FIG. 9, for example, the inter-finger structure ST comprises: an inter-finger electrode 141; and an inter-finger insulating member 142 of the likes of silicon oxide ($SiO_2$), provided on a side surface in the Y direction of the inter-finger electrode 141. The inter-finger electrode 141 functions as part of the source line SL (FIG. 1). An upper end of the inter-finger electrode 141 is connected to the conductive layer 112. The inter-finger electrode 141 may include for example the likes of a stacked film in which there are stacked a barrier conductive film of titanium nitride (TiN), or the like, and metal film of tungsten (W), or the like. Moreover, the inter-finger electrode 141 may include the likes of polycrystalline silicon including an impurity such as phosphorus (P) or boron (B), for example.

[Structure in Hookup Region $R_{HU}$ of Memory Cell Array MCA]

Figure 11:
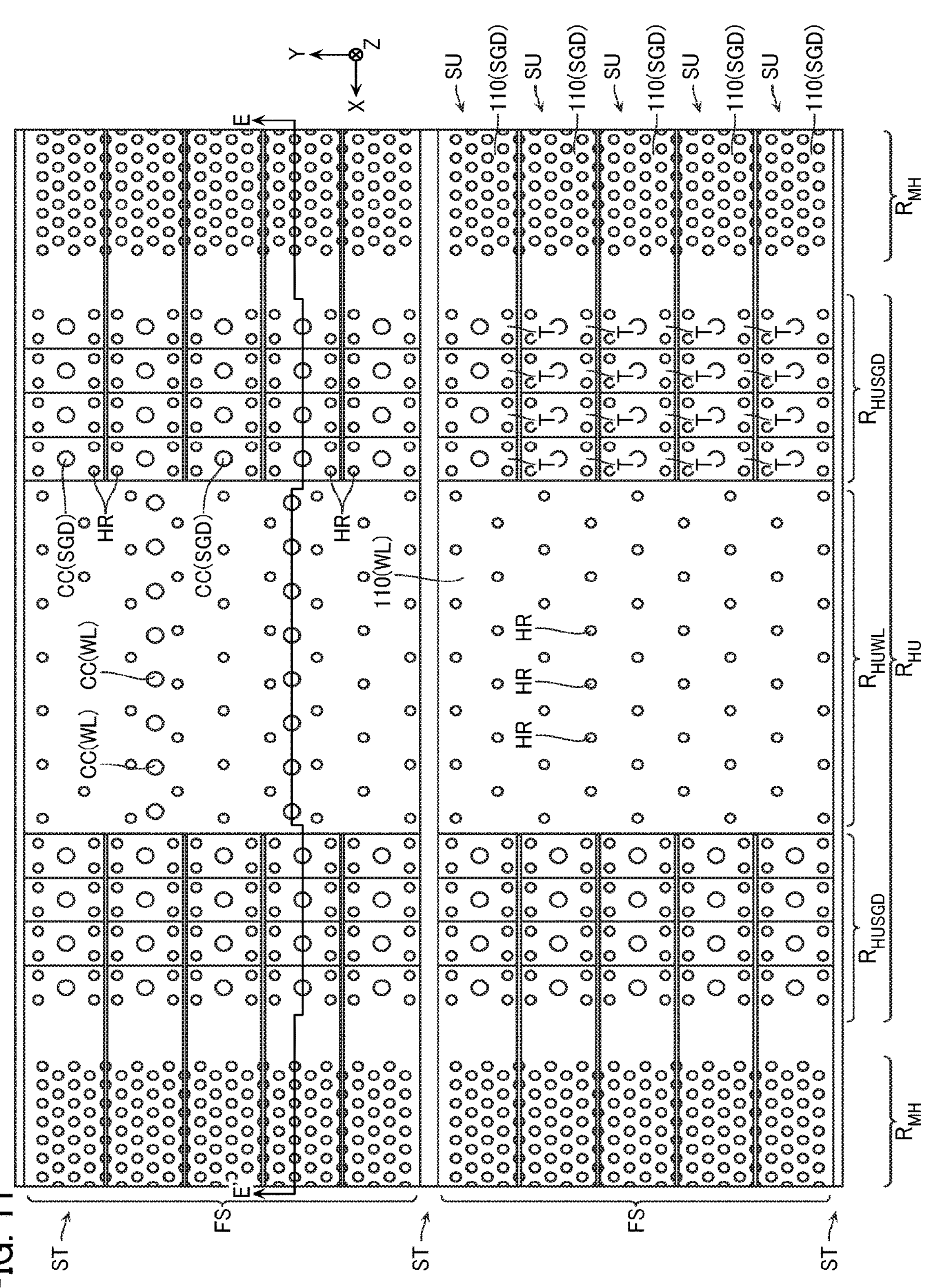
FIG. 11 is a schematic bottom view showing enlarged the portion indicated by D in FIG. 5.
Figure 12:
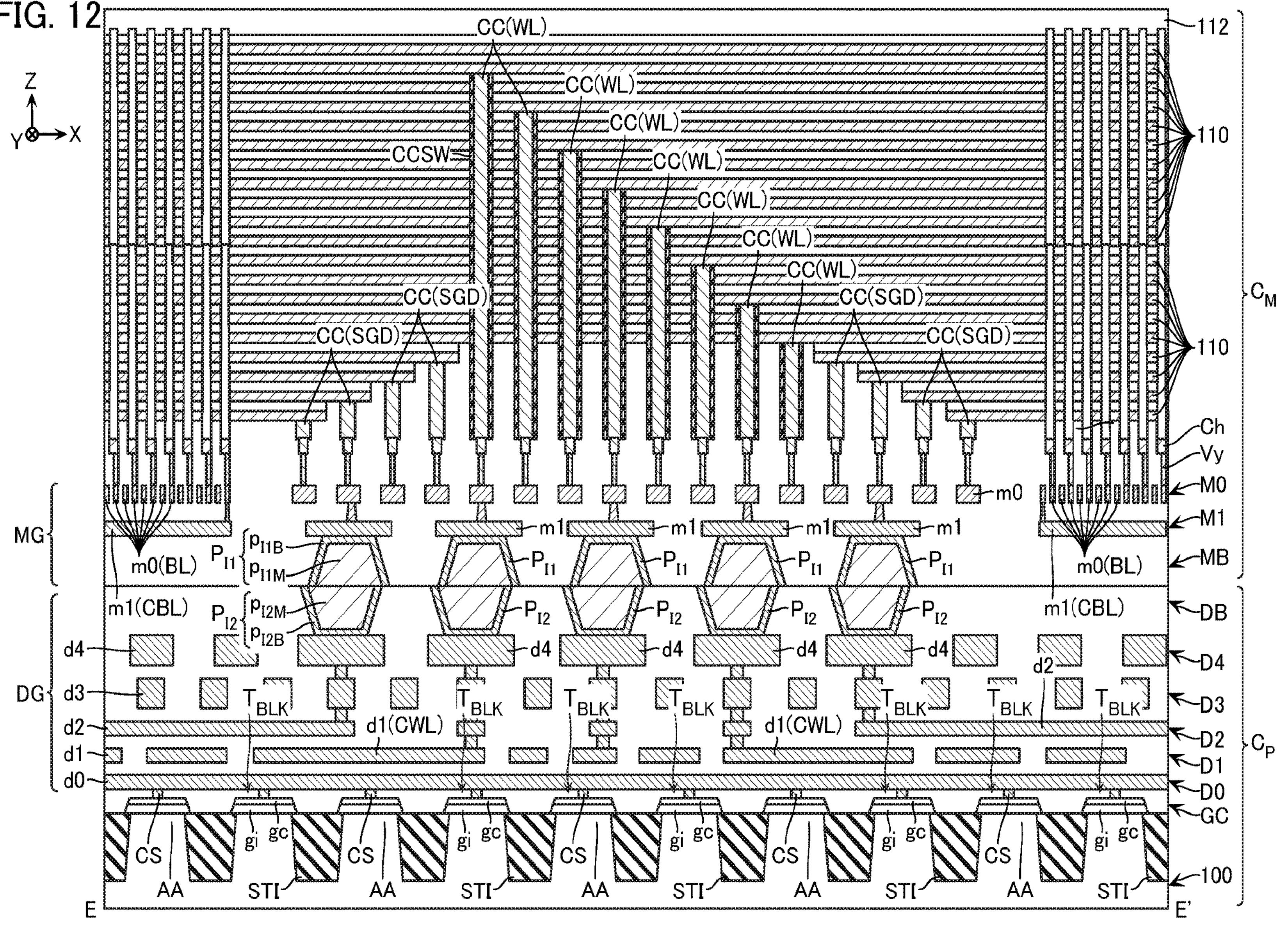
FIG. 12 is a schematic cross-sectional view in which the structure shown in FIG. 11 has been cut along the line E-E' and viewed along a direction of the arrows.

FIG. 11 is a schematic bottom view showing enlarged the portion indicated by D in FIG. 5. FIG. 12 is a schematic cross-sectional view in which the structure shown in FIG. 11 has been cut along the line E-E' and viewed along a direction of the arrows.

As shown in FIG. 11, the hookup region $R_{HU}$ is provided with: a word line hookup region $R_{HUWL}$; and drain side select gate line hookup regions $R_{HUSGD}$ provided on a positive side and a negative side in the X direction with respect to the word line hookup region $R_{HUWL}$. Note that in the drawing, a via contact electrode CC provided in the word line hookup region $R_{HUWL}$ is illustrated as a via contact electrode CC(WL). Moreover, a via contact electrode CC provided in the drain side select gate line hookup region $R_{HUSGD}$ is illustrated as a via contact electrode CC(SGD).

The word line hookup region $R_{HUWL}$ is provided with: a plurality of the via contact electrodes CC(WL) aligned in the X direction over a plurality of columns (in the example illustrated, two columns); and a plurality of insulator columns HR aligned in the X direction and the Y direction.

The via contact electrodes CC are provided correspondingly to all of the conductive layers 110. The via contact electrode CC extends in the Z direction, and has its upper end connected to its corresponding conductive layer 110, as shown in FIG. 12. The via contact electrode CC includes the likes of a stacked film of titanium nitride (TiN) and tungsten (W), for example. An insulating film CCSW of the likes of silicon oxide ($SiO_2$) is provided between the via contact electrode CC(WL) and the conductive layer 110. An outer peripheral surface of the via contact electrode CC(WL) faces via the insulating film CCSW an inner peripheral surface of a through-hole provided in the conductive layers 110.

In the example of FIG. 12, the more to a negative side in the X direction a certain one of these plurality of via contact electrodes CC(WL) is provided, the longer its length in the Z direction will be, and the more upward the conductive layer 110 to which it is connected will be. Moreover, the more to a positive side in the X direction it is provided, the shorter its length in the Z direction will be, and the more downward the conductive layer 110 to which it is connected will be.

The insulator column HR (FIG. 11) supports a structure under manufacture, during manufacturing of the semiconductor memory device. The insulator column HR extends in the Z direction penetrating the plurality of conductive layers 110, although illustration of this is omitted. The insulator column HR may include solely an insulating layer of the likes of silicon oxide ($SiO_2$), for example. Moreover, the insulator column HR may comprise a similar structure to the gate insulating film 130, the semiconductor column 120, and the insulator column 125.

As shown in FIG. 11, the drain side select gate line hookup region $R_{HUSGD}$ is provided with a plurality of terrace regions T that correspond to the plurality of conductive layers 110 corresponding to the drain side select gate line SGD. The terrace region T is a region that, looking from below, does not overlap the other conductive layers 110, of a lower surface of the conductive layer 110. In the example of FIG. 11, each terrace region T is correspondingly provided with one via contact electrode CC(SGD) and four insulator columns HR.

In FIG. 12, there are exemplified two drain side select gate line hookup regions $R_{HUSGD}$ aligned in the X direction. In the one provided more to a positive side in the X direction, of these two drain side select gate line hookup regions $R_{HUSGD}$, the more to a positive side in the X direction a certain one of the plurality of via contact electrodes CC(SGD) is provided, the more downward the conductive layer 110 to which it is connected will be. Moreover, the more to a negative side in the X direction it is provided, the more upward the conductive layer 110 to which it is connected will be. On the other hand, in the one provided more to a negative side in the X direction, of the two drain side select gate line hookup regions $R_{HUSGD}$ in FIG. 12, the more to a negative side in the X direction a certain one of the plurality of via contact electrodes CC(SGD) is provided, the more downward the conductive layer 110 to which it is connected will be. Moreover, the more to a positive side in the X direction it is provided, the more upward the conductive layer 110 to which it is connected will be.

Note that as has been described with reference to FIG. 5, the memory plane region $R_{MP}$ is provided with two hookup regions $R_{HU}$ aligned in the X direction. In this kind of structure, it is possible for the via contact electrodes CC(WL) corresponding to the word lines WL and source side select gate line SGS to be provided solely in one of the two hookup regions $R_{HU}$ in each finger structure FS.

For example, as mentioned above, FIG. 11 shows enlarged the portion indicated by D in FIG. 5. Now, in the hookup region $R_{HU}$ exemplified in FIG. 11 (the hookup region $R_{HU}$ more to a positive side in the X direction in FIG. 5), there are provided via contact electrodes CC(WL) corresponding to the finger structure FS provided more to a positive side in the Y direction, of the illustrated two finger structures FS, but there are not provided via contact electrodes CC(WL) corresponding to the finger structure FS provided more to a negative side in the Y direction, of the illustrated two finger structures FS. Contrarily, in the hookup region $R_{HU}$ more to a negative side in the X direction in FIG. 5, there are not provided via contact electrodes CC(WL) corresponding to the finger structure FS provided more to a positive side in the Y direction, of the two finger structures FS illustrated in FIG. 11, but there are provided via contact electrodes CC(WL) corresponding to the finger structure FS provided more to a negative side in the Y direction, of the two finger structures FS illustrated in FIG. 11, although illustration of this contrary case is omitted.

For example, one of the two hookup regions $R_{HU}$ in FIG. 5 may include the via contact electrodes CC(WL) corresponding to even-numbered finger structures FS or memory blocks BLK counting from a negative side in the Y direction. In this case, the other of the two hookup regions $R_{HU}$ may include the via contact electrodes CC(WL) corresponding to odd-numbered finger structures FS or memory blocks BLK counting from a negative side in the Y direction, for example.

Moreover, for example, one of the two hookup regions $R_{HU}$ in FIG. 5 may include the via contact electrodes CC(WL) corresponding to the $4n+1^{th}$ (where n is an integer of 0 or more) and $4n+4^{th}$ finger structures FS or memory blocks BLK counting from a negative side in the Y direction. In this case, the other of the two hookup regions $R_{HU}$ may include the via contact electrodes CC(WL) corresponding to the $4n+2^{th}$ and $4n+3^{th}$ finger structures FS or memory blocks BLK counting from a negative side in the Y direction, for example.

The via contact electrodes CC(SGD) corresponding to the drain side select gate line SGD are basically provided in all of the hookup regions $R_{HU}$. However, the $2^{nd}$ memory region $R_{MH}$ counting from a negative side in the X direction (FIG. 5) has both of its sides in the X direction provided with the hookup region $R_{HU}$. In this kind of structure, it is possible too for the via contact electrodes CC(SGD) corresponding to the drain side select gate line SGD in this memory region $R_{MH}$ to be omitted in the $1^{st}$ or $2^{nd}$ hookup region $R_{HU}$ counting from a negative side in the X direction.

[Structure of Semiconductor Substrate 100]

The semiconductor substrate 100 includes P type silicon (Si) that includes a P type impurity such as boron (B), for example. As shown in FIG. 12, for example, a surface of the semiconductor substrate 100 is provided with: a semiconductor region AA; and an insulating region STI of the likes of silicon oxide ($SiO_2$). Some of the semiconductor regions AA are provided in an N type well region including an N type impurity such as phosphorus (P). Some of the semiconductor regions AA are provided in a P type well region including a P type impurity such as boron (B). The semiconductor region AA may be provided in a region including both the N type well region and the P type well region, may be provided in a region including only one of these well regions, or may be provided in a region not including either of these well regions.

An electrode layer GC is provided on an upper surface of the semiconductor substrate 100 via an insulating layer gi. The electrode layer GC includes a plurality of electrodes gc facing the semiconductor regions AA. Moreover, the semiconductor regions AA and the plurality of electrodes gc included in the electrode layer GC are each connected to a via contact electrode CS.

The semiconductor regions AA respectively function as channel regions of the plurality of transistors and as one of the electrodes of the plurality of capacitors, and so on, configuring the peripheral circuit PC (FIG. 1).

The plurality of electrodes gc included in the electrode layer GC respectively function as gate electrodes of the plurality of transistors and as the other of the electrodes of the plurality of capacitors, and so on, configuring the peripheral circuit PC (FIG. 1).

The via contact electrode CS extends in the Z direction, and has its lower end connected to an upper surface of the semiconductor region AA or electrode gc. A connecting portion of the via contact electrode CS and semiconductor region AA is provided with an impurity region including an N type impurity or P type impurity. The via contact electrode CS may include for example the likes of a stacked film in which there are stacked a barrier conductive film of titanium nitride (TiN), or the like, and metal film of tungsten (W), or the like.

[Structure in Row Control Circuit Region $R_{RowC}$ of Semiconductor Substrate 100]

Figure 13:
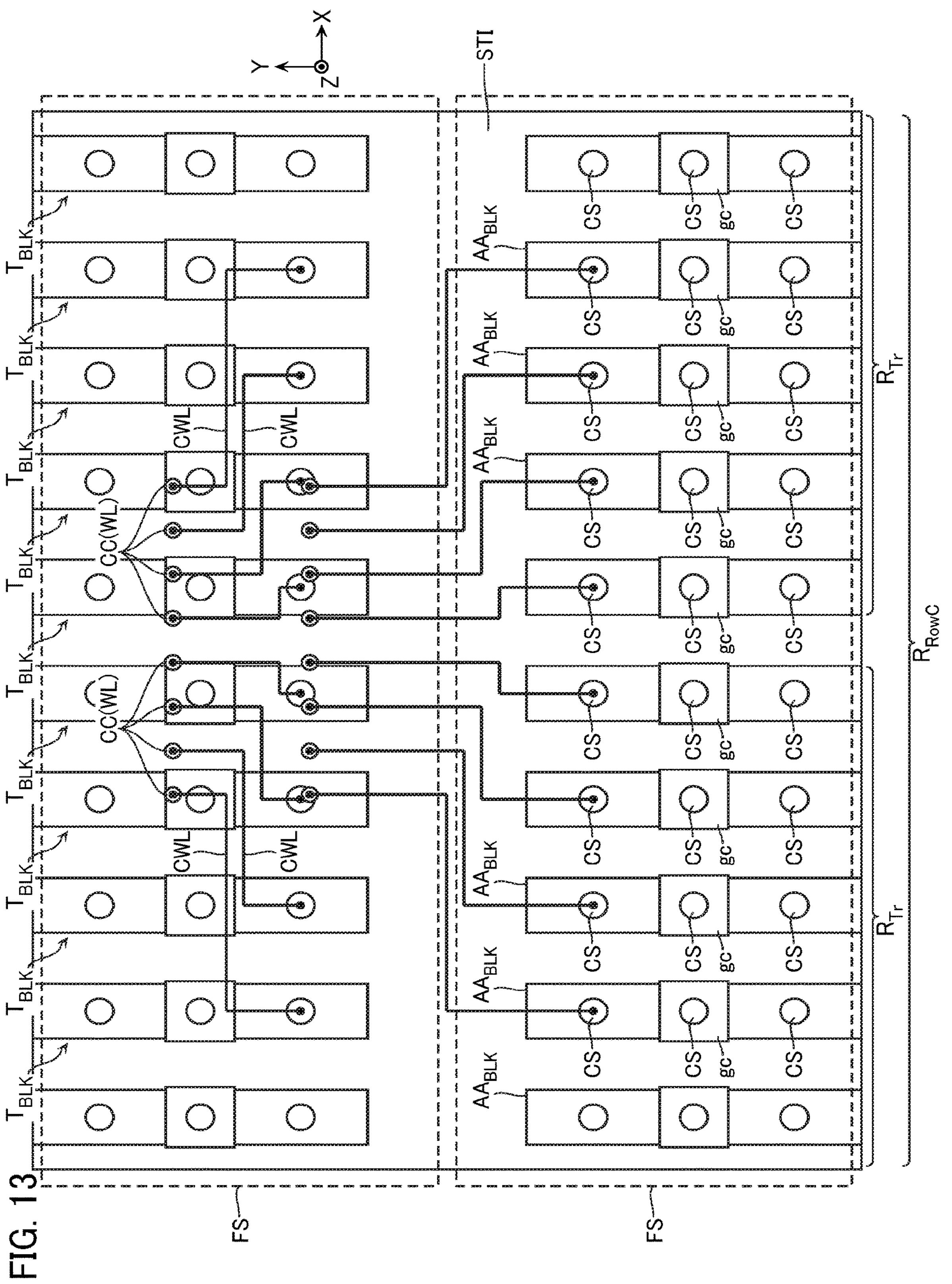
FIG. 13 is a schematic plan view showing enlarged the portion indicated by F in FIG. 6.

FIG. 13 is a schematic plan view showing enlarged the portion indicated by F in FIG. 6. In FIG. 13, a region overlapping the finger structure FS looking from the Z direction is indicated by a dotted line (refer to FIG. 11).

The row control circuit region $R_{RowC}$ is provided with a plurality of the transistors $T_{BLK}$ aligned in the X direction over two columns, in a region corresponding to two of the finger structures FS, for example. That is, the region corresponding to the two finger structures FS is provided with a plurality of the semiconductor regions AA aligned in the X direction over two columns. In the example of FIG. 13, these plurality of semiconductor regions AA are indicated as semiconductor regions $AA_{BLK}$. The insulating region STI is provided between these plurality of semiconductor regions $AA_{BLK}$.

The semiconductor regions $AA_{BLK}$ in the row control circuit region $R_{RowC}$ each extend in the Y direction and are connected to the via contact electrode CS functioning as a source electrode and to the via contact electrode CS functioning as a drain electrode. Moreover, between these two via contact electrodes CS, there are provided the electrode gc functioning as a gate electrode, and the via contact electrode CS connected to this electrode gc.

Moreover, in FIG. 13, there are illustrated a plurality of the via contact electrodes CC(WL) described with reference to FIG. 11. Those functioning as the drain electrode, of the plurality of via contact electrodes CS connected to the plurality of semiconductor regions $AA_{BLK}$, are respectively electrically connected to the via contact electrodes CC(WL), via wirings in the wiring layer groups MG, DG.

For example, the transistors $T_{BLK}$ corresponding to the one provided more to a negative side in the X direction, of the transistor regions $R_{Tr}$ exemplified in FIG. 13 are connected to the conductive layers 110 functioning as the source side select gate line SGS and to those provided above a certain height position, of the conductive layers 110 functioning as the word lines WL (refer to FIG. 12).

Moreover, the transistors $T_{BLK}$ corresponding to the one provided more to a positive side in the X direction, of the transistor regions $R_{Tr}$ exemplified in FIG. 13 are connected to those provided below the certain height position, of the conductive layers 110 functioning as the word lines WL (refer to FIG. 12).

[Structure of Wiring Layer Group MG]

As shown in FIG. 12, for example, the wiring layer group MG comprises: wiring layers M0, M1 which are provided below the memory cell array MCA; and a chip bonding electrode layer MB which is provided below the wiring layers M0, M1.

A plurality of wirings included in the wiring layers M0, M1 are electrically connected to at least one of configurations in the memory cell array MCA and configurations in the chip $C_P$, for example.

The wiring layer M0 includes a plurality of wirings m0. These plurality of wirings m0 may include for example the likes of a stacked film in which there are stacked a barrier conductive film of titanium nitride (TiN), or the like, and metal film of copper (Cu), or the like.

Some of the plurality of wirings m0 function as the bit line BL. As shown in FIG. 8, for example, the bit lines BL are aligned in the X direction and extend in the Y direction.

As shown in FIG. 12, for example, the wiring layer M1 includes a plurality of wirings ml. These plurality of wirings ml may include for example the likes of a stacked film in which there are stacked a barrier conductive film of titanium nitride (TiN), or the like, and metal film of tungsten (W), or the like.

Some of the plurality of wirings ml are electrically connected between the bit line BL, and the sense amplifier transistor $T_{SADL}$ in the column control circuit region $R_{ColC}$ (FIG. 7), and function as a wiring CBL extending in the X direction. One end portion in the X direction of the wiring CBL is provided at a position overlapping its corresponding bit line BL looking from the Z direction. The other end portion in the X direction of the wiring CBL is provided in a vicinity of its corresponding sense amplifier circuit SADL, in the column control circuit region $R_{ColC}$.

For example, in a structure of the kind exemplified in FIG. 7, the wirings CBL corresponding to the $1^{st}$ memory region $R_{MH}$ counting from a negative side in the X direction extend in the X direction straddling a region overlapping at least a part of the $1^{st}$ memory region $R_{MH}$ counting from a negative side in the X direction, the $1^{st}$ hookup region $R_{HU}$ counting from a negative side in the X direction, a part of the $2^{nd}$ memory region $R_{MH}$ counting from a negative side in the X direction, and a part of the column control circuit region $R_{ColC}$, looking from the Z direction.

Moreover, the wirings CBL corresponding to the $2^{nd}$ memory region $R_{MH}$ counting from a negative side in the X direction are provided within a range of a region overlapping a part of the $2^{nd}$ memory region $R_{MH}$ counting from a negative side in the X direction, looking from the Z direction.

Moreover, the wirings CBL corresponding to the $3^{rd}$ memory region $R_{MH}$ counting from a negative side in the X direction extend in the X direction straddling a region overlapping at least a part of the $3^{rd}$ memory region $R_{MH}$ counting from a negative side in the X direction, the $2^{nd}$ hookup region $R_{HU}$ counting from a negative side in the X direction, a part of the $2^{nd}$ memory region $R_{MH}$ counting from a negative side in the X direction, and a part of the column control circuit region $R_{ColC}$, looking from the Z direction.

The chip bonding electrode layer MB (FIG. 12) includes a plurality of the bonding electrodes $P_{I1}$. These plurality of bonding electrodes $P_{I1}$ may include for example the likes of a stacked film in which there are stacked a barrier conductive film $p_{I1B}$ of titanium nitride (TiN), or the like, and metal film $p_{I1M}$ of copper (Cu), or the like. These plurality of bonding electrodes $P_{I1}$ are electrically connected to at least one of configurations in the memory cell array MCA and configurations in the chip $C_P$.

[Structure of Wiring Layer Group DG]

The wiring layer group DG comprises: wiring layers D0, D1, D2, D3, D4 which are provided above the electrode layer GC; and a chip bonding electrode layer DB which is provided above the wiring layers D0, D1, D2, D3, D4.

A plurality of wirings included in the wiring layers D0, D1, D2, D3, D4 are electrically connected to at least one of configurations in the memory cell array MCA and configurations in the chip $C_P$, for example.

The wiring layers D0, D1, D2 respectively include pluralities of wirings d0, d1, d2. These pluralities of wirings d0, d1, d2 may include for example the likes of a stacked film in which there are stacked a barrier conductive film of titanium nitride (TiN), or the like, and metal film of tungsten (W), or the like.

Some of the pluralities of wirings d0, d1, d2 are electrically connected between the word line WL, and a configuration in the row control circuit region $R_{RowC}$, and function as the wiring CWL extending in the X direction. One end portion in the X direction of the wiring CWL is provided in a vicinity of its corresponding via contact electrode CC(WL). The other end portion in the X direction of the wiring CWL is provided in a vicinity of its corresponding transistor $T_{BLK}$, in the row control circuit region $R_{RowC}$.

For example, the wirings CWL corresponding to the one provided more to a negative side in the X direction, of the transistor regions $R_{Tr}$ exemplified in FIG. 13 have their end portion on a via contact electrode CC(WL) side provided more to a positive side in the X direction (more to a side of the position $X_{RowC}$ described with reference to FIG. 7) than their end portion on a transistor $T_{BLK}$ side is. These wirings CWL are provided within a range of a region provided at a position overlapping the transistor region $R_{Tr}$ more to a negative side in the X direction, looking from the Z direction. Some of these wirings CWL have their one end and the other end in the X direction provided within a range of a region overlapping a region more to a negative side than the position $X_{RowC}$, of one hookup region $R_{HU}$, looking from the Z direction. The remaining ones of these wirings CWL extend in the X direction straddling a region overlapping one hookup region $R_{HU}$ and at least a part of the memory region $R_{MH}$ provided more to a negative side in the X direction than this hookup region $R_{HU}$, looking from the Z direction.

Similarly, the wirings CWL corresponding to the one provided more to a positive side in the X direction, of the transistor regions $R_{Tr}$ exemplified in FIG. 13 have their end portion on a via contact electrode CC(WL) side provided more to a negative side in the X direction (more to a side of the position $X_{RowC}$ described with reference to FIG. 7) than their end portion on a transistor $T_{BLK}$ side is. These wirings CWL are provided within a range of a region overlapping the transistor region $R_{Tr}$ more to a positive side in the X direction, looking from the Z direction. Some of these wirings CWL have their one end and the other end in the X direction provided within a range of a region overlapping a region more to a positive side than the position $X_{RowC}$, of one hookup region $R_{HU}$, looking from the Z direction. The remaining ones of these wirings CWL extend in the X direction straddling a region overlapping one hookup region $R_{HU}$ and at least a part of the memory region $R_{MH}$ provided more to a positive side in the X direction than this hookup region $R_{HU}$, looking from the Z direction.

The wiring layers D3, D4 (FIG. 12) respectively include pluralities of wirings d3, d4. These pluralities of wirings d3, d4 may include for example the likes of a stacked film in which there are stacked a barrier conductive film of titanium nitride (TiN), tantalum nitride (TaN), a stacked film of tantalum nitride (TaN) and tantalum (Ta), or the like, and metal film of copper (Cu), or the like.

The chip bonding electrode layer DB includes a plurality of the bonding electrodes $P_{I2}$. These plurality of bonding electrodes $P_{I2}$ may include for example the likes of a stacked film in which there are stacked a barrier conductive film $p_{I2B}$ of titanium nitride (TiN), tantalum nitride (TaN), a stacked film of tantalum nitride (TaN) and tantalum (Ta), or the like, and metal film $p_{I2M}$ of copper (Cu), or the like. These plurality of bonding electrodes $P_{I2}$ are electrically connected to at least one of configurations in the memory cell array MCA and configurations in the chip $C_P$.

Note that when the metal films $p_{I1M}$, $p_{I2M}$ of copper (Cu), or the like, are employed in the bonding electrode $P_{I1}$ and bonding electrode $P_{I2}$, the metal film $p_{I1M}$ and the metal film $p_{I2M}$ amalgamate, so that identification of their boundary with each other becomes difficult. However, due to distortion of shape where the bonding electrode $P_{I1}$ and bonding electrode $P_{I2}$ have been bonded resulting from positional shift of bonding, and due to positional shift (generation of discontinuous places in side surfaces) of the barrier conductive films $p_{I1B}$, $p_{I2B}$ resulting from positional shift of bonding, bonding structure can be identified. Moreover, when the bonding electrode $P_{I1}$ and bonding electrode $P_{I2}$ are formed by a damascene method, their respective side surfaces will have a tapered shape. Therefore, shape of a cross section along the Z direction in a portion where the bonding electrode $P_{I1}$ and bonding electrode $P_{I2}$ have been bonded will be non-rectangular due to side walls being non-linearly shaped. Moreover, when the bonding electrode $P_{I1}$ and bonding electrode $P_{I2}$ are bonded, there will result a structure where each of a bottom surface, side surface, and upper surface of the Cu forming them will be covered by a barrier metal. In contrast, in a general wiring layer employing Cu, the upper surface of the Cu is provided with an insulating layer (of the likes of SiN or SiCN) functioning to prevent oxidation of the Cu, and is not provided with a barrier metal. Therefore, distinction from a general wiring layer is possible, even when positional shift of bonding has not occurred.

Comparative Example

Figure 14:
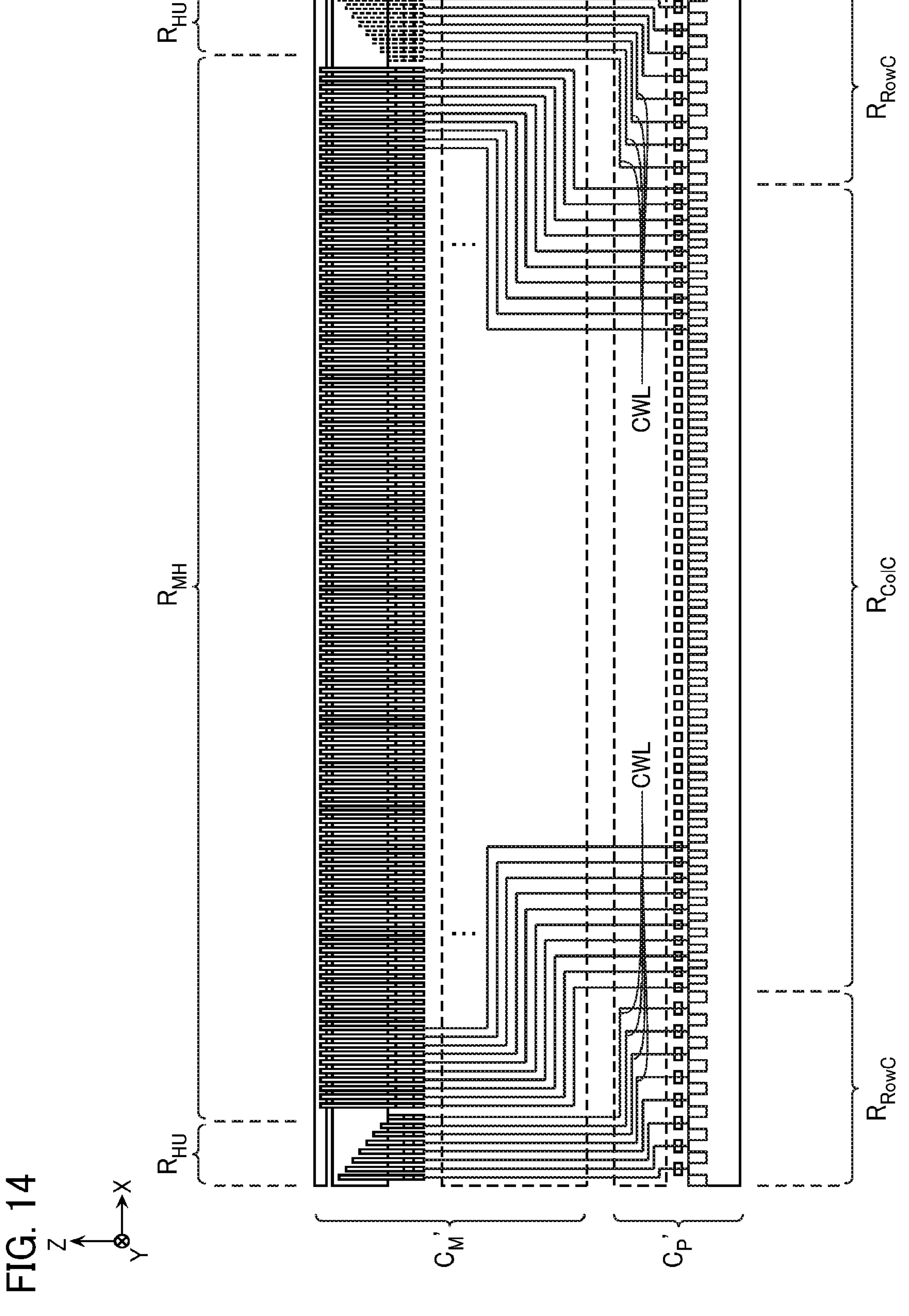
FIG. 14 is a schematic cross-sectional view showing configuration of a semiconductor memory device according to a comparative example.

FIG. 14 is a schematic cross-sectional view showing configuration of a semiconductor memory device according to a comparative example. The semiconductor memory device according to the comparative example comprises: a chip $C_M'$ on a memory cell array MCA side; and a chip $C_P'$ on a peripheral circuit PC side.

The chip $C_M'$ according to the comparative example comprises: a memory region $R_{MH}$; and two hookup regions $R_{HU}$ provided on each of a positive side and a negative side in the X direction with respect to the memory region $R_{MH}$. The hookup region $R_{HU}$ provided more to a negative side in the X direction does not have a memory region $R_{MH}$ provided on its negative side in the X direction. Similarly, the hookup region $R_{HU}$ provided more to a positive side in the X direction does not have a memory region $R_{MH}$ provided on its positive side in the X direction.

In the chip $C_P'$ according to the comparative example, all of the wirings CWL corresponding to the row control circuit region $R_{RowC}$ provided more to a negative side in the X direction have their end portion on a via contact electrode CC(WL) side in the X direction provided more to a negative side in the X direction than their end portion on a transistor $T_{BLK}$ side in the X direction is. Moreover, all of the wirings CWL corresponding to the row control circuit region $R_{RowC}$ provided more to a positive side in the X direction have their end portion on a via contact electrode CC(WL) side in the X direction provided more to a positive side in the X direction than their end portion on a transistor $T_{BLK}$ side in the X direction is.

Now, with rise in level of integration of the semiconductor memory device, the number of conductive layers 110 (refer to FIG. 9) stacked in the Z direction in each finger structure FS is increasing. Accordingly, the number of transistors $T_{BLK}$ (refer to FIG. 13) aligned in the X direction in the row control circuit region $R_{RowC}$, too, is increasing. In a structure like that of the comparative example, as the number of conductive layers 110 and number of transistors $T_{BLK}$ increase, the number of wirings CWL too increases. For example, if the number of word lines WL and source side select gate lines SGS included in each finger structure FS is 128, then the number of wirings CWL corresponding to one finger structure FS, too, will be 128.

The wirings CWL are provided in a region overlapping the row control circuit region $R_{RowC}$, of the wiring layers DO-D2, looking from the Z direction, for example. Moreover, the wirings CWL corresponding to one finger structure FS are provided within a range of a region overlapping two finger structures FS looking from the Z direction, for example. This will result in that when, for example, the number of wirings CWL corresponding to one finger structure FS is 128, these 128 wirings CWL will be provided in such a region, of the wiring layers D0-D2. For this purpose, conceivably, 50 wirings CWL aligned in the Y direction will be provided in each of the wiring layers D0, D1, and 28 wirings CWL aligned in the Y direction will be provided in the wiring layer D2, for example.

[Advantages of Semiconductor Memory Device According to First Embodiment]

In the first embodiment, the row control circuit region $R_{RowC}$ is provided at a position overlapping at least parts of two memory regions $R_{MH}$ aligned in the X direction and the hookup region $R_{HU}$ provided between those two memory regions $R_{MH}$, looking from the Z direction. Moreover, the row control circuit region $R_{RowC}$ is divided into two transistor regions $R_{Tr}$ aligned in the X direction, and a part of the wirings CWL are provided within a range of a region provided at a position overlapping one of those two transistor regions $R_{Tr}$ looking from the Z direction, while the remaining ones of the wirings CWL are provided within a range of a region provided at a position overlapping the other of those two transistor regions $R_{Tr}$ looking from the Z direction.

Due to this kind of configuration, it is possible for the number of wirings CWL aligned in the Y direction in the wiring layers D0-D2 to be reduced. For example, in the case where the number of wirings CWL corresponding to one finger structure FS is 128, and the position $X_{RowC}$ described with reference to FIG. 7 coincides with the center position in the X direction of the row control circuit region $R_{RowC}$ and center position in the X direction of the hookup region $R_{HU}$, it will result in the two transistor regions $R_{Tr}$ aligned in the X direction each being provided with 64 wirings CWL of these 128 wirings CWL. For this purpose, conceivably, 25 wirings CWL aligned in the Y direction will be provided in each of the wiring layers D0, D1, and 14 wirings CWL aligned in the Y direction will be provided in the wiring layer D2, for example.

Hence, due to the semiconductor memory device according to the first embodiment, it is possible for the conductive layers 110 and transistors $T_{BLK}$ to be suitably connected, even when the number of conductive layers 110 increases. Moreover, it is possible for width in the Y direction of the wiring CWL to be made larger to a certain extent, even when the number of conductive layers 110 increases. This makes it possible for wiring resistance between the word line WL, and so on, and transistor $T_{BLK}$ to be reduced.

Moreover, due to the semiconductor memory device according to the first embodiment, it is possible for longest length in the X direction of the wiring CWL to be reduced more compared to in the comparative example. This makes it possible for maximum value of wiring resistance between the word line WL, and so on, and transistor $T_{BLK}$ to be made smaller.

Moreover, in the semiconductor memory device according to the first embodiment, the row control circuit region $R_{RowC}$ is provided in both end portions in the X direction of the peripheral circuit region $R_{PC}$. In such a configuration, it is conceivable too that in the case of the center position in the X direction of the row control circuit region $R_{RowC}$ and center position in the X direction of the hookup region $R_{HU}$ having been matched or substantially matched, a region more to a negative side in the X direction than the 1$^{st}$ hookup region $R_{HU}$ counting from a negative side in the X direction, of a region overlapping the $1^{st}$ row control circuit region $R_{RowC}$ counting from a negative side in the X direction, of the memory cell array MCA, looking from the Z direction, will end up becoming dead space. Moreover, it is conceivable too that in the case of the center positions having been matched or substantially matched as described above, a region more to a positive side in the X direction than the $2^{nd}$ hookup region $R_{HU}$ counting from a negative side in the X direction, of a region overlapping the $2^{nd}$ row control circuit region $R_{RowC}$ counting from a negative side in the X direction, of the memory cell array MCA, looking from the Z direction, will end up becoming dead space. Accordingly, in the first embodiment, a memory region $R_{MH}$ of short length in the X direction is provided in these kinds of regions too. This makes it possible for dead space to be reduced, and for rise in level of integration of the semiconductor memory device to thereby be achieved.

Second Embodiment

In the semiconductor memory device according to the first embodiment, as shown in FIG. 5, the hookup regions $R_{HU}$ are provided in vicinities of end portions in the X direction, of the memory plane region $R_{MP}$. Moreover, as shown in FIG. 6, the row control circuit regions $R_{RowC}$ are provided in end portions in the X direction, of the peripheral circuit region $R_{PC}$.

However, this kind of configuration is merely an exemplification, and it is possible for specific configuration to be appropriately changed. For example, the hookup regions $R_{HU}$ may be provided in a vicinity of a center in the X direction, of the memory plane region $R_{MP}$. Moreover, the row control circuit regions $R_{RowC}$ may be provided at a center position in the X direction, of the peripheral circuit region $R_{PC}$.

Such a configuration will be exemplified below as a semiconductor memory device according to a second embodiment.

Figure 15:
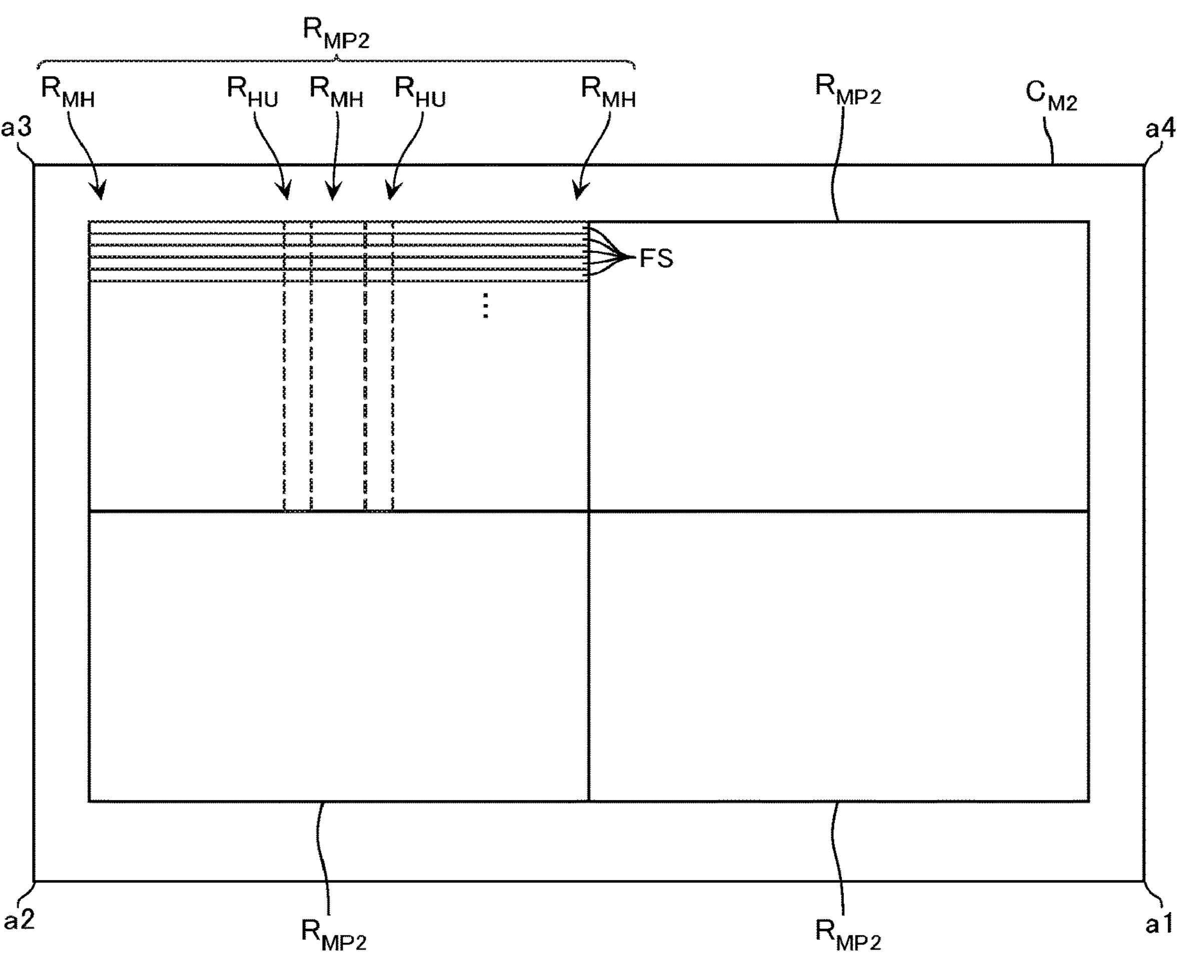
FIG. 15 is a schematic bottom view showing an example of configuration of a chip $C_{M2}$ according to a second embodiment.

The semiconductor memory device according to the second embodiment is basically configured similarly to the semiconductor memory device according to the first embodiment. However, the semiconductor memory device according to the second embodiment comprises a chip $C_{M2}$, instead of the chip $C_M$. FIG. 15 is a schematic bottom view showing an example of configuration of the chip $C_{M2}$. In FIG. 15, a part of configurations such as the bonding electrodes $P_{I1}$ are omitted.

The chip $C_{M2}$ is basically configured similarly to the chip $C_M$. However, the chip $C_{M2}$ comprises a memory plane region $R_{MP2}$, instead of the memory plane region $R_{MP}$. The memory plane region $R_{MP2}$ is basically configured similarly to the memory plane region $R_{MP}$. However, in the memory plane region $R_{MP2}$, lengths in the X direction of the of the $1^{st}$ and $3^{rd}$ memory regions $R_{MH}$ counting from a negative side in the X direction are longer than length in the X direction of the $2^{nd}$ memory region $R_{MH}$ counting from a negative side in the X direction.

Figure 16:
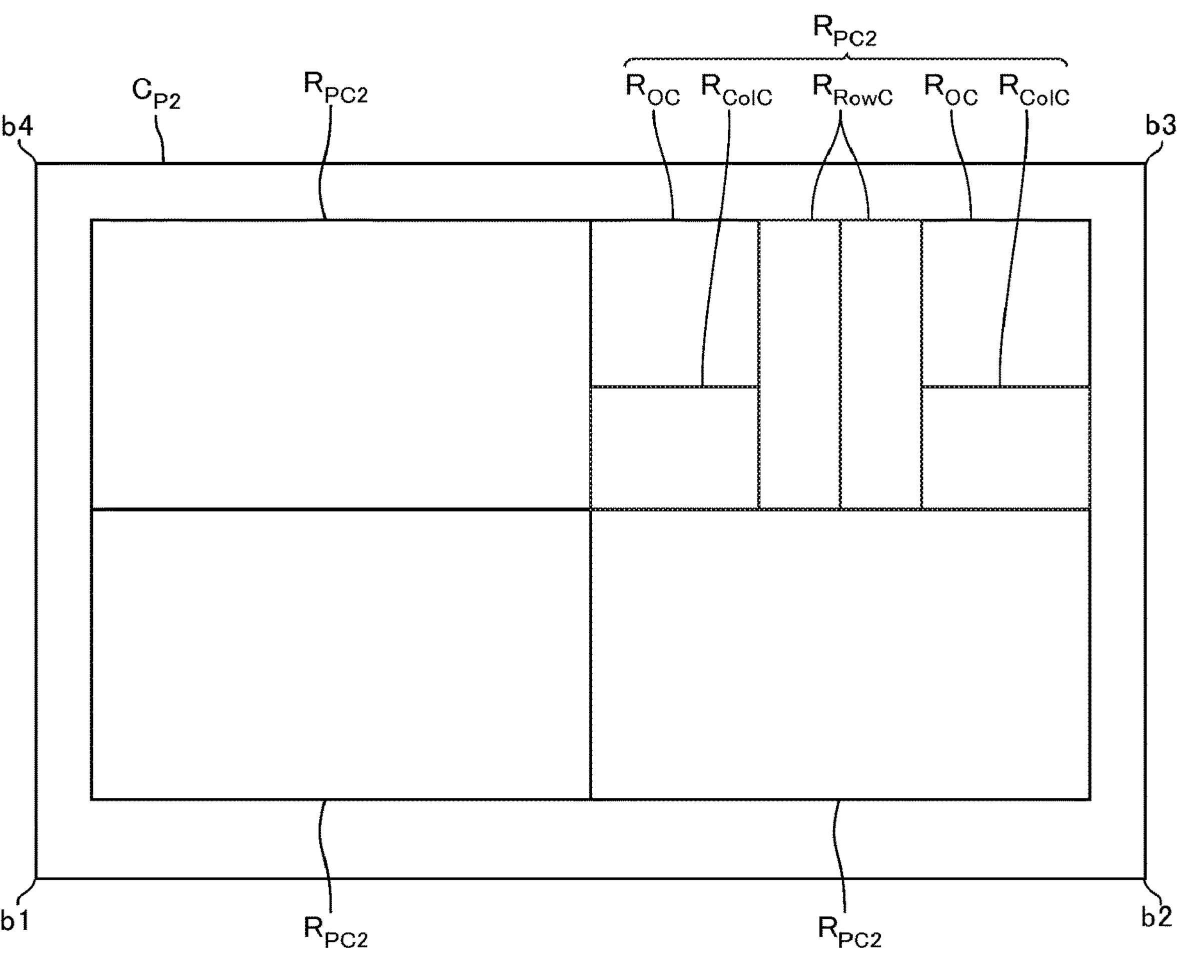
FIG. 16 is a schematic bottom view showing an example of configuration of a chip $C_{P2}$ according to the second embodiment.

Moreover, the semiconductor memory device according to the second embodiment comprises a chip $C_{P2}$, instead of the chip $C_P$. FIG. 16 is a schematic bottom view showing an example of configuration of the chip $C_{P2}$. In FIG. 16, a part of configurations such as the bonding electrodes $P_{I2}$ are omitted.

The chip $C_{P2}$ is basically configured similarly to the chip $C_P$. However, the chip $C_{P2}$ comprises a peripheral circuit region $R_{PC2}$, instead of the peripheral circuit region $R_{PC}$. The peripheral circuit region $R_{PC2}$ is basically configured similarly to the peripheral circuit region $R_{PC}$. However, at a center position in the X direction, of the peripheral circuit region $R_{PC2}$, there are provided two of the row control circuit regions $R_{RowC}$ aligned in the X direction. Moreover, a region on a positive side in the X direction and region on a negative side in the X direction with respect to these two row control circuit regions $R_{RowC}$ are each provided with the column control circuit region $R_{ColC}$ and circuit region $R_{OC}$ aligned in the Y direction.

Figure 17:
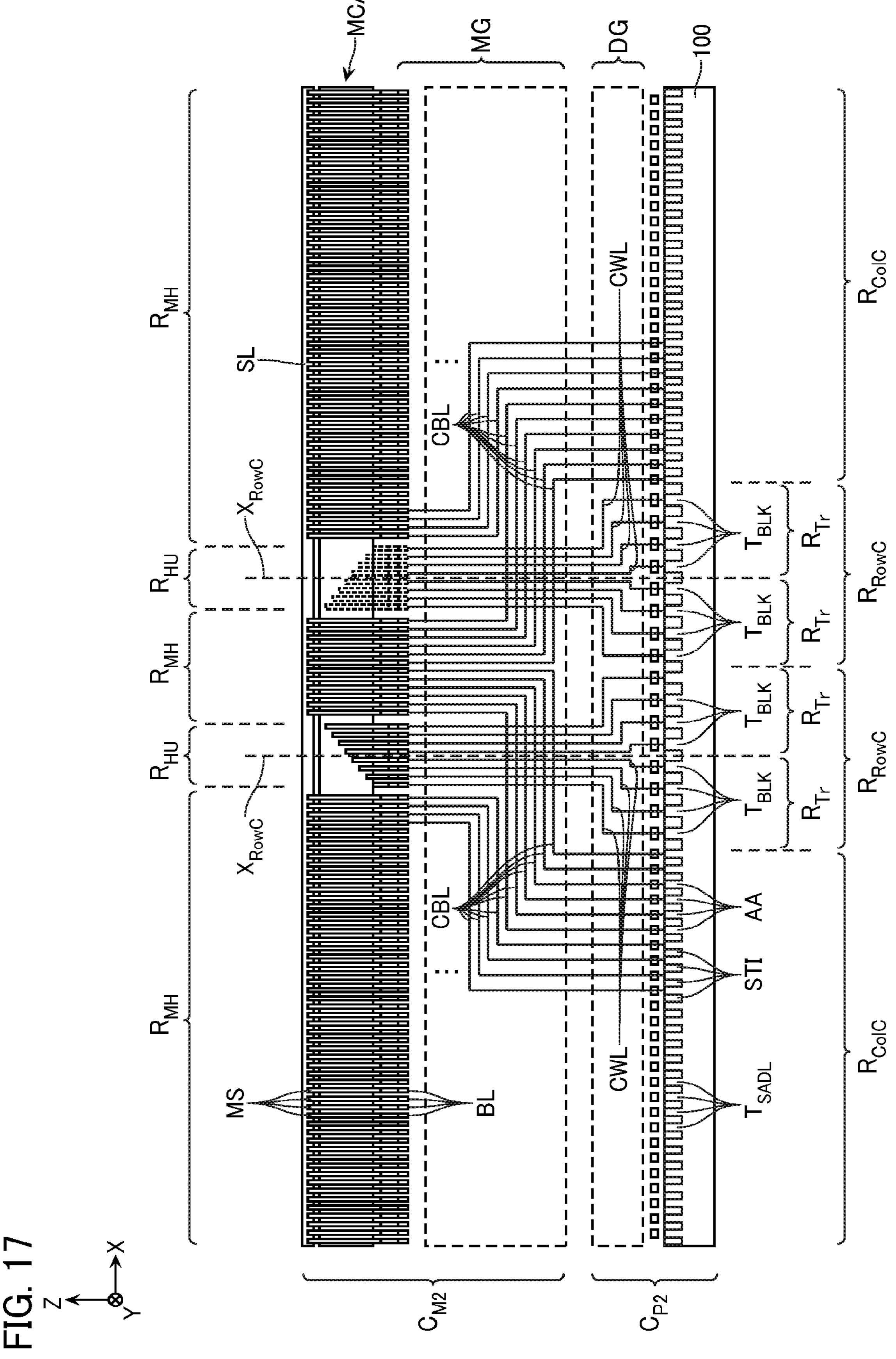
FIG. 17 is a schematic cross-sectional view showing a part of configurations of the chips $C_{M2}$, $C_{P2}$ according to the second embodiment.

FIG. 17 is a schematic cross-sectional view showing a part of configurations of the chips $C_{M2}$, $C_{P2}$.

The $1^{st}$ column control circuit region $R_{ColC}$ counting from a negative side in the X direction is provided at a position overlapping a part (a region excluding a region in a vicinity of an end portion on a positive side in the X direction) of the $1^{st}$ memory region $R_{MH}$ counting from a negative side in the X direction, looking from the Z direction.

The $1^{st}$ transistor region $R_{Tr}$ counting from a negative side in the X direction is provided at a position overlapping a part (the region in a vicinity of the end portion on a positive side in the X direction) of the $1^{st}$ memory region $R_{MH}$ counting from a negative side in the X direction, looking from the Z direction. Moreover, this transistor region $R_{Tr}$ is provided at a position overlapping a part (a region more to a negative side in the X direction than the position $X_{RowC}$) of the $1^{st}$ hookup region $R_{HU}$ counting from a negative side in the X direction, looking from the Z direction.

The $2^{nd}$ transistor region $R_{Tr}$ counting from a negative side in the X direction is provided at a position overlapping a part (a region more to a positive side in the X direction than the position $X_{RowC}$) of the $1^{st}$ hookup region $R_{HU}$ counting from a negative side in the X direction, looking from the Z direction. Moreover, this transistor region $R_{Tr}$ is provided at a position overlapping a part (a region more to a negative side in the X direction than a center position in the X direction) of the $2^{nd}$ memory region $R_{MH}$ counting from a negative side in the X direction, looking from the Z direction.

The $3^{rd}$ transistor region $R_{Tr}$ counting from a negative side in the X direction is provided at a position overlapping a part (a region more to a positive side in the X direction than the center position in the X direction) of the $2^{nd}$ memory region $R_{MH}$ counting from a negative side in the X direction, looking from the Z direction. Moreover, this transistor region $R_{Tr}$ is provided at a position overlapping a part (a region more to a negative side in the X direction than the position $X_{RowC}$) of the $2^{nd}$ hookup region $R_{HU}$ counting from a negative side in the X direction, looking from the Z direction.

The $4^{th}$ transistor region $R_{Tr}$ counting from a negative side in the X direction is provided at a position overlapping a part (a region more to a positive side in the X direction than the position $X_{RowC}$) of the $2^{nd}$ hookup region $R_{HU}$ counting from a negative side in the X direction, looking from the Z direction. Moreover, this transistor region $R_{Tr}$ is provided at a position overlapping a part (a region in a vicinity of an end portion on a negative side in the X direction) of the $3^{rd}$ memory region $R_{MH}$ counting from a negative side in the X direction, looking from the Z direction.

The $2^{nd}$ column control circuit region $R_{ColC}$ counting from a negative side in the X direction is provided at a position overlapping a part (a region excluding the region in a vicinity of the end portion on a negative side in the X direction) of the $3^{rd}$ memory region $R_{MH}$ counting from a negative side in the X direction, looking from the Z direction.

The semiconductor memory device according to the second embodiment enables similar advantages to those of the semiconductor memory device according to the first embodiment to be displayed.

Moreover, in the semiconductor memory device according to the second embodiment, the hookup region $R_{HU}$ is provided in a vicinity of a center in the X direction, of the memory plane region $R_{MP2}$. In this kind of configuration, it is possible for maximum value of distance between the via contact electrode CC and the semiconductor column 120 to be reduced by about half, compared to in the semiconductor memory device according to the first embodiment. This makes it possible for wiring resistance in the conductive layer 110 to be reduced, and for speeding-up of operation to thereby be achieved.

Third Embodiment

In the first embodiment and the second embodiment, the row control circuit region $R_{RowC}$ is divided into two transistor regions $R_{Tr}$ aligned in the X direction, and a part of the wirings CWL are provided within a range of a region provided at a position overlapping one of those two transistor regions $R_{Tr}$ looking from the Z direction, while the remaining ones of the wirings CWL are provided within a range of a region provided at a position overlapping the other of those two transistor regions $R_{Tr}$ looking from the Z direction. This makes it possible for the number of wirings CWL aligned in the Y direction in the wiring layers D0-D2 to be reduced, and for rise in level of integration of the semiconductor memory device to thereby be achieved.

Now, it is possible too for the transistor regions $R_{Tr}$ aligned in the X direction in the row control circuit region $R_{RowC}$ to be further divided in the X direction, and for the wirings CWL to be provided within a range of a region provided at a position overlapping any of these divided regions looking from the Z direction, for example. This makes it possible for the number of wirings CWL aligned in the Y direction in the wiring layers DO-D2 to be further reduced.

Such a configuration will be exemplified below as a semiconductor memory device according to a third embodiment.

The semiconductor memory device according to the third embodiment is basically configured similarly to the semiconductor memory device according to the second embodiment. However, the semiconductor memory device according to the third embodiment comprises a chip $C_{M3}$ and a chip $C_{P3}$, instead of the chip $C_{M2}$ and the chip $C_{P2}$.

Figure 18:
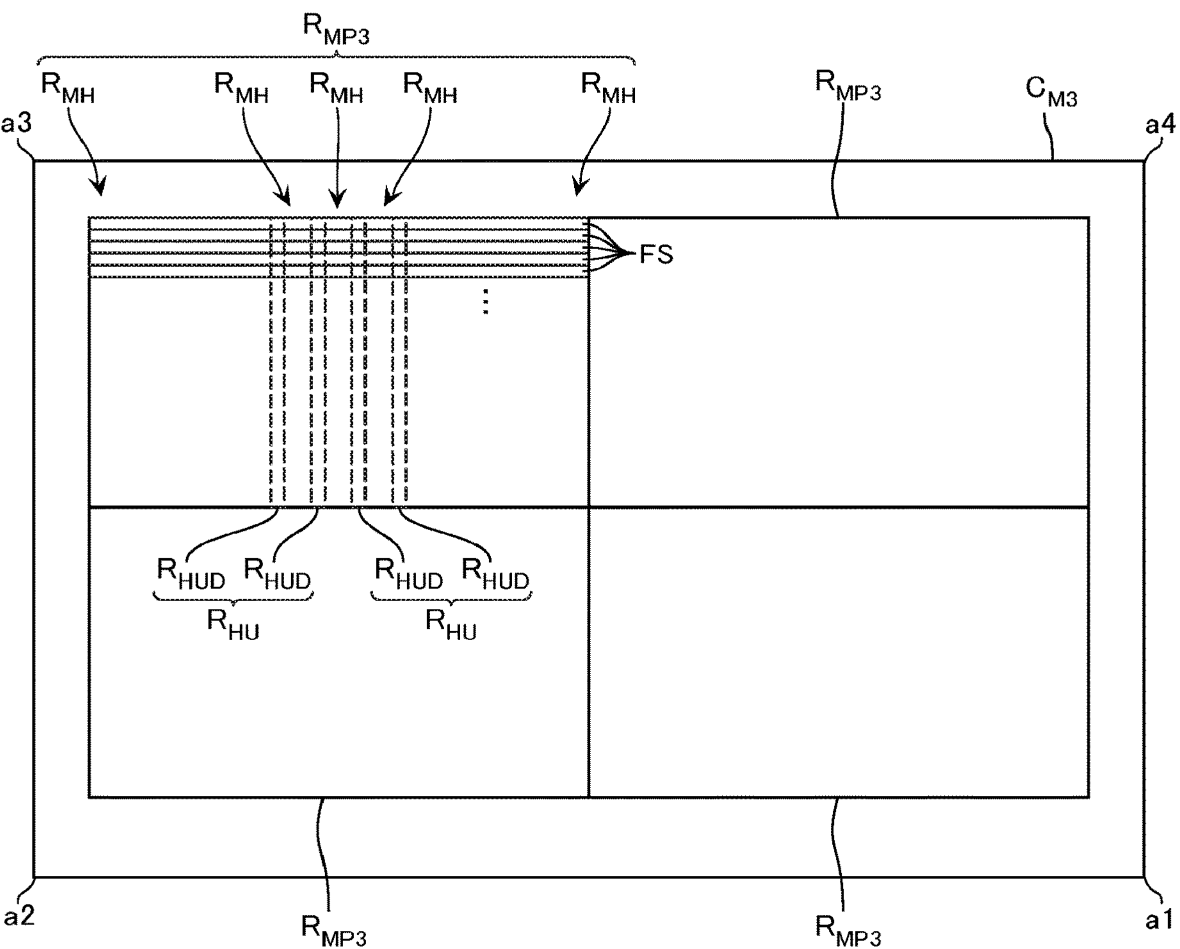
FIG. 18 is a schematic bottom view showing an example of configuration of a chip $C_{M3}$ according to a third embodiment.
Figure 19:
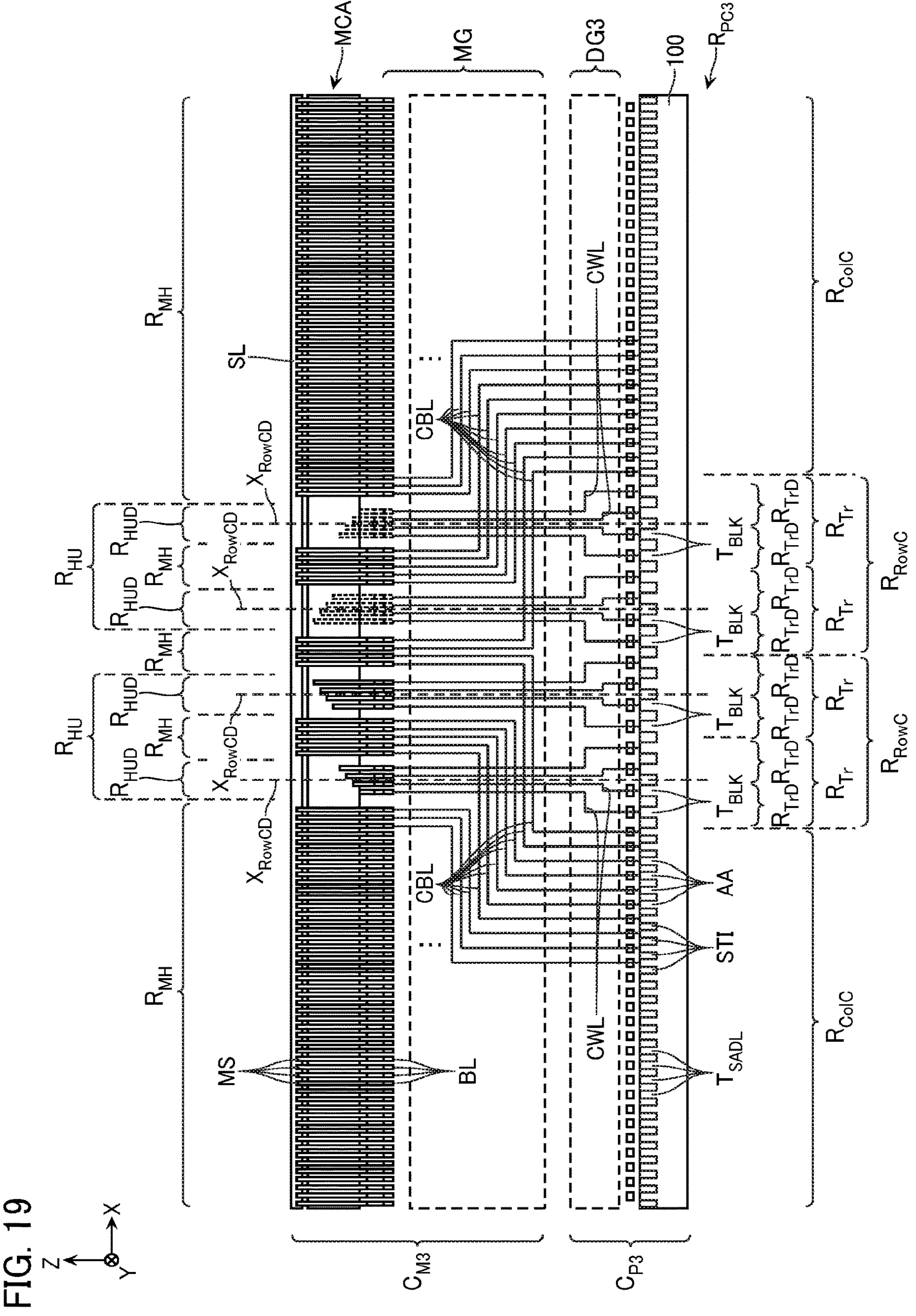
FIG. 19 is a schematic cross-sectional view showing a part of configurations of the chip $C_{M3}$ and a chip $C_{P3}$ according to the third embodiment.

FIG. 18 is a schematic bottom view showing an example of configuration of the chip $C_{M3}$. In FIG. 18, a part of configurations such as the bonding electrodes P u are omitted. FIG. 19 is a schematic cross-sectional view showing a part of configurations of the chips $C_{M3}$, $C_{P3}$.

The chip $C_{M3}$ is basically configured similarly to the chip $C_{M2}$. However, in the chip $C_{M3}$, the hookup region $R_{HU}$ is divided into two divided hookup regions $R_{HUD}$ separated in the X direction. Moreover, the memory region $R_{MH}$ is provided between two of the divided hookup regions $R_{HUD}$ adjacent in the X direction.

The divided hookup region $R_{HUD}$ is basically configured similarly to the hookup region $R_{HU}$. However, the hookup region $R_{HU}$ comprises all of the via contact electrodes CC(WL). On the other hand, the divided hookup region $R_{HUD}$ comprises only a part of the via contact electrodes CC(WL). That is, in the case of the hookup region $R_{HU}$ being divided into n (where n is an integer of 2 or more) in the X direction, the via contact electrodes CC(WL) will be disposed dispersed among n of the divided hookup regions $R_{HUD}$.

For example, in the example of FIG. 19, in the $1^{st}$ hookup region $R_{HU}$ counting from a negative side in the X direction, there are disposed the plurality of via contact electrodes CC(WL) corresponding to a certain finger structure FS. Now, in the $1^{st}$ divided hookup region $R_{HUD}$ counting from a negative side in the X direction, there are disposed the via contact electrodes CC(WL) corresponding to the conductive layers 110 provided below a certain position. Moreover, in the $2^{nd}$ divided hookup region $R_{HUD}$ counting from a negative side in the X direction, there are disposed the via contact electrodes CC(WL) corresponding to the conductive layers 110 provided above the certain position.

Moreover, in the example of FIG. 19, in the $2^{nd}$ hookup region $R_{HU}$ counting from a negative side in the X direction, there are disposed the plurality of via contact electrodes CC(WL) corresponding to another finger structure FS. Now, in the $3^{rd}$ divided hookup region $R_{HUD}$ counting from a negative side in the X direction, there are disposed the via contact electrodes CC(WL) corresponding to the conductive layers 110 provided above a certain position. Moreover, in the $4^{th}$ divided hookup region $R_{HUD}$ counting from a negative side in the X direction, there are disposed the via contact electrodes CC(WL) corresponding to the conductive layers 110 provided below the certain position.

The chip $C_{P3}$ is basically configured similarly to the chip $C_{P2}$. However, the chip $C_{P3}$ comprises a peripheral circuit region $R_{PC3}$, instead of the peripheral circuit region $R_{PC2}$. Moreover, the chip $C_{P3}$ comprises a wiring layer group DG3, instead of the wiring layer group DG.

The peripheral circuit region $R_{PC3}$ is basically configured similarly to the peripheral circuit region $R_{PC2}$. However, in the peripheral circuit region $R_{PC3}$, the transistor region $R_{Tr}$ is divided into two divided transistor regions $R_{TrD}$ separated in the X direction.

In FIG. 19, a position in a vicinity of a center in the X direction of the transistor region $R_{Tr}$ is indicated as position $X_{RowCD}$. The position $X_{RowCD}$ may coincide with a center position in the X direction of the transistor region $R_{Tr}$, but need not do so. Moreover, the position $X_{RowCD}$ may coincide with a center position in the X direction of the divided hookup region $R_{HUD}$, but need not do so. Moreover, a region provided more to a positive side in the X direction than the position $X_{RowCD}$, in the transistor region $R_{Tr}$ and region provided more to a negative side in the X direction than the position $X_{RowCD}$, in the transistor region $R_{Tr}$ are each indicated as the divided transistor region $R_{TrD}$.

The divided transistor regions $R_{TrD}$ are each provided at a position overlapping a part (a region on a positive side or negative side in the X direction with respect to the position $X_{RowCD}$) of some one of the divided hookup regions $R_{HUD}$, looking from the Z direction. Moreover, the divided transistor regions $R_{TrD}$ are each provided at a position overlapping a part of some one of the memory regions $R_{MH}$, looking from the Z direction.

The wiring layer group DG3 is basically configured similarly to the wiring layer group DG. However, in the wiring layer group DG3, the plurality of wirings CWL are provided within a range of a region provided at a position overlapping any of the divided transistor regions $R_{TrD}$, looking from the Z direction.

The semiconductor memory device according to the third embodiment enables similar advantages to those of the semiconductor memory device according to the second embodiment to be displayed.

Moreover, due to the semiconductor memory device according to the third embodiment, it is possible for the number of wirings CWL aligned in the Y direction in the wiring layers D0-D2 to be further reduced. Moreover, it is possible for maximum value of wiring resistance between the word line WL, or the like, and transistor $T_{BLK}$ to be made even smaller.

Fourth Embodiment

A semiconductor memory device according to a fourth embodiment is basically configured similarly to the semiconductor memory device according to the third embodiment. However, the semiconductor memory device according to the fourth embodiment comprises a chip $C_{M4}$ and a chip $C_{P4}$, instead of the chip $C_{M3}$ and the chip $C_{P3}$.

Figure 20:
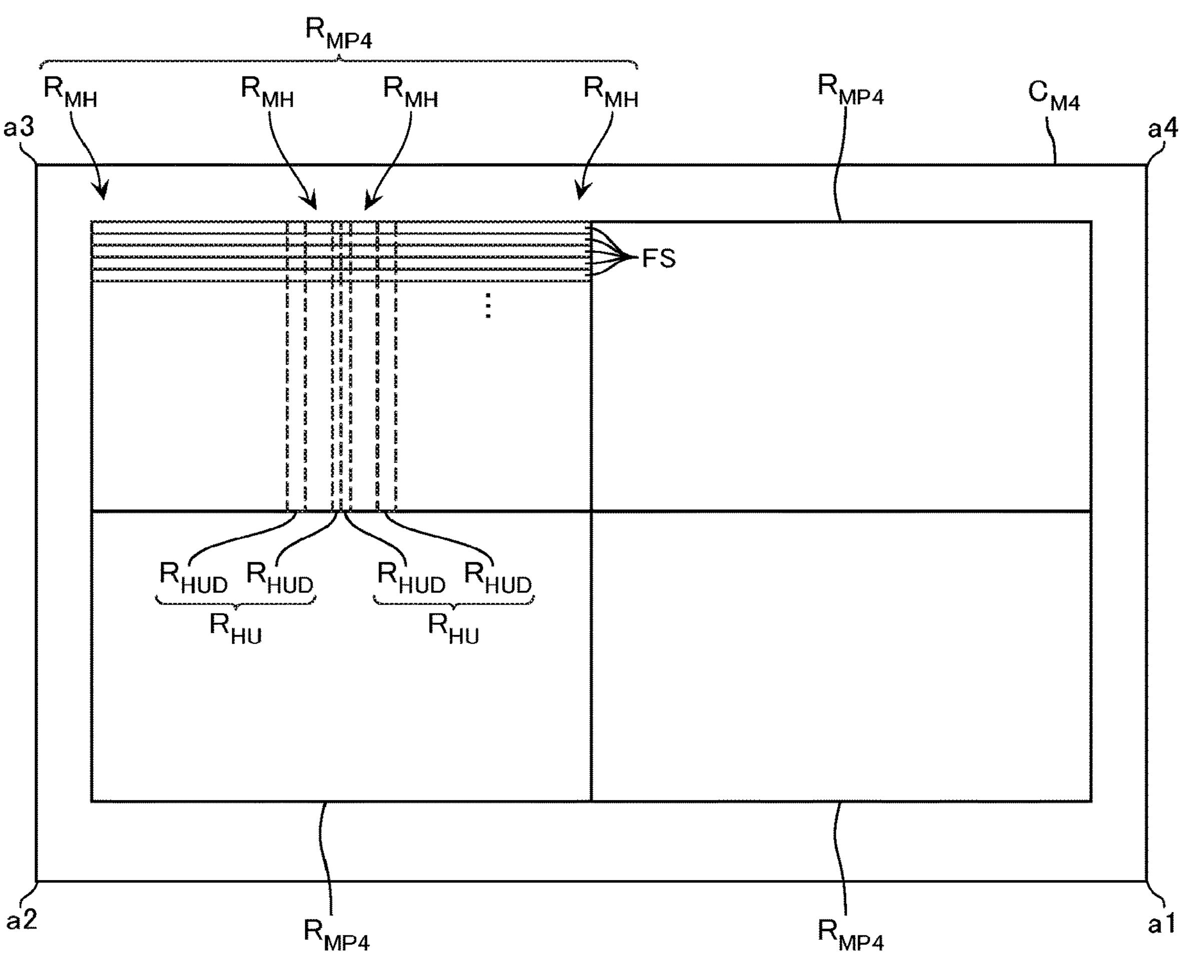
FIG. 20 is a schematic bottom view showing an example of configuration of a chip $C_{M4}$ according to a fourth embodiment.
Figure 21:
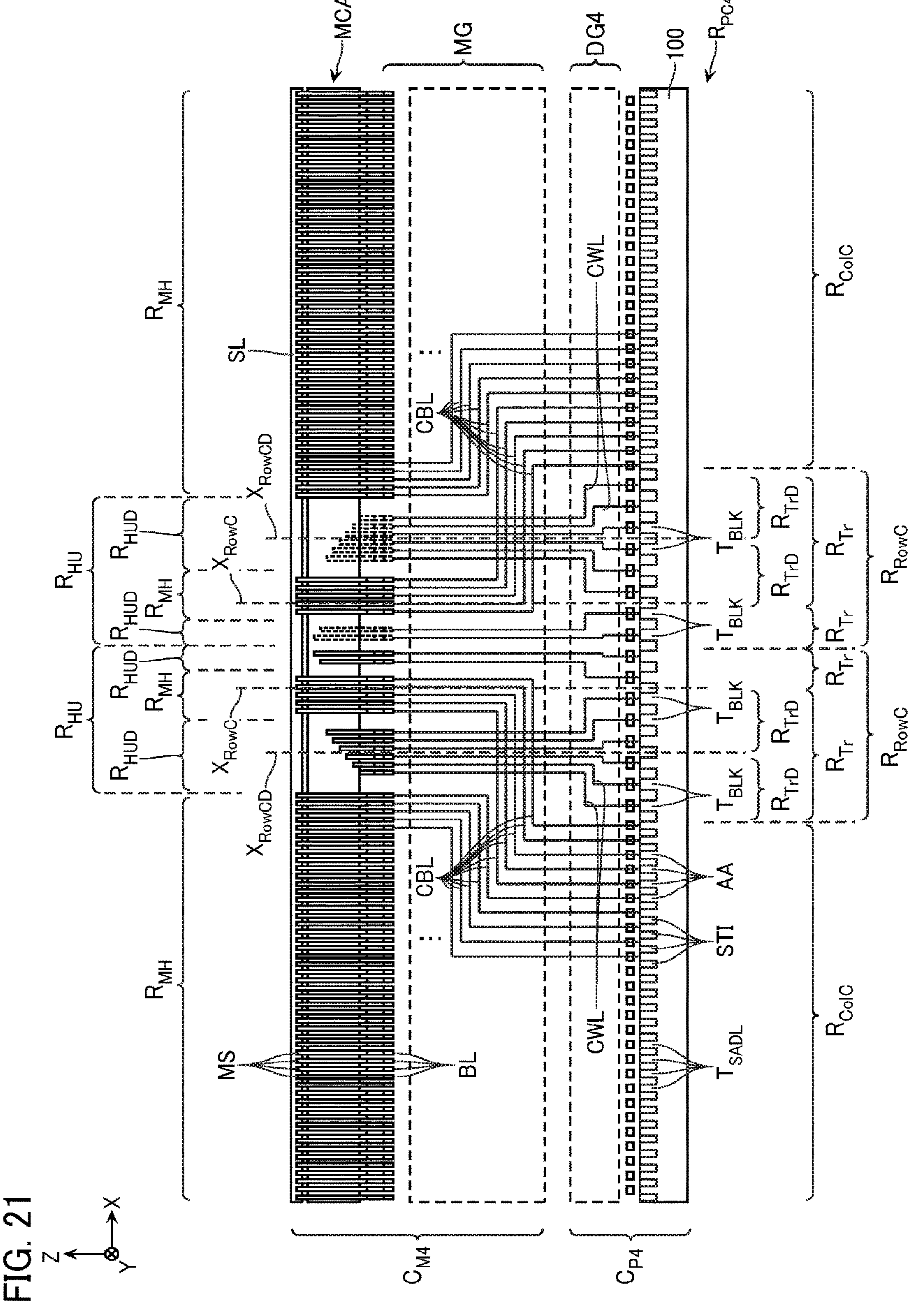
FIG. 21 is a schematic cross-sectional view showing a part of configurations of the chip $C_{M4}$ and a chip $C_{P4}$ according to the fourth embodiment.

FIG. 20 is a schematic bottom view showing an example of configuration of the chip $C_{M4}$. In FIG. 20, a part of configurations such as the bonding electrodes $P_{I1}$ are omitted. FIG. 21 is a schematic cross-sectional view showing a part of configurations of the chips $C_{M4}$, $C_{P4}$.

The chip $C_{M4}$ is basically configured similarly to the chip $C_{M3}$. However, in the chip $C_{M4}$, the memory region $R_{MH}$ is not provided between two of the hookup regions $R_{HU}$ aligned in the X direction.

The chip $C_{P4}$ is basically configured similarly to the chip $C_{P3}$. However, as shown in FIG. 21, the chip $C_{P4}$ comprises a peripheral circuit region $R_{PC4}$, instead of the peripheral circuit region $R_{PC3}$. Moreover, the chip $C_{P4}$ comprises a wiring layer group DG4, instead of the wiring layer group DG3.

The peripheral circuit region $R_{PC4}$ is basically configured similarly to the peripheral circuit region $R_{PC3}$. However, in the peripheral circuit region $R_{PC4}$, the one provided on a side of a center position in the X direction of the peripheral circuit region $R_{PC4}$, of two transistor regions $R_{Tr}$, is not divided into two divided transistor regions $R_{TrD}$. Moreover, the transistor region $R_{Tr}$ provided on the side of the center position in the X direction of the peripheral circuit region $R_{PC4}$, and the two divided transistor regions $R_{TrD}$ each include about the same number of transistors $T_{BLK}$.

The wiring layer group DG4 is basically configured similarly to the wiring layer group DG3. However, in the wiring layer group DG4, a part of the wirings CWL are provided within a range of a region provided at a position overlapping the transistor region $R_{Tr}$ provided on the side of the center position in the X direction of the peripheral circuit region $R_{PC4}$, looking from the Z direction.

The semiconductor memory device according to the fourth embodiment enables similar advantages to those of the semiconductor memory device according to the third embodiment to be displayed.

Fifth Embodiment

In the semiconductor memory device according to the first embodiment, as has been described with reference to FIG. 12, the outer peripheral surface of the via contact electrode CC(WL) faces via the insulating film CCSW the inner peripheral surface of a through-hole provided in the conductive layers 110. Part of a method of manufacturing such a structure will be described below with reference to FIGS. 22-25. FIGS. 22-25 are schematic cross-sectional views for explaining part of a method of manufacturing the via contact electrode CC(WL).

Figure 22:
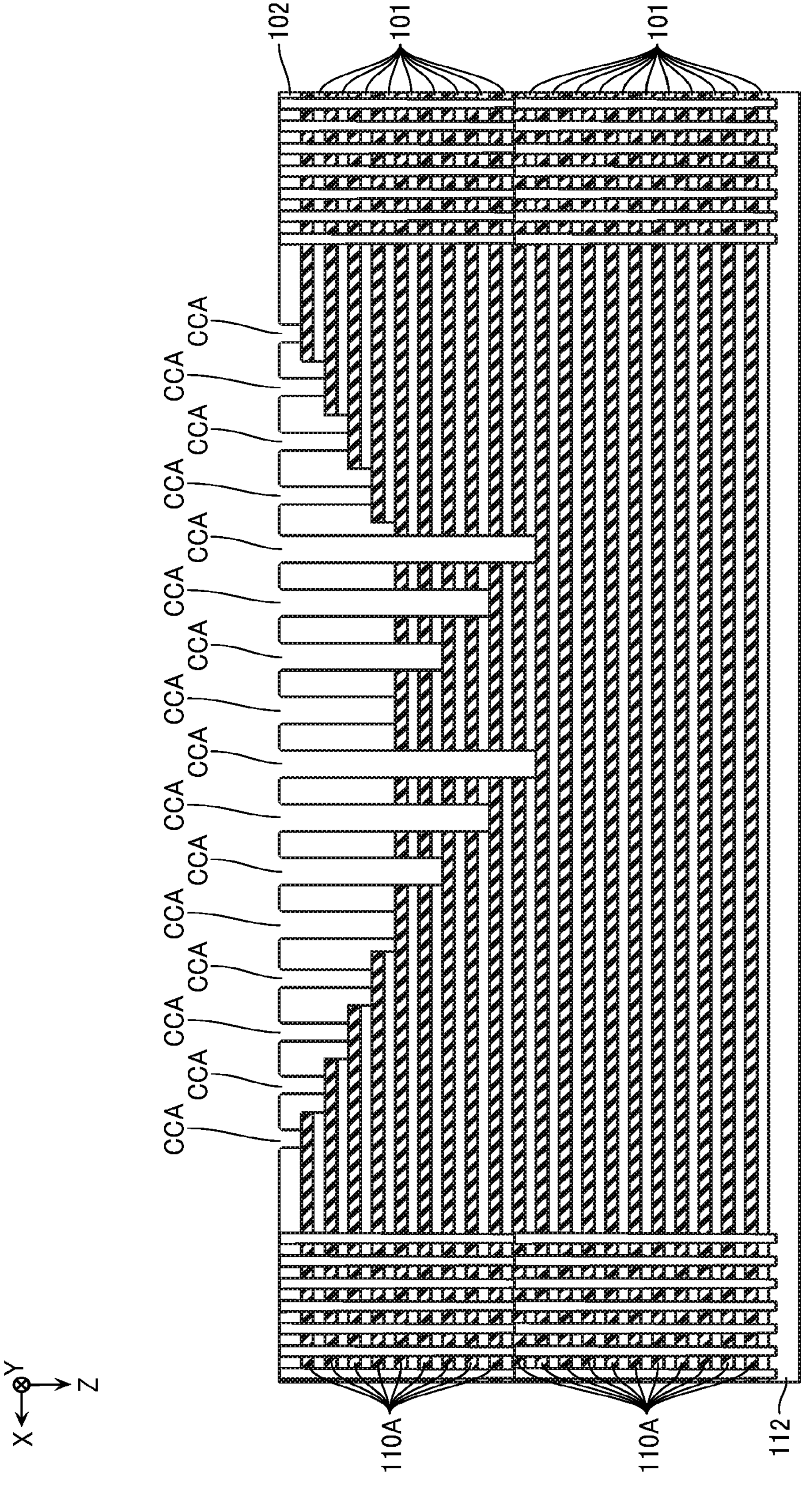
FIG. 22 is a schematic cross-sectional view for explaining part of a method of manufacturing a via contact electrode CC(WL).

As shown in FIG. 22, during manufacture of the via contact electrode CC(WL), a sacrifice layer 110A of the likes of silicon nitride (SiN) may be formed at a position corresponding to the conductive layer 110. During manufacture of the via contact electrode CC(WL), a contact hole CCA is formed at each of a plurality of positions corresponding to a plurality of the via contact electrodes CC(WL). The contact holes CCA extend in the Z direction and penetrate a plurality of the sacrifice layers 110A, and so on, to each expose a surface of a certain one of the sacrifice layers 110A.

Figure 23:
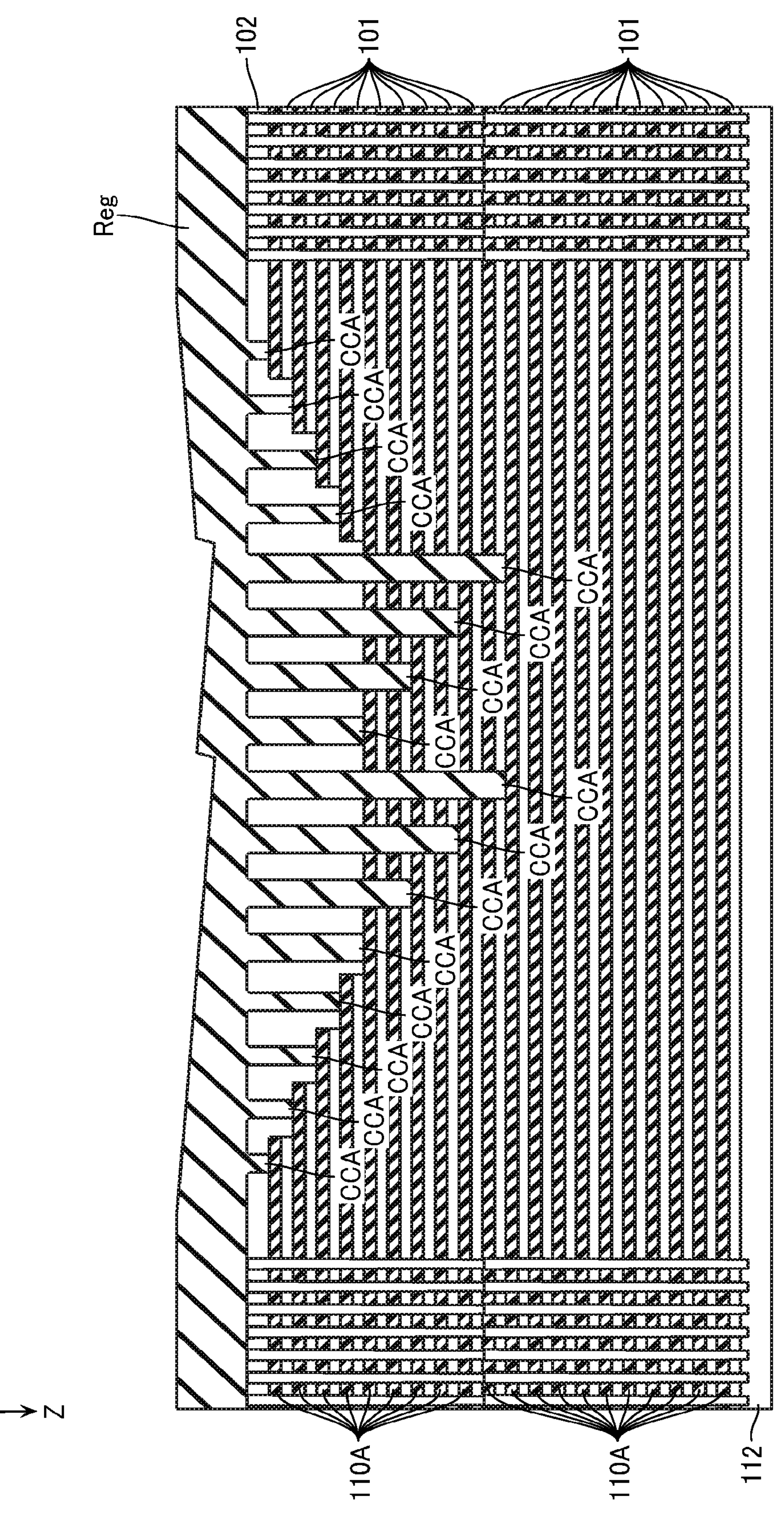
FIG. 23 is a schematic cross-sectional view for explaining part of same method.

Next, as shown in FIG. 23, a surface of the structure shown in FIG. 22 is coated with a resist Reg.

Figure 24:
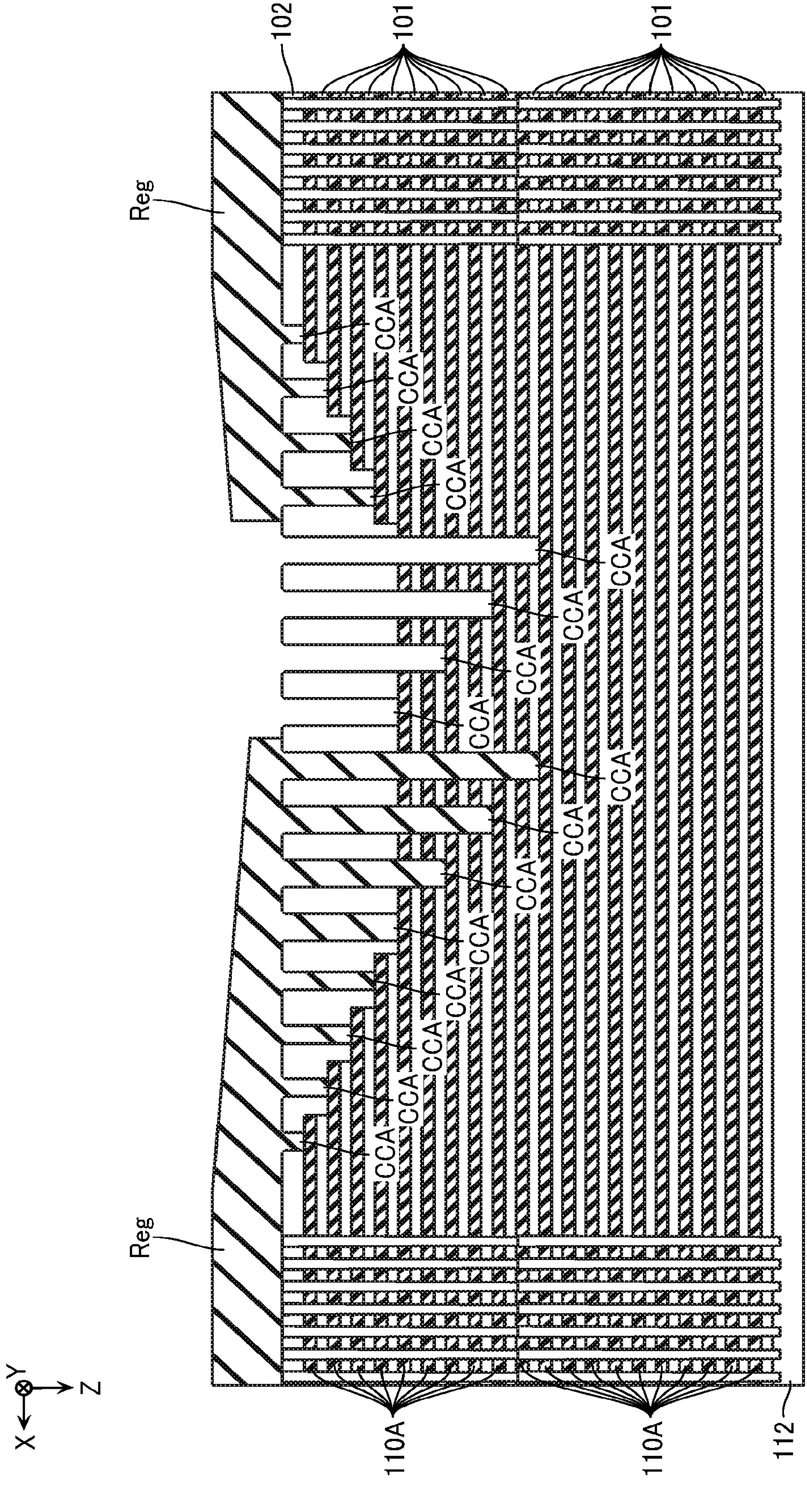
FIG. 24 is a schematic cross-sectional view for explaining part of same method.

Next, as shown in FIG. 24, part of the resist Reg is removed to expose a part of the contact holes CCA.

Figure 25:
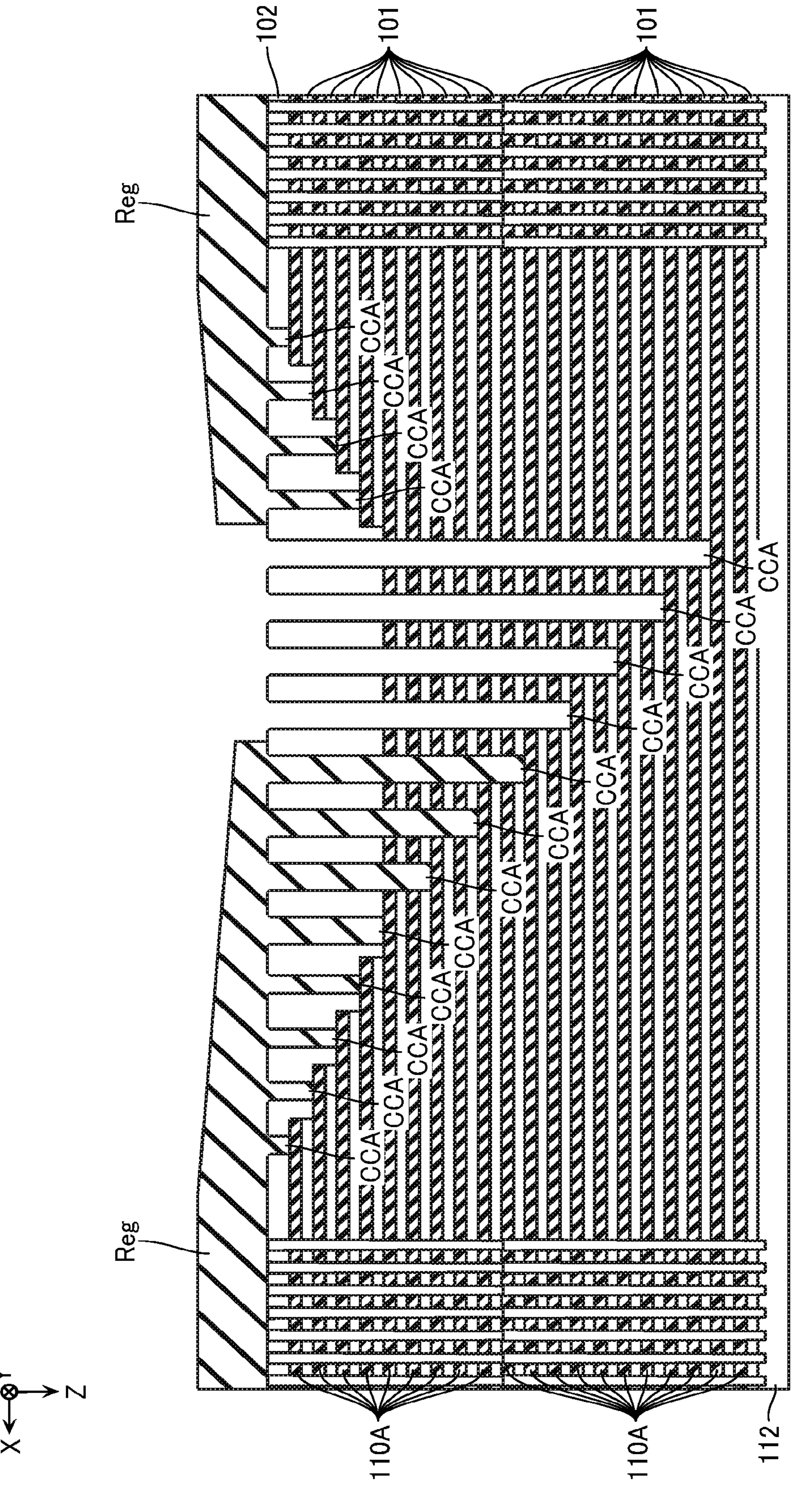
FIG. 25 is a schematic cross-sectional view for explaining part of same method.

Next, as shown in FIG. 25, bottom surfaces of the exposed a part of the contact holes CCA have removed therefrom precisely a certain number of the sacrifice layers 110A and inter-layer insulating layers 101. For example, in the example of FIG. 25, eight layers each of the sacrifice layers 110A and inter-layer insulating layers 101 are removed. This step is executed by anisotropic etching such as RIE (Reactive Ion Etching), for example. Moreover, in this step, there are alternately executed a certain number of times each (in FIG. 25, eight times each): a step in which the sacrifice layer 110A is selectively removed; and a step in which the inter-layer insulating layer 101 is selectively removed.

In the case of the via contact electrode CC(WL) being formed by this kind of method, part of the resist Reg that has been coated during the coating with resist Reg described with reference to FIG. 23, is drawn into the contact hole CCA. Now, in a region where a deep contact hole CCA is formed, an amount of the resist Reg drawn in (hereafter, called "drawn-in amount") becomes comparatively large. On the other hand, in a region where a shallow contact hole CCA is formed, the drawn-in amount becomes comparatively small. As a result, film thickness of the resist Reg sometimes ends up becoming ununiform in the hookup region $R_{HU}$.

If film thickness of the resist Reg ends up becoming ununiform in the hookup region $R_{HU}$, then optimum focus of a lithography device ends up deviating between a place where film thickness of the resist Reg is thick and a place where it is thin. Hence, a margin in process of lithography with respect to focus deviation of the lithography device lowers. As a result, there is a risk that the contact hole CCA will become unopened or that uniformity of dimensions of the contact hole CCA will fall. Moreover, there is a possibility that in some regions, film thickness of the resist Reg will be insufficient. In particular, the larger the number of layers of sacrifice layers 110A becomes, the deeper the contact hole CCA will become, and the easier for there to occur an insufficiency of film thickness of the resist Reg it will become.

Figure 26:
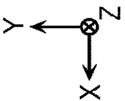
FIG. 26 is a schematic bottom view for explaining part of a method of manufacturing a semiconductor memory device according to a fifth embodiment.

Accordingly, in a fifth embodiment, as shown in FIG. 26, in regions corresponding to each of the finger structures FS, the word line hookup region $R_{HUWL}$ which is not to be provided with the via contact electrode CC(WL) has formed therein a dummy contact hole DCCA.

In FIG. 26, a region corresponding to one finger structure FS and one word line hookup region $R_{HUWL}$ is divided into two regions $R_A$, $R_B$ in the X direction. These regions $R_A$, $R_B$ each have formed therein the contact hole CCA. Moreover, in FIG. 26, a region corresponding to the finger structure FS adjacent in the Y direction to this one finger structure FS, and one word line hookup region $R_{HUWL}$, is divided into two regions $R_C$, $R_D$ in the X direction. These regions $R_C$, $R_D$ each have formed therein the dummy contact hole DCCA.

Figure 27:
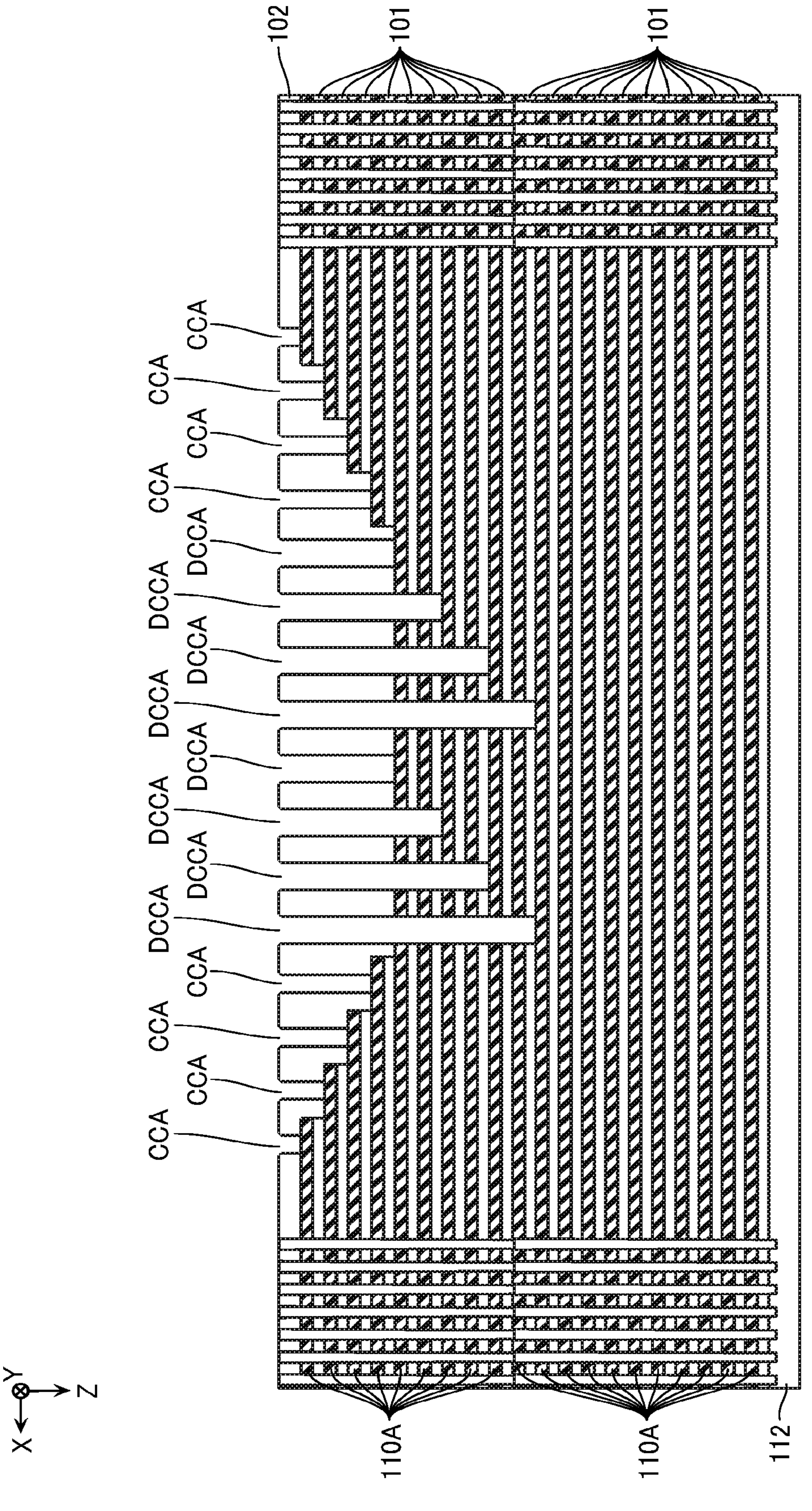
FIG. 27 is a schematic cross-sectional view for explaining part of same method.

Now, the dummy contact holes DCCA each have a such a depth as will ease variation in depths of the contact holes CCA. For example, in the case where in the regions $R_A$, $R_B$, as in FIG. 22, the more to a negative side in the X direction a certain contact hole CCA is provided, the deeper it will be, and the more to a positive side in the X direction a certain contact hole CCA is provided, the shallower it will be, it is conceivable that, as shown in FIG. 27, in the regions $R_C$, $R_D$, there be formed a structure of the kind whereby the more to a positive side in the X direction a certain dummy contact hole DCCA is provided, the deeper it will be, and the more to a negative side in the X direction a certain dummy contact hole DCCA is provided, the shallower it will be. This makes it possible for uniformity of film thickness of the resist Reg coated in the step described with reference to FIG. 23 to be improved.

Figure 28:
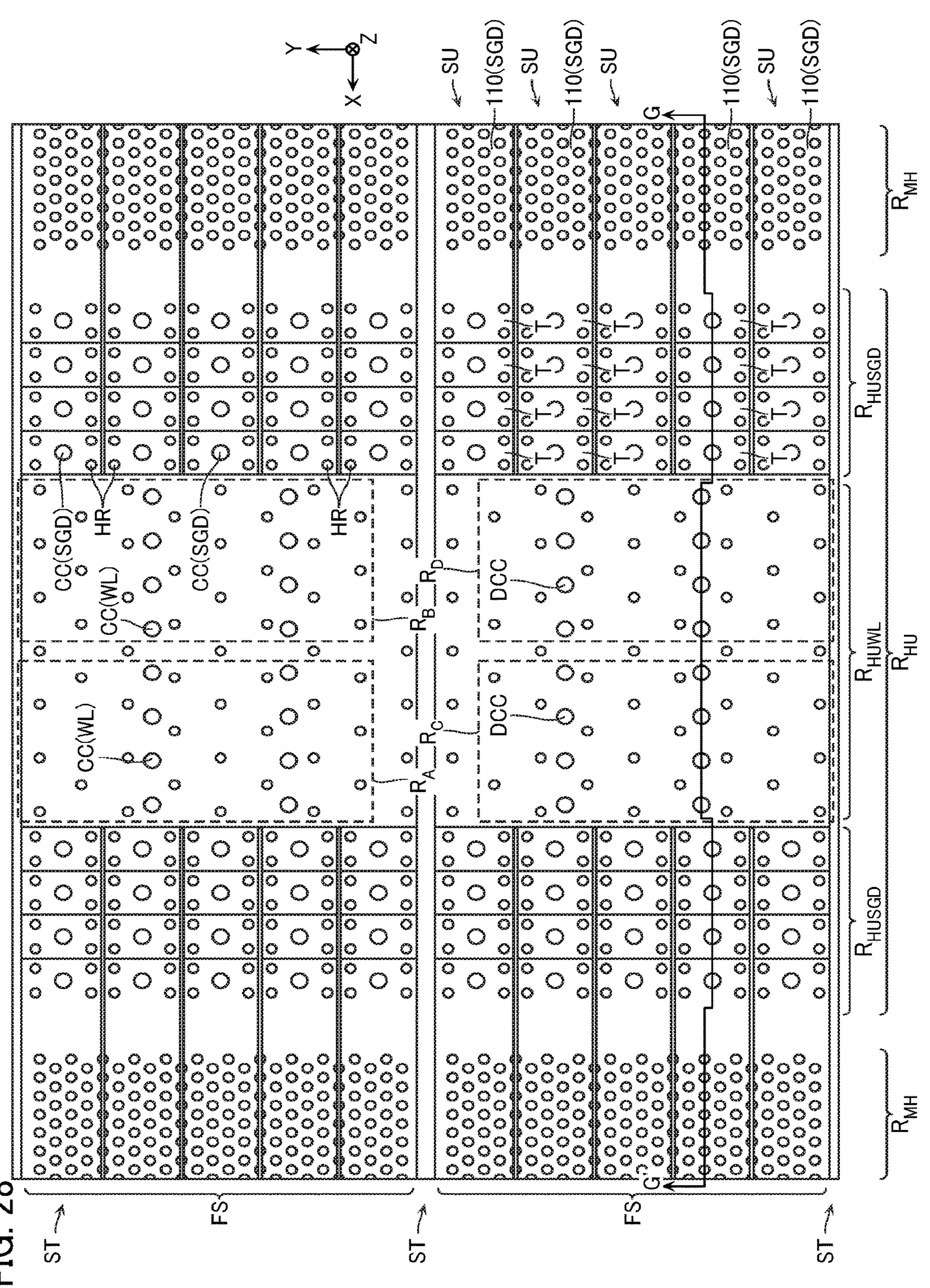
FIG. 28 is a schematic bottom view showing a part of configurations of the semiconductor memory device according to the fifth embodiment.
Figure 29:
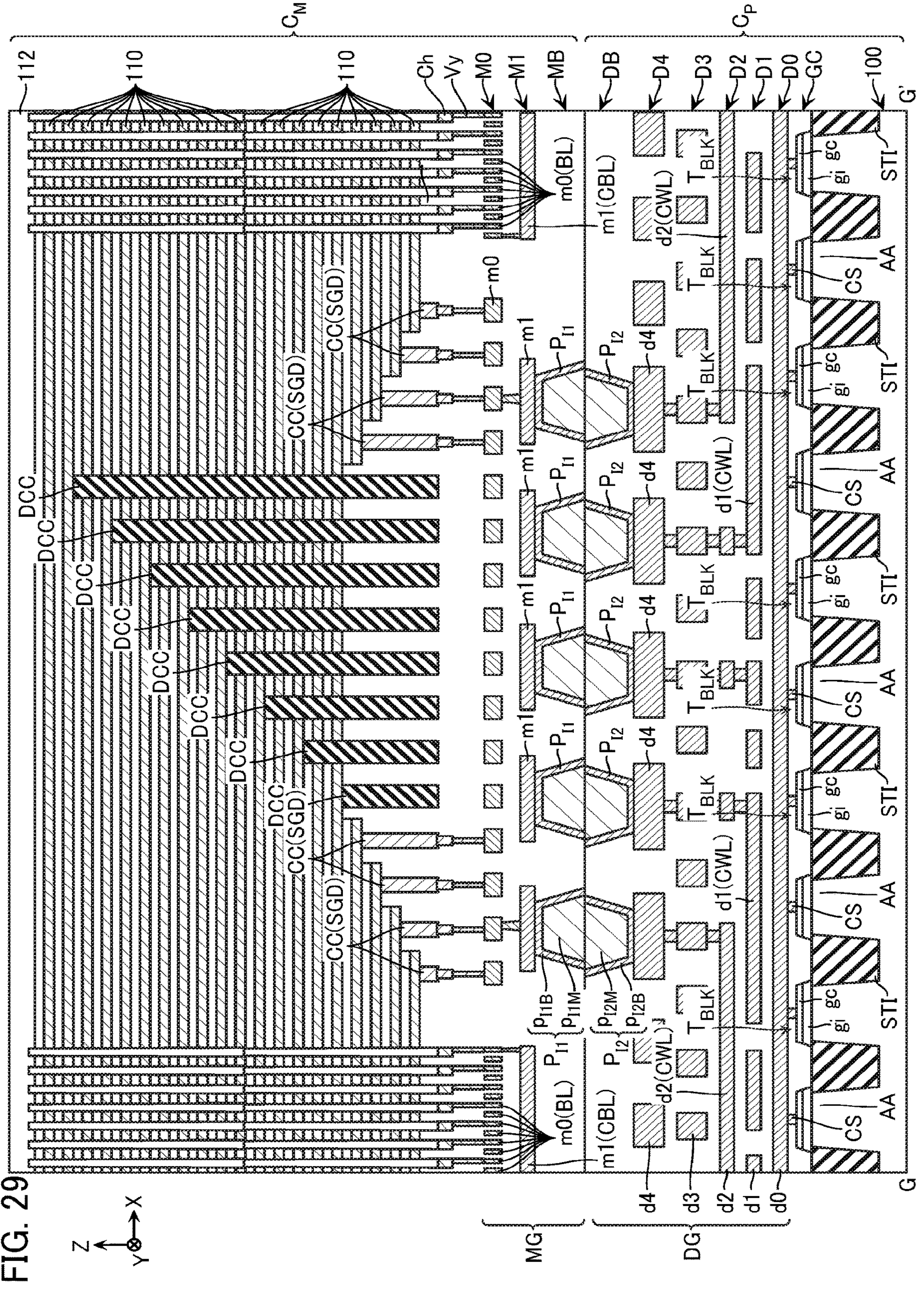
FIG. 29 is a schematic cross-sectional view in which the structure shown in FIG. 28 has been cut along the line G-G' and viewed along a direction of the arrows.

FIG. 28 is a schematic bottom view showing a part of configurations of a semiconductor memory device according to the fifth embodiment. FIG. 29 is a schematic cross-sectional view in which the structure shown in FIG. 28 has been cut along the line G-G' and viewed along a direction of the arrows.

The semiconductor memory device according to the fifth embodiment is basically configured similarly to the semiconductor memory device according to the first embodiment. However, the semiconductor memory device according to the fifth embodiment comprises a dummy contact DCC (columnar body such as insulator column). The dummy contact DCC is an insulating member provided in the dummy contact hole DCCA, and includes silicon oxide ($SiO_2$), for example.

As shown in FIG. 5, the memory plane region $R_{MP}$ according to the fifth embodiment is provided with two of the hookup regions $R_{HU}$ aligned in the X direction. In the fifth embodiment, in each finger structure FS, the via contact electrode CC(WL) is provided in one of the two hookup regions $R_{HU}$, and the dummy contact DCC is provided in the other of the two hookup regions $R_{HU}$.

In FIG. 28, there are exemplified two finger structures FS aligned in the Y direction. Moreover, a region corresponding to the finger structure FS provided more to a positive side in the Y direction, and the word line hookup region $R_{HUWL}$, is divided into the two regions $R_A$, $R_B$ in the X direction. These regions $R_A$, $R_B$ are each provided with the via contact electrode CC(WL). Moreover, in FIG. 28, a region corresponding to the finger structure FS adjacent in the Y direction to this more-Y-direction-positive-side-disposed finger structure FS, and the word line hookup region $R_{HUWL}$, is divided into the two regions $R_C$, $R_D$ in the X direction. These regions $R_C$, $R_D$ are each provided with the dummy contact DCC.

In a similar way to in the example of FIG. 12, the more to a negative side in the X direction a certain one of the plurality of via contact electrodes CC(WL) provided in the regions $R_A$, $R_B$ is provided, the longer its length in the Z direction will be, and the more upward the conductive layer 110 to which it is connected will be. Moreover, the more to a positive side in the X direction a certain one of the plurality of via contact electrodes CC(WL) provided in the regions $R_A$, $R_B$ is provided, the shorter its length in the Z direction will be, and the more downward the conductive layer 110 to which it is connected will be. Note that the plurality of via contact electrodes CC(WL) provided in the region $R_A$ have shorter lengths in the Z direction than the plurality of via contact electrodes CC(WL) provided in the region $R_B$.

As shown in FIG. 29, the more to a negative side in the X direction a certain one of the plurality of dummy contacts DCC provided in the regions $R_C$, $R_D$ is provided, the shorter its length in the Z direction will be. Moreover, the more to a positive side in the X direction it is provided, the longer its length in the Z direction will be. Note that the plurality of dummy contacts DCC provided in the region $R_C$ have longer lengths in the Z direction than the plurality of dummy contacts DCC provided in the region $R_D$.

Moreover, length in the Z direction of the $m^{th}$ (where m is an integer of 1 or more) via contact electrode CC(WL) counting from a positive side in the X direction in the word line hookup region $R_{HUWL}$ is identical to or substantially identical to length in the Z direction of the $m^{th}$ dummy contact DCC counting from a negative side in the X direction in the word line hookup region $R_{HUWL}$. Hence, length in the Z direction of the via contact electrodes CC(WL) provided in the region $R_A$ is shorter than length in the Z direction of the dummy contacts DCC provided in the region $R_C$. Moreover, length in the Z direction of the via contact electrodes CC(WL) provided in the region $R_B$ is longer than length in the Z direction of the dummy contacts DCC provided in the region $R_D$.

Other Embodiments

That concludes description of the semiconductor memory devices according to the first through fifth embodiments. However, the configurations described above are merely exemplifications, and specific configurations may be appropriately adjusted.

For example, as has been described with reference to FIGS. 18 and 19, in the third embodiment, similarly to in the second embodiment, the hookup regions $R_{HU}$ are provided in a vicinity of a center in the X direction, of a memory plane region $R_{MP3}$. Moreover, the row control circuit regions $R_{RowC}$ are provided at a center position in the X direction, of the peripheral circuit region $R_{PC3}$. However, in the third embodiment, similarly to in the first embodiment, the hookup regions $R_{HU}$ may be provided in vicinities of end portions in the X direction, of the memory plane region $R_{MP3}$ (refer to FIGS. 5 and 7). Moreover, the row control circuit regions $R_{RowC}$ may be provided in end portions in the X direction, of the peripheral circuit region $R_{PC3}$ (refer to FIGS. 6 and 7).

Likewise, in the fourth embodiment (FIGS. 20 and 21) too, similarly to in the first embodiment, the hookup regions $R_{HU}$ may be provided in end portions in the X direction, of a memory plane region $R_{MP4}$ (refer to FIGS. 5 and 7). Moreover, the row control circuit regions $R_{RowC}$ may be provided in end portions in the X direction, of the peripheral circuit region $R_{PC4}$ (refer to FIGS. 6 and 7).

Moreover, in the first through fifth embodiments, the memory plane regions $R_{MP}$, $R_{MP2}$, $R_{MP3}$, $R_{MP4}$ are provided with two hookup regions $R_{HU}$. However, in the first through fifth embodiments, one of the hookup regions $R_{HU}$ may be omitted. Moreover, in this case, one of the row control circuit regions $R_{RowC}$ may be omitted in the peripheral circuit regions $R_{PC}$, $R_{PC2}$, $R_{PC3}$, $R_{PC4}$.

Moreover, the dummy contact DCC described with reference to FIGS. 28 and 29 may be provided in the semiconductor memory devices according to the second, third, or fourth embodiments.

Figure 30:
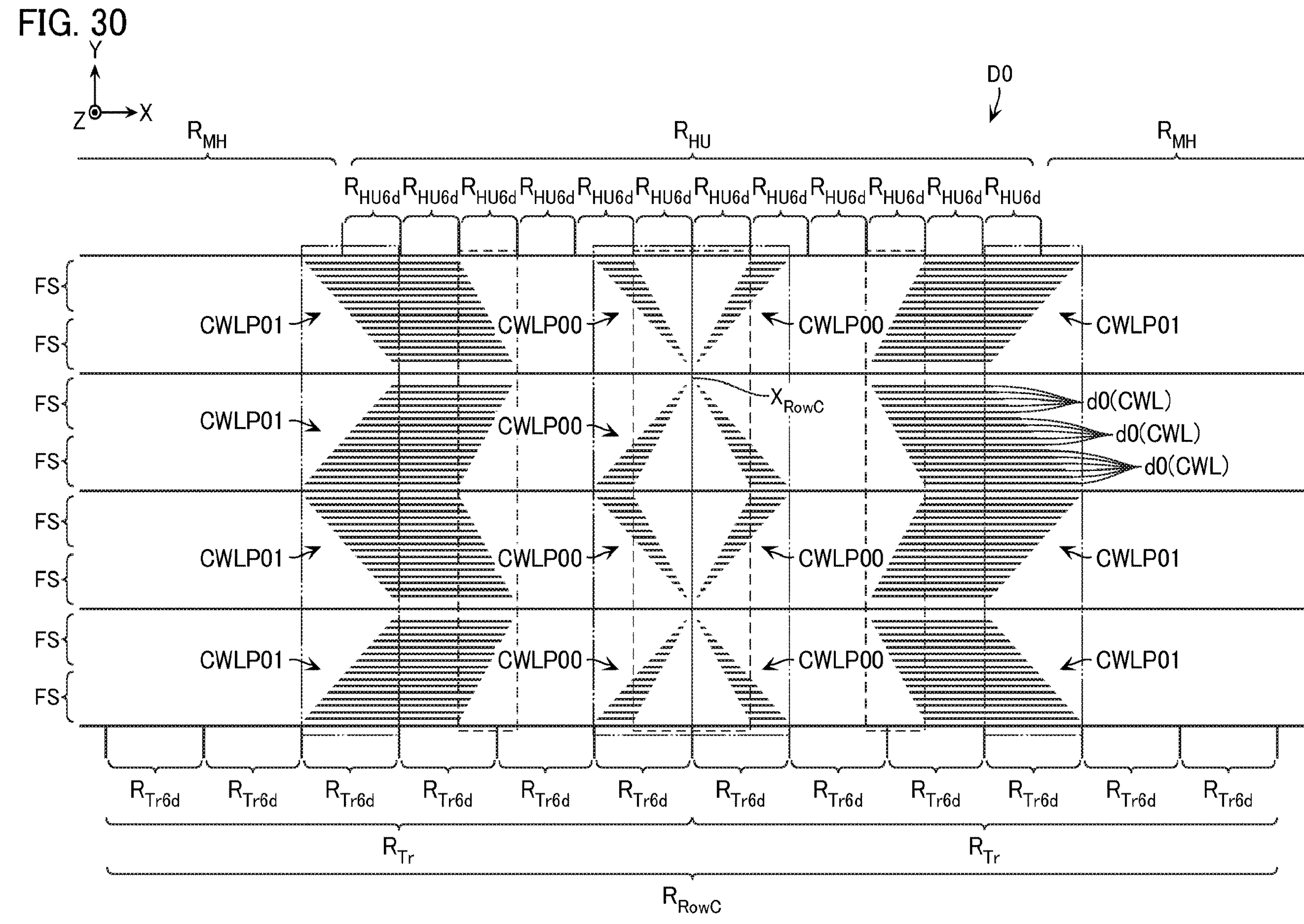
FIG. 30 is a schematic plan view for explaining one example of layout of a wiring CWL.
Figure 31:
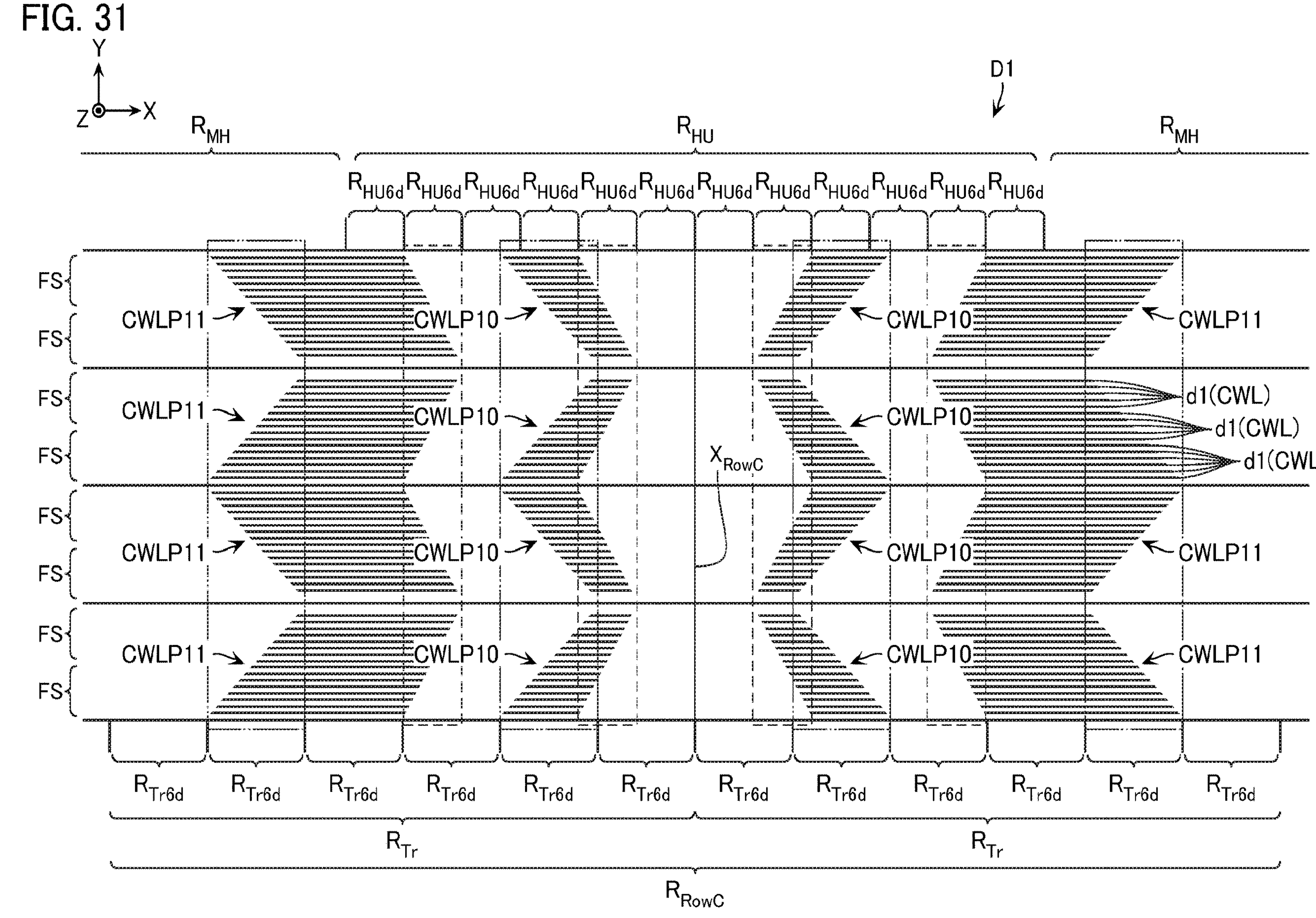
FIG. 31 is a schematic plan view for explaining one example of layout of the wiring CWL.
Figure 32:
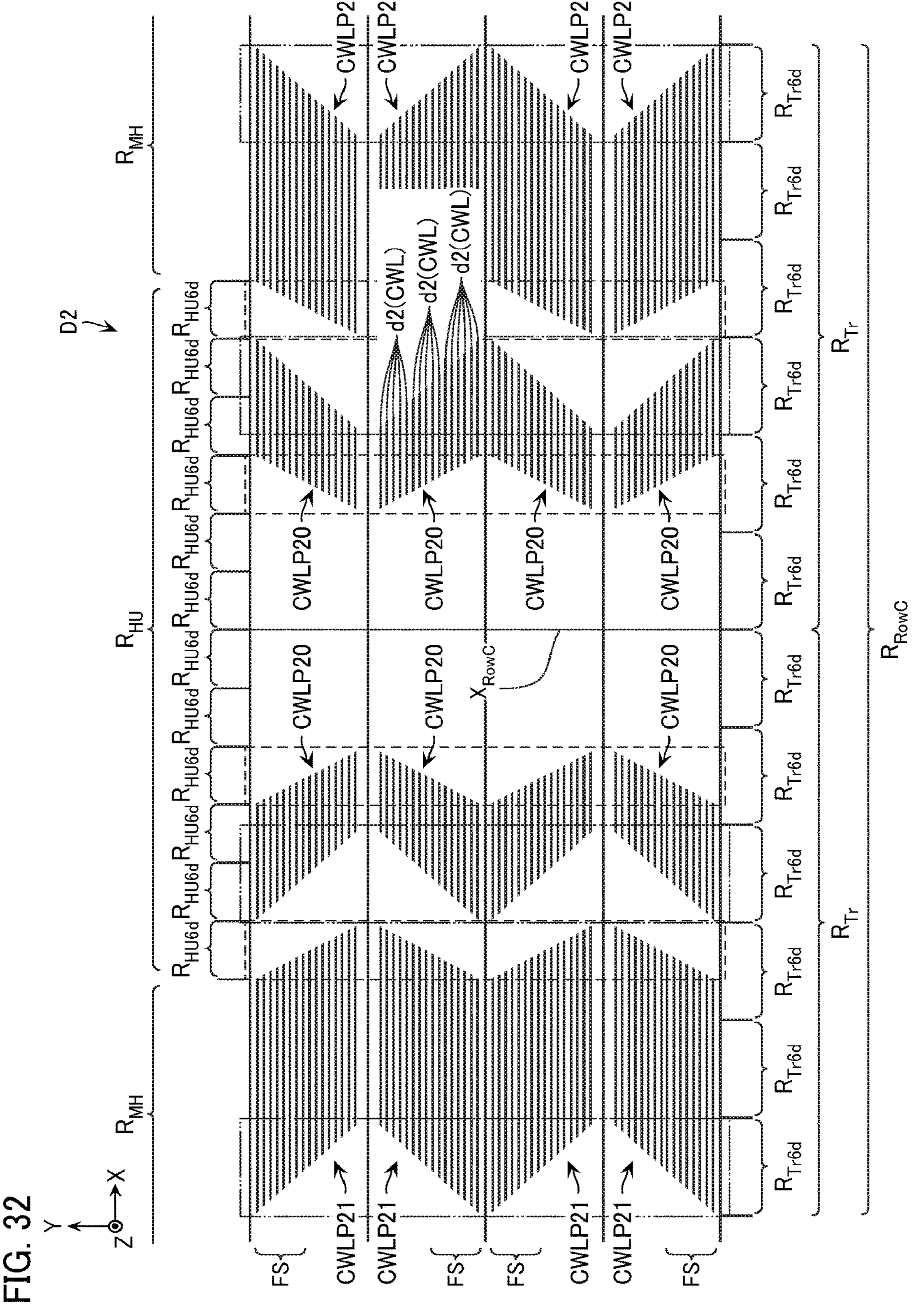
FIG. 32 is a schematic plan view for explaining one example of layout of the wiring CWL.

Moreover, in the first through fifth embodiments, layout of the wirings CWL is appropriately adjustable. FIGS. 30-32 are schematic plan views for explaining one example of layout of the wirings CWL. FIG. 30 exemplifies a wiring pattern in the wiring layer DO. FIG. 31 exemplifies a wiring pattern in the wiring layer D1. FIG. 32 exemplifies a wiring pattern in the wiring layer D2.

In FIGS. 30-32, there are illustrated configurations of regions provided at positions overlapping the transistor region $R_{Tr}$, of the wiring layers DO-D2. Moreover, in FIGS. 30-32, there are illustrated: regions $R_{HU6d}$ dividing into six in the X direction a region from the position X Row c to an end position in the X direction of the hookup region $R_{HU}$; and regions $R_{Tr6d}$ dividing into six in the X direction the transistor region $R_{Tr}$.

As shown in FIG. 30, at positions overlapping the transistor region $R_{Tr}$ looking from the Z direction, of the wiring layer D0, there are provided two wiring groups CWLP00, CWLP01 aligned in the X direction. These two wiring groups CWLP00, CWLP01 each comprise a plurality of the wirings CWL aligned in the Y direction.

One ends (end portions on a via contact electrode CC(WL) side) of the plurality of wirings CWL included in the wiring group CWLP00 are provided from a boundary on a side of the position $X_{RowC}$ to a boundary on an opposite side to the position $X_{RowC}$, of the region $R_{HU6d}$ $1^{st}$ closest to the position $X_{RowC}$ (the region surrounded by a dotted line in the drawing). The plurality of via contact electrodes CC(WL) included in the region $R_{HU6d}$ $1^{st}$ closest to the position $X_{RowC}$ are electrically connected to the plurality of wirings CWL included in the wiring group CWLP00.

Moreover, the other ends (end portions on a transistor $T_{BLK}$ side) of the plurality of wirings CWL included in the wiring group CWLP00 are provided from a boundary on a side of the position $X_{RowC}$ to a boundary on an opposite side to the position $X_{RowC}$, of the region $R_{Tr6d}$ $1^{st}$ closest to the position $X_{RowC}$ (the region surrounded by a two dot-chain line in the drawing). The plurality of transistors $T_{BLK}$ included in the region $R_{Tr6d}$ $1^{st}$ closest to the position $X_{RowC}$ are electrically connected to the plurality of wirings CWL included in the wiring group CWLP00.

One ends (end portions on a via contact electrode CC(WL) side) of the plurality of wirings CWL included in the wiring group CWLP01 are provided from a boundary on a side of the position $X_{RowC}$ to a boundary on an opposite side to the position $X_{RowC}$, of the region $R_{HU6d}$ $4^{th}$ closest to the position $X_{RowC}$ (the region surrounded by a dotted line in the drawing). The plurality of via contact electrodes CC(WL) included in the region $R_{HU6d}$ $4^{th}$ closest to the position $X_{RowC}$ are electrically connected to the plurality of wirings CWL included in the wiring group CWLP01.

Moreover, the other ends (end portions on a transistor $T_{BLK}$ side) of the plurality of wirings CWL included in the wiring group CWLP01 are provided from a boundary on a side of the position $X_{RowC}$ to a boundary on an opposite side to the position $X_{RowC}$, of the region $R_{Tr6d}$ $4^{th}$ closest to the position $X_{RowC}$ (the region surrounded by a two dot-chain line in the drawing). The plurality of transistors $T_{BLK}$ included in the region $R_{Tr6d}$ $4^{th}$ closest to the position $X_{RowC}$ are electrically connected to the plurality of wirings CWL included in the wiring group CWLP01.

As shown in FIG. 31, at positions overlapping the transistor region $R_{Tr}$ looking from the Z direction, of the wiring layer D1, there are provided two wiring groups CWLP10, CWLP11 aligned in the X direction. These two wiring groups CWLP10, CWLP11 each comprise a plurality of the wirings CWL aligned in the Y direction.

One ends (end portions on a via contact electrode CC(WL) side) of the plurality of wirings CWL included in the wiring group CWLP10 are provided from a boundary on a side of the position $X_{RowC}$ to a boundary on an opposite side to the position $X_{RowC}$, of the region $R_{HU6d}$ $2^{nd}$ closest to the position $X_{RowC}$ (the region surrounded by a dotted line in the drawing). The plurality of via contact electrodes CC(WL) included in the region $R_{HU6d}$ $2^{nd}$ closest to the position $X_{RowC}$ are electrically connected to the plurality of wirings CWL included in the wiring group CWLP10.

Moreover, the other ends (end portions on a transistor $T_{BLK}$ side) of the plurality of wirings CWL included in the wiring group CWLP10 are provided from a boundary on a side of the position $X_{RowC}$ to a boundary on an opposite side to the position $X_{RowC}$, of the region $R_{Tr6d}$ $2^{nd}$ closest to the position $X_{RowC}$ (the region surrounded by a two dot-chain line in the drawing). The plurality of transistors $T_{BLK}$ included in the region $R_{Tr6d}$ $2^{nd}$ closest to the position $X_{RowC}$ are electrically connected to the plurality of wirings CWL included in the wiring group CWLP10.

One ends (end portions on a via contact electrode CC(WL) side) of the plurality of wirings CWL included in the wiring group CWLP11 are provided from a boundary on a side of the position $X_{RowC}$ to a boundary on an opposite side to the position $X_{RowC}$, of the region $R_{HU6d}$ $5^{th}$ closest to the position $X_{RowC}$ (the region surrounded by a dotted line in the drawing). The plurality of via contact electrodes CC(WL) included in the region $R_{HU6d}$ $5^{th}$ closest to the position $X_{RowC}$ are electrically connected to the plurality of wirings CWL included in the wiring group CWLP11.

Moreover, the other ends (end portions on a transistor $T_{BLK}$ side) of the plurality of wirings CWL included in the wiring group CWLP11 are provided from a boundary on a side of the position $X_{RowC}$ to a boundary on an opposite side to the position $X_{RowC}$, of the region $R_{Tr6d}$ $5^{th}$ closest to the position $X_{RowC}$ (the region surrounded by a two dot-chain line in the drawing). The plurality of transistors $T_{BLK}$ included in the region $R_{Tr6d}$ $5^{th}$ closest to the position $X_{RowC}$ are electrically connected to the plurality of wirings CWL included in the wiring group CWLP11.

As shown in FIG. 32, at positions overlapping the transistor region $R_{Tr}$ looking from the Z direction, of the wiring layer D2, there are provided two wiring groups CWLP20, CWLP21 aligned in the X direction. These two wiring groups CWLP20, CWLP21 each comprise a plurality of the wirings CWL aligned in the Y direction.

One ends (end portions on a via contact electrode CC(WL) side) of the plurality of wirings CWL included in the wiring group CWLP20 are provided from a boundary on a side of the position $X_{RowC}$ to a boundary on an opposite side to the position $X_{RowC}$, of the region $R_{HU6d}$ $3^{rd}$ closest to the position $X_{RowC}$ (the region surrounded by a dotted line in the drawing). The plurality of via contact electrodes CC(WL) included in the region $R_{HU6d}$ $3^{rd}$ closest to the position $X_{RowC}$ are electrically connected to the plurality of wirings CWL included in the wiring group CWLP20.

Moreover, the other ends (end portions on a transistor $T_{BLK}$ side) of the plurality of wirings CWL included in the wiring group CWLP20 are provided from a boundary on a side of the position $X_{RowC}$ to a boundary on an opposite side to the position $X_{RowC}$, of the region $R_{Tr6d}$ $3^{rd}$ closest to the position $X_{RowC}$ (the region surrounded by a two dot-chain line in the drawing). The plurality of transistors $T_{BLK}$ included in the region $R_{Tr6d}$ $3^{rd}$ closest to the position $X_{RowC}$ are electrically connected to the plurality of wirings CWL included in the wiring group CWLP20.

One ends (end portions on a via contact electrode CC(WL) side) of the plurality of wirings CWL included in the wiring group CWLP21 are provided from a boundary on a side of the position $X_{RowC}$ to a boundary on an opposite side to the position $X_{RowC}$, of the region $R_{HU6d}$ $6^{th}$ closest to the position $X_{RowC}$ (the region surrounded by a dotted line in the drawing). The plurality of via contact electrodes CC(WL) included in the region $R_{HU6d}$ $6^{th}$ closest to the position $X_{RowC}$ are electrically connected to the plurality of wirings CWL included in the wiring group CWLP21.

Moreover, the other ends (end portions on a transistor $T_{BLK}$ side) of the plurality of wirings CWL included in the wiring group CWLP21 are provided from a boundary on a side of the position $X_{RowC}$ to a boundary on an opposite side to the position $X_{RowC}$, of the region $R_{Tr6d}$ $6^{th}$ closest to the position $X_{RowC}$ (the region surrounded by a two dot-chain line in the drawing). The plurality of transistors $T_{BLK}$ included in the region $R_{Tr6d}$ $6^{th}$ closest to the position $X_{RowC}$ are electrically connected to the plurality of wirings CWL included in the wiring group CWLP21.

Figure 33:
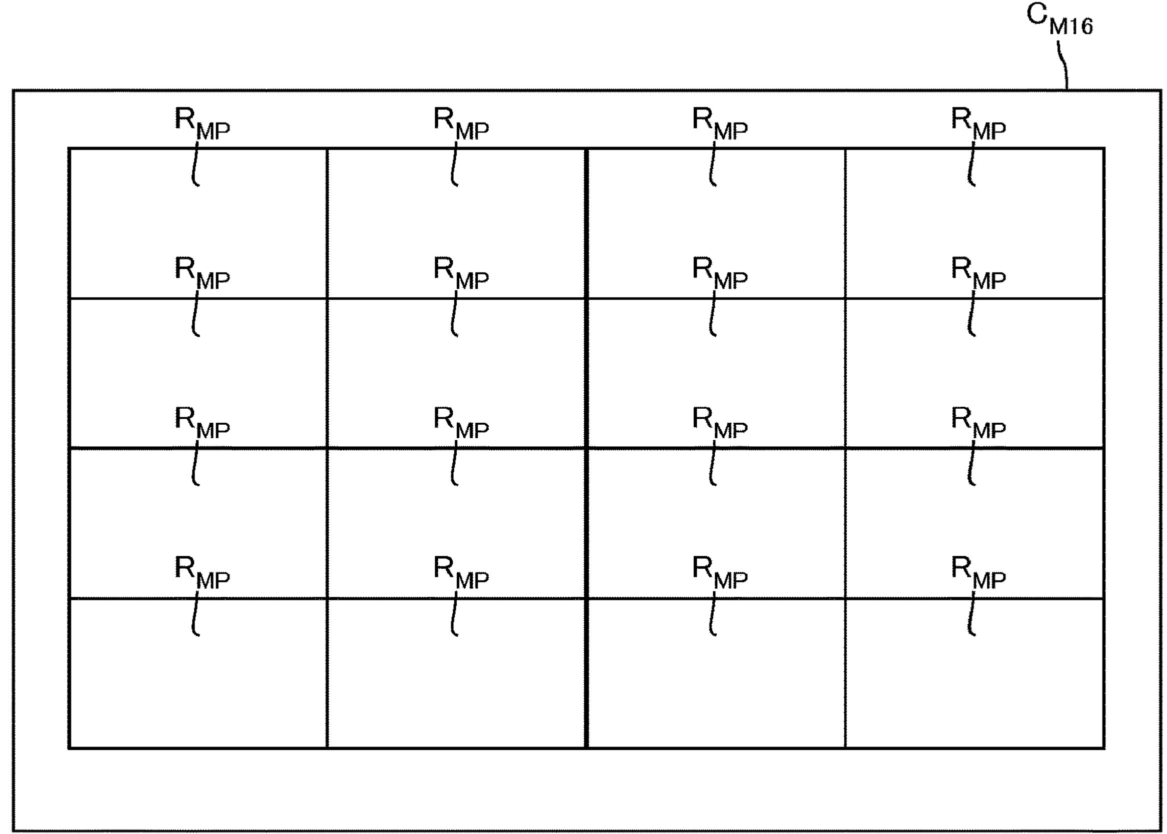
FIG. 33 is a schematic bottom view showing a part of configurations of a semiconductor memory device according to another embodiment.

Moreover, in the first through fifth embodiments, the chips $C_M$, $C_{M2}$, $C_{M3}$, $C_{M4}$ are respectively provided with totals of four memory plane regions $R_{MP}$, $R_{MP2}$, $R_{MP3}$, $R_{MP4}$ aligned in twos in the X direction and the Y direction. However, the number and disposition of memory plane regions provided in a chip is appropriately adjustable. For example, in the example of FIG. 33, a chip $C_{M16}$ is provided with a total of 16 memory plane regions $R_{MP}$ aligned in fours in the X direction and the Y direction. The chip $C_{M16}$ may be provided with the memory plane regions $R_{MP2}$, $R_{MP3}$, $R_{MP4}$, rather than the memory plane region $R_{MP}$.

Moreover, in the first through fifth embodiments, as has been described with reference to FIG. 12, and so on, the outer peripheral surface of the via contact electrode CC(WL) faces via the insulating film CCSW the inner peripheral surface of a through-hole provided in the conductive layers 110. However, such a configuration is merely an exemplification, and specific configuration is appropriately adjustable.

Figure 34:
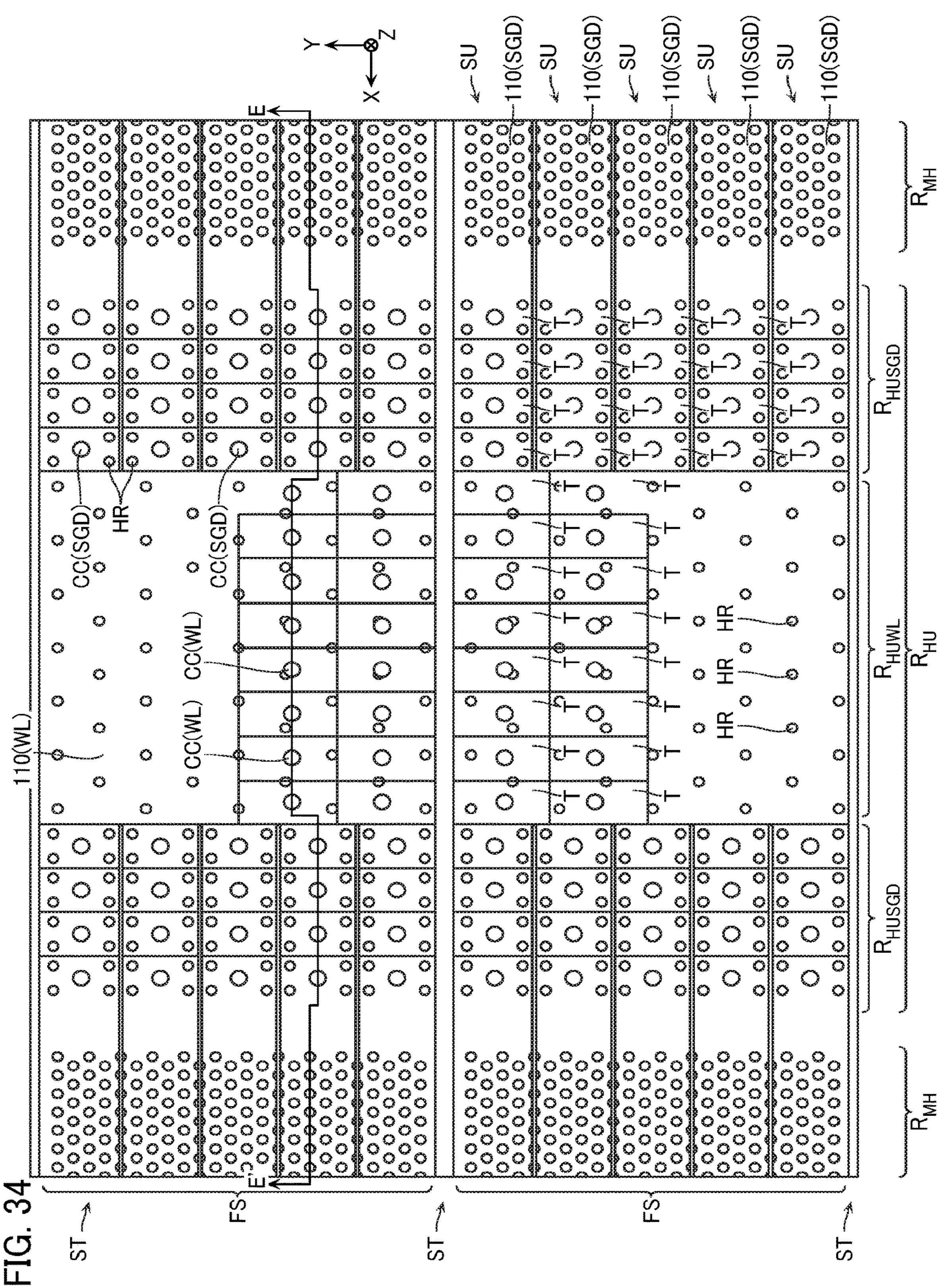
FIG. 34 is a schematic bottom view showing another example of configuration of a word line hookup region $R_{HUWL}$.
Figure 35:
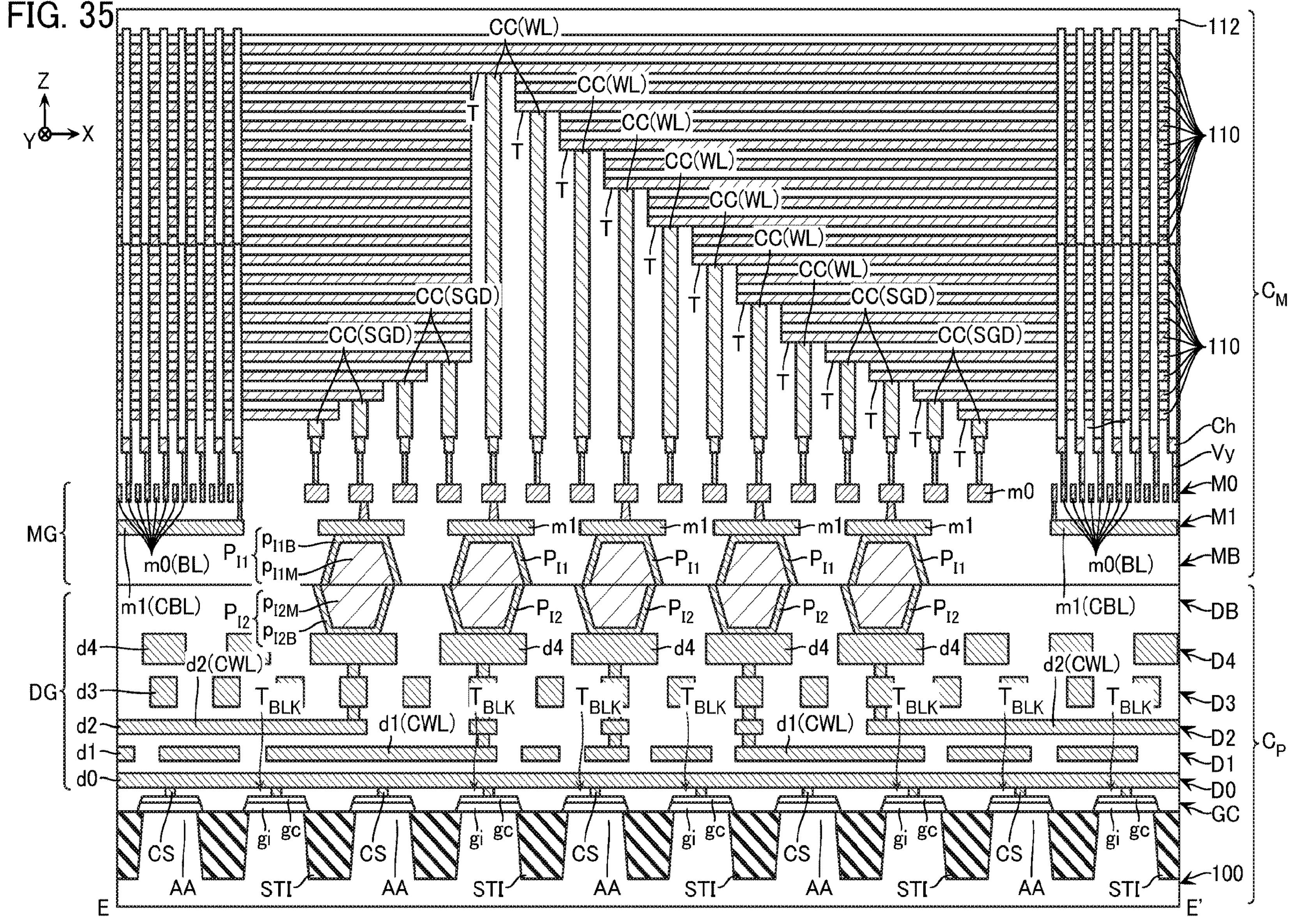
FIG. 35 is a schematic cross-sectional view in which the structure shown in FIG. 34 has been cut along the line E-E' and viewed along a direction of the arrows.

FIG. 34 is a schematic bottom view showing another example of configuration of the word line hookup region $R_{HUWL}$. FIG. 35 is a schematic cross-sectional view in which the structure shown in FIG. 34 has been cut along the line E-E' and viewed along a direction of the arrows.

Note that as has been described with reference to the likes of FIG. 5, in the case where the memory plane region $R_{MP}$ is provided with two hookup regions $R_{HU}$ aligned in the X direction, one of these two hookup regions $R_{HU}$ may include the via contact electrodes CC(WL) corresponding to the $4n+1^{th}$ (where n is an integer of 0 or more) and $4n+4^{th}$ finger structures FS or memory blocks BLK counting from a negative side in the Y direction. In this case, the other of the two hookup regions $R_{HU}$ may include the via contact electrodes CC(WL) corresponding to the $4n+2^{th}$ and $4n+3^{th}$ finger structures FS or memory blocks BLK counting from a negative side in the Y direction, for example.

Now, FIG. 11 shows configuration of the above-described one of the hookup regions $R_{HU}$ corresponding to the $4n+3^{th}$ and $4n+4^{th}$ finger structures FS counting from a negative side in the Y direction, for example. On the other hand, FIG. 34 shows configuration of the above-described one of the hookup regions $R_{HU}$ corresponding to the $4n+4^{th}$ and $4n+1^{th}$ ($4n+5^{th}$) finger structures FS counting from a negative side in the Y direction, for example.

In the example of FIG. 34 too, the conductive layer 110 functioning as the word line WL, and so on, is continuous in the X direction over a plurality of the memory regions $R_{MH}$ aligned in the X direction. However, in the example of FIGS. 34 and 35, the word line hookup region $R_{HUWL}$ is provided with a plurality of the terrace regions T aligned in the X direction correspondingly to the plurality of via contact electrodes CC(WL). Note that in the example of FIG. 34, the plurality of via contact electrodes CC(WL) are provided over two columns, correspondingly to each finger structure FS. However, in the case of the via contact electrodes CC(WL) being provided in one column, the terrace regions T too will be provided in one column. Moreover, in the case of the via contact electrodes CC(WL) being provided over three or more columns, the terrace regions T too will be provided over three or more columns.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:

a first structure having a plurality of first conductive layers that are continuous in a first direction and are laminated in a laminating direction which intersects the first direction; and a second structure having a plurality of second conductive layers that are continuous in the first direction, are laminated in the laminating direction, are aligned in a second direction which intersects the first direction and the laminating direction with respect to the first conductive layers, and are electrically independent from the first conductive layers, wherein a memory plane region, which includes the first structure and the second structure, includes:

a first memory region, a second memory region, and a third memory region which are aligned in the first direction and each include: a plurality of semiconductor columns that extend in the laminating direction; and a plurality of charge accumulating films;

a first region between the first memory region and the second memory region; and a second region between the second memory region and the third memory region, a plurality of first transistors and a plurality of third transistors are provided in an opposite direction to the laminating direction with respect to the first structure, a plurality of second transistors and a plurality of fourth transistors are provided in an opposite direction to the laminating direction with respect to the second structure, the second memory region is provided between the first memory region and the third memory region, the first structure further comprises a plurality of first via contact electrodes that are provided in the first region, extend in the laminating direction, and are connected to at least a part of the plurality of first conductive layers, the second structure further comprises a plurality of second via contact electrodes that are provided in the second region, extend in the laminating direction, and are connected to at least a part of the plurality of second conductive layers, a part of the plurality of first via contact electrodes are electrically connected to at least a part of the plurality of first transistors provided at a position where the first structure and the first region overlap, looking from the laminating direction, another part of the plurality of first via contact electrodes are electrically connected to at least a part of the plurality of second transistors provided at a position where the second structure and the first region overlap, looking from the laminating direction, a part of the plurality of second via contact electrodes are electrically connected to at least a part of the plurality of third transistors provided at a position where the first structure and the second region overlap, looking from the laminating direction, and another part of the plurality of second via contact electrodes are electrically connected to at least a part of the plurality of fourth transistors provided at a position where the second structure and the second region overlap, looking from the laminating direction.

2. The semiconductor memory device according to claim 1, wherein the plurality of semiconductor columns includes a first semiconductor column and a second semiconductor column, and the plurality of charge accumulating films includes a first charge accumulating film and a second charge accumulating film, wherein the first semiconductor column faces at least one of the plurality of the first conductive layers, the second semiconductor column faces at least one of the plurality of the second conductive layers, the first charge accumulating film is provided between at least one of the plurality of first conductive layers and the first semiconductor column, and the second charge accumulating film is provided between at least one of the plurality of second conductive layers and the second semiconductor column.

3. The semiconductor memory device according to claim 1, wherein a length in the first direction of the first memory region is shorter than a length in the first direction of the second memory region, and a length in the first direction of the third memory region is shorter than a length in the first direction of the second memory region.

4. The semiconductor memory device according to claim 1, wherein the other part of the plurality of first transistors is provided at a position where the first structure and the first memory region or second memory region overlap, looking from the laminating direction, the other part of the plurality of second transistors is provided at a position where the second structure and the first memory region or second memory region overlap, looking from the laminating direction, the other part of the plurality of third transistors is provided at a position where the first structure and the second memory region or third memory region overlap, looking from the laminating direction, and the other part of the plurality of fourth transistors is provided at a position where the second structure and the second memory region or third memory region overlap, looking from the laminating direction.

5. The semiconductor memory device according to claim 1, further comprising a sense amplifier which includes a plurality of fifth transistors provided at at least either of a position where the first structure and second memory region overlap or a position where the second structure and second memory region overlap, in an opposite direction to the laminating direction with respect to the first structure and the second structure, wherein the memory plane region further comprises a wiring layer which is provided between the plurality of fifth transistors and the first conductive layers and second conductive layers, the wiring layer comprises:

a first wiring which extends in the first direction and electrically connects at least a part of the plurality of semiconductor columns in the first memory region and a part of the plurality of fifth transistors; and a second wiring which extends in the first direction and electrically connects at least a part of the plurality of semiconductor columns in the second memory region and another part of the plurality of fifth transistors, the first wiring extends over the first memory region, the first region, and the second memory region, looking from the laminating direction, and the second wiring is provided at a position overlapping the second memory region, looking from the laminating direction.

6. The semiconductor memory device according to claim 1, wherein a length in the first direction of the first memory region is longer than a length in the first direction of the second memory region, and a length in the first direction of the third memory region is longer than a length in the first direction of the second memory region.

7. The semiconductor memory device according to claim 1, further comprising a sense amplifier which includes a plurality of sixth transistors provided at at least either of a position where the first structure and first memory region overlap or a position where the second structure and first memory region overlap, in an opposite direction to the laminating direction with respect to the first structure and the second structure, wherein the memory plane region further comprises a wiring layer which is provided at least either between the plurality of sixth transistors and the first conductive layers or between the plurality of sixth transistors and the second conductive layers, the wiring layer comprises:

a third wiring which extends in the first direction and electrically connects at least a part of the plurality of semiconductor columns in the first memory region and a part of the plurality of sixth transistors; and a fourth wiring which extends in the first direction and electrically connects at least a part of the plurality of semiconductor columns in the second memory region and another part of the plurality of sixth transistors, the third wiring is provided at a position overlapping the first memory region, looking from the laminating direction, and the fourth wiring extends over the first memory region, the first region, and the second memory region, looking from the laminating direction.

8. The semiconductor memory device according to claim 1, wherein the memory plane region comprises a first hookup region and a second hookup region that are aligned in the first direction, the second memory region is provided between the first hookup region and the second hookup region, and the first region is one of the first hookup region and the second hookup region.

9. The semiconductor memory device according to claim 8, wherein the memory plane region further comprises a third hookup region and a fourth hookup region that are aligned in the first direction, the second hookup region and the third hookup region are adjacent to each other, and the second region is one of the third hookup region and the fourth hookup region.

10. The semiconductor memory device according to claim 1, wherein the first structure further comprises a plurality of third via contact electrodes that extend in the laminating direction and are connected to another part of the plurality of first conductive layers, the second memory region is provided between at least a part of the plurality of first via contact electrodes and at least a part of the plurality of third via contact electrodes, and each of the plurality of first conductive layers is connected to any of the plurality of first via contact electrodes or any of the plurality of third via contact electrodes.

11. The semiconductor memory device according to claim 1, wherein the first structure further comprises:

a third conductive layer and a fourth conductive layer that are provided in an opposite direction to the laminating direction with respect to the plurality of first conductive layers, and are aligned in the second direction, in at least the first memory region;

a fifth conductive layer and a sixth conductive layer that are provided in an opposite direction to the laminating direction with respect to the plurality of first conductive layers, and are aligned in the second direction, in at least the second memory region;

a seventh conductive layer and an eighth conductive layer that are provided in an opposite direction to the laminating direction with respect to the plurality of first conductive layers, and are aligned in the second direction, in at least the third memory region; and a fourth via contact electrode, a fifth via contact electrode, a sixth via contact electrode, a seventh via contact electrode, an eighth via contact electrode, and a ninth via contact electrode that extend in the laminating direction and are respectively connected to the third conductive layer, the fourth conductive layer, the fifth conductive layer, the sixth conductive layer, the seventh conductive layer, and the eighth conductive layer, the fourth via contact electrode and the fifth via contact electrode are provided in the first region, the sixth via contact electrode and the seventh via contact electrode are provided in the first region or the second region, and the eighth via contact electrode and the ninth via contact electrode are provided in the second region.

12. The semiconductor memory device according to claim 1, wherein the second structure further comprises a plurality of columnar bodies at a position overlapping the first region, the first region comprises:

a third region provided on one side in the first direction in the position where the first structure and the first region overlap;

a fourth region provided on another side in the first direction in the position where the first structure and the first region overlap;

a fifth region aligned in the second direction with the third region in the position where the second structure and the first region overlap; and a sixth region aligned in the second direction with the fourth region in the position where the second structure and the first region overlap, lengths in the laminating direction of the plurality of first via contact electrodes provided in the third region are shorter than lengths in the laminating direction of the plurality of first via contact electrodes provided in the fourth region, and lengths in the laminating direction of the plurality of columnar bodies provided in the fifth region are longer than lengths in the laminating direction of the plurality of columnar bodies provided in the sixth region.

13. The semiconductor memory device according to claim 12, wherein lengths in the laminating direction of the plurality of first via contact electrodes provided in the third region are shorter than lengths in the laminating direction of the plurality of columnar bodies provided in the fifth region, and lengths in the laminating direction of the plurality of first via contact electrodes provided in the fourth region are longer than lengths in the laminating direction of the plurality of columnar bodies provided in the sixth region.

* * * * *